(12) United States Patent
Takahashi et al.

(10) Patent No.: US 11,276,783 B2
(45) Date of Patent: Mar. 15, 2022

(54) SEMICONDUCTOR DEVICE AND RADIO RECEIVER USING THE SAME

(71) Applicant: FUJITSU LIMITED, Kawasaki (JP)

(72) Inventors: Tsuyoshi Takahashi, Ebina (JP); Kenichi Kawaguchi, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 2 days.

(21) Appl. No.: 16/904,628

(22) Filed: Jun. 18, 2020

(65) Prior Publication Data

US 2020/0411700 A1 Dec. 31, 2020

(30) Foreign Application Priority Data

Jun. 27, 2019 (JP) .............................. JP2019-120265

(51) Int. Cl.
*H01L 29/872* (2006.01)
*H01L 29/47* (2006.01)
*H01L 29/66* (2006.01)
*H04B 1/16* (2006.01)

(52) U.S. Cl.
CPC ............ *H01L 29/872* (2013.01); *H01L 29/47* (2013.01); *H01L 29/66143* (2013.01); *H04B 1/16* (2013.01)

(58) Field of Classification Search
CPC . H01L 29/873; H01L 29/47; H01L 29/66143; H01L 29/205; H01L 29/66219; H01L 29/0619; H01L 29/861; H01L 29/0676; H01L 29/068; H01L 29/402; H01L 29/8613; H01L 29/872–8725; H01L 29/66212; H01L 27/0766; H04B 1/16
See application file for complete search history.

(56) References Cited

U.S. PATENT DOCUMENTS

| | | | | |
|---|---|---|---|---|
| 9,178,028 | B2 * | 11/2015 | Kitagawa ............ | H01L 29/7397 |
| 2005/0079659 | A1 * | 4/2005 | Duan .................. | H01L 29/7869 438/197 |
| 2011/0058628 | A1 * | 3/2011 | Hsieh ..................... | H04B 1/18 375/316 |
| 2011/0233512 | A1 * | 9/2011 | Yang ..................... | B82Y 10/00 257/9 |
| 2012/0187376 | A1 * | 7/2012 | Tomioka ................ | C30B 29/40 257/24 |
| 2013/0112945 | A1 * | 5/2013 | Gilet ..................... | H01L 33/28 257/13 |

(Continued)

FOREIGN PATENT DOCUMENTS

| | | | |
|---|---|---|---|
| JP | H05-283672 A | 10/1993 | |
| JP | 2016-510943 A | 4/2016 | |

*Primary Examiner* — Shahed Ahmed
*Assistant Examiner* — Khatib A Rahman
(74) *Attorney, Agent, or Firm* — Fujitsu Patent Center

(57) ABSTRACT

A semiconductor device includes: a first conductivity type semiconductor of a nanostructure; a first electrode that is in ohmic junction with an end part of the first conductivity type semiconductor; a second electrode that is coupled to the first electrode and is provided over a side surface of the first conductivity type semiconductor; and a depletion constituent that controls expansion of a depletion layer inside the nanostructure, wherein the depletion layer is expanded inside the first conductivity type semiconductor by the depletion constituent in a direction intersecting a movement direction of a carrier.

10 Claims, 48 Drawing Sheets

(56) References Cited

U.S. PATENT DOCUMENTS

| | | | |
|---|---|---|---|
| 2014/0175372 A1* | 6/2014 | Berg | H01L 31/1852 257/9 |
| 2015/0155395 A1* | 6/2015 | Suh | H01L 29/0676 257/26 |
| 2015/0171076 A1* | 6/2015 | Wernersson | B82Y 10/00 136/255 |
| 2015/0200058 A1* | 7/2015 | Rubloff | H01G 11/86 429/163 |
| 2016/0064221 A1* | 3/2016 | Colinge | H01L 29/78684 257/192 |
| 2018/0138282 A1* | 5/2018 | Chang | H01L 29/045 |
| 2018/0269313 A1* | 9/2018 | Bina | H01L 29/861 |
| 2018/0294362 A1* | 10/2018 | Fukui | H01L 29/045 |

* cited by examiner

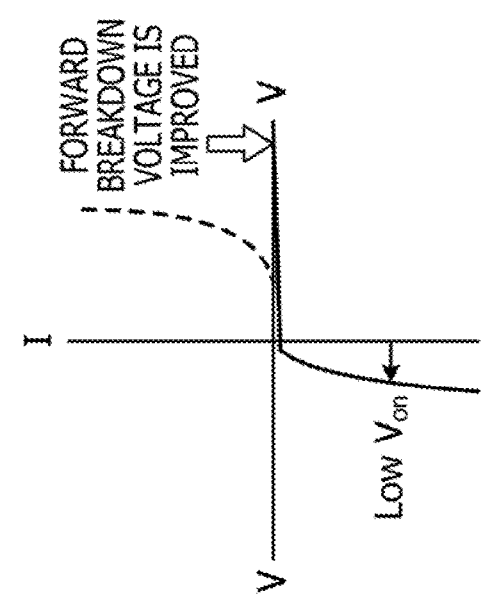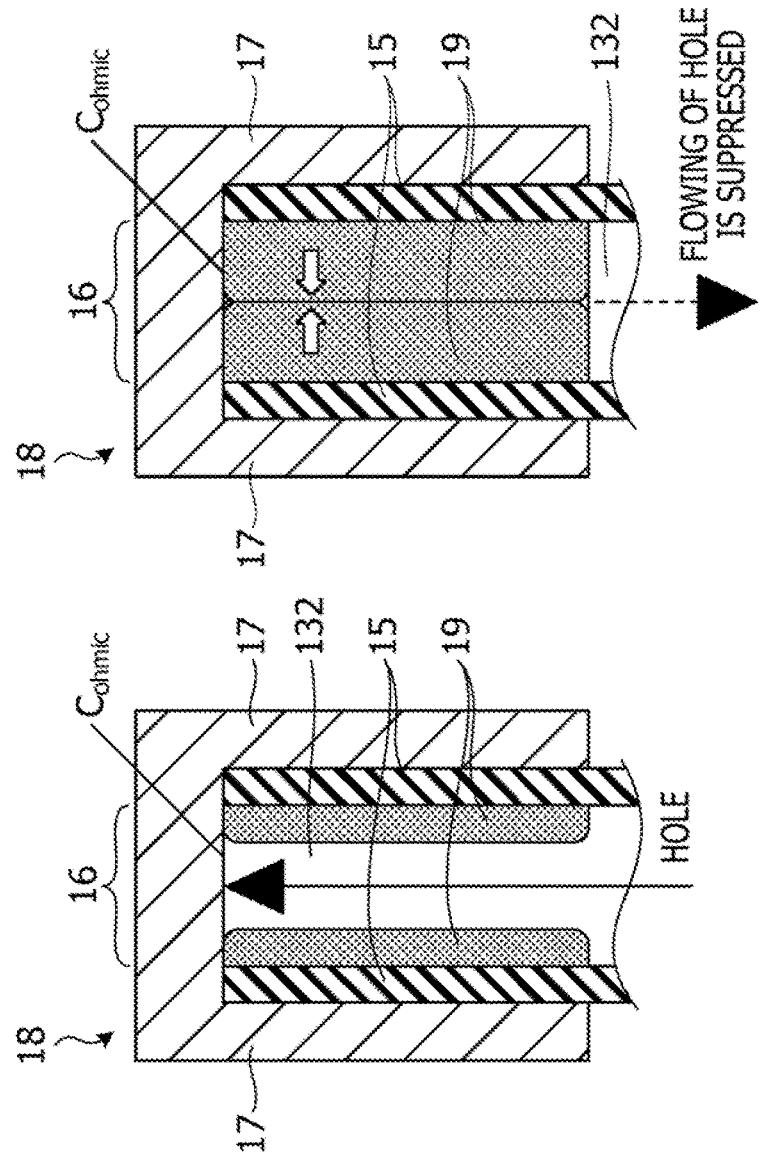

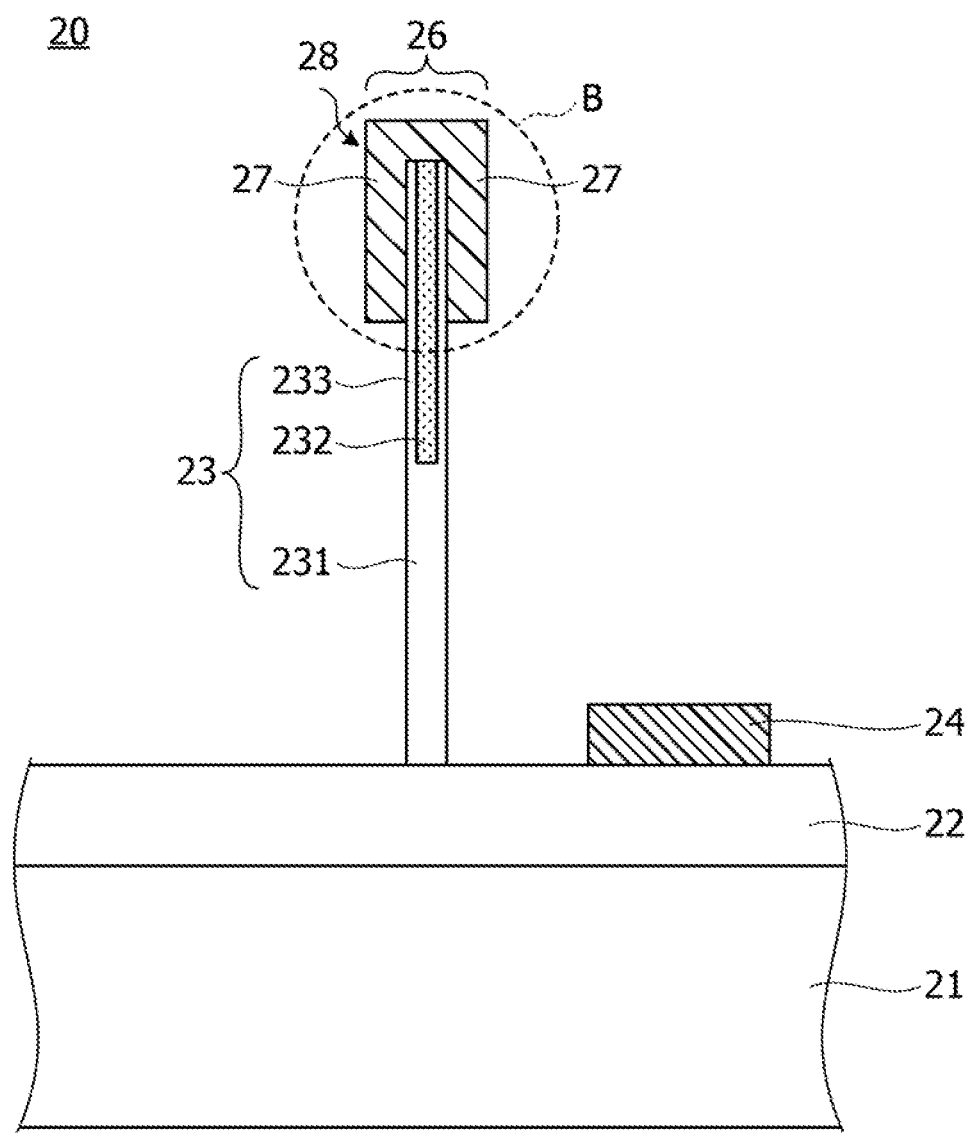

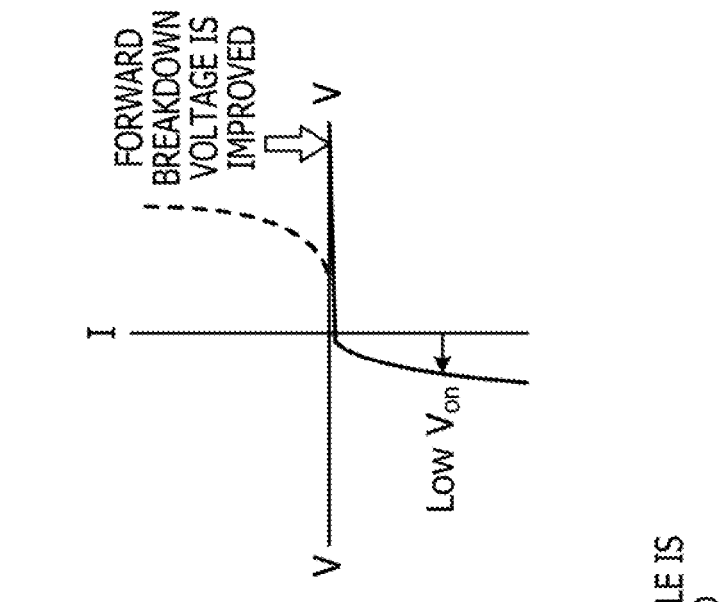
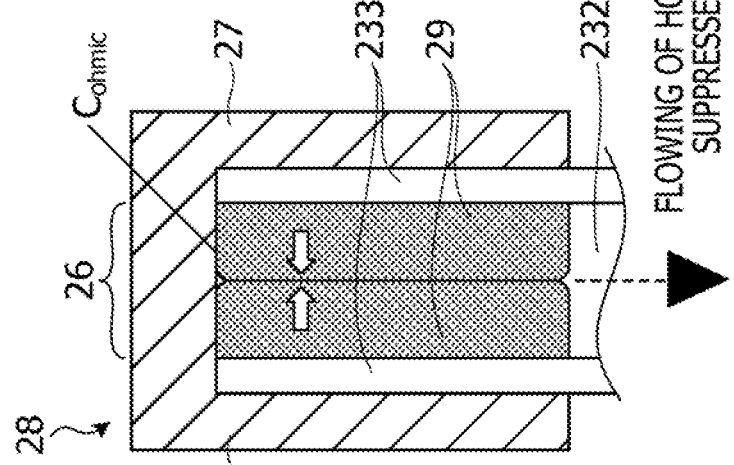
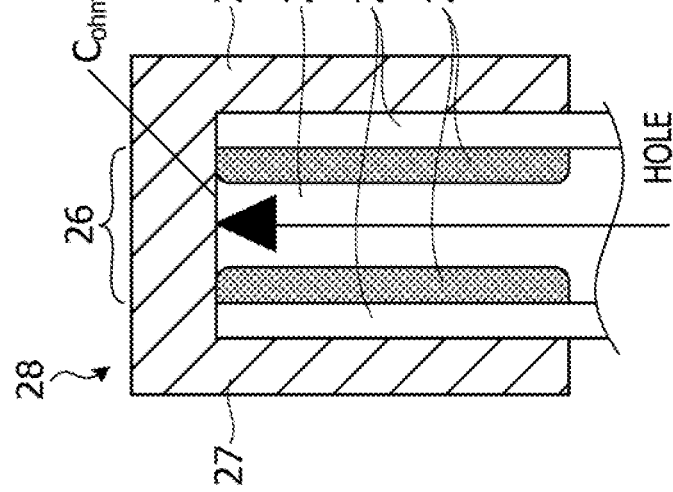

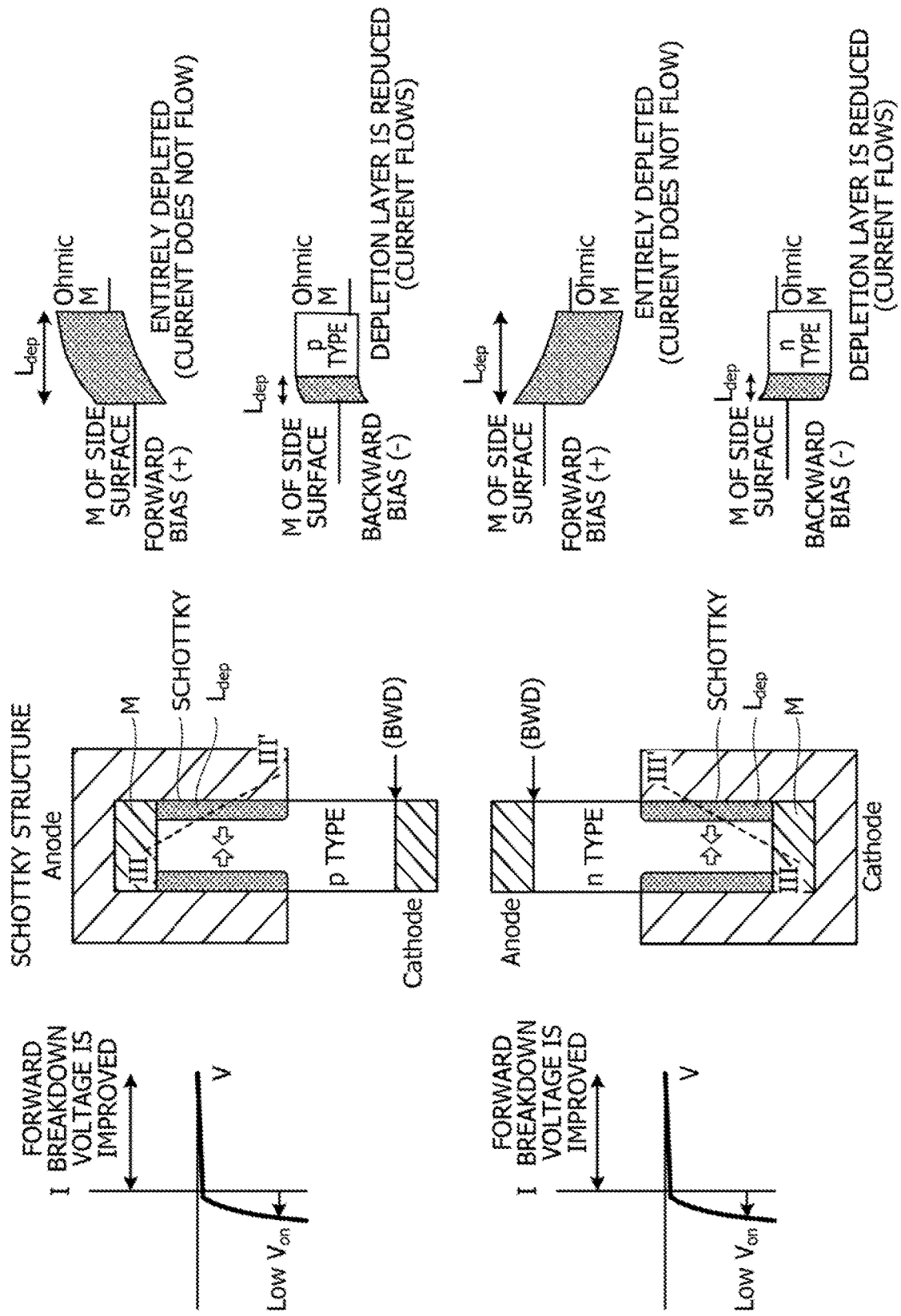

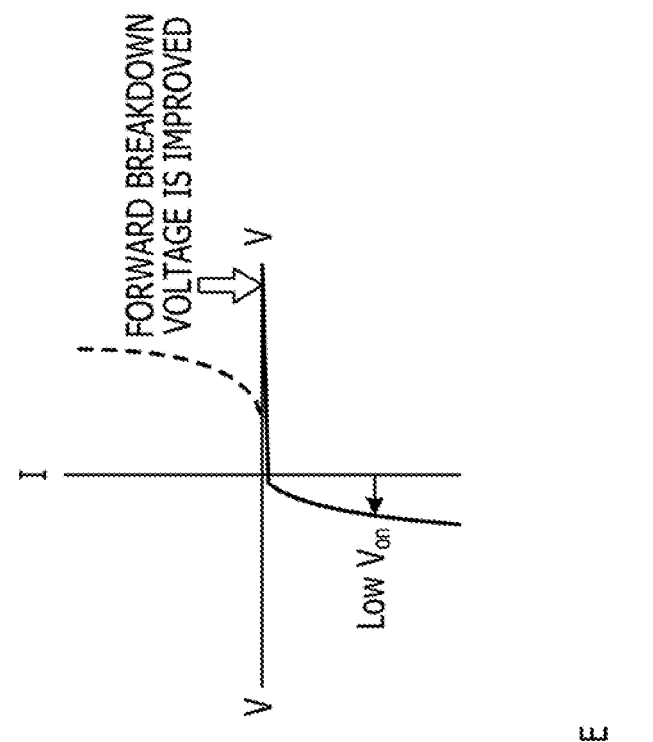
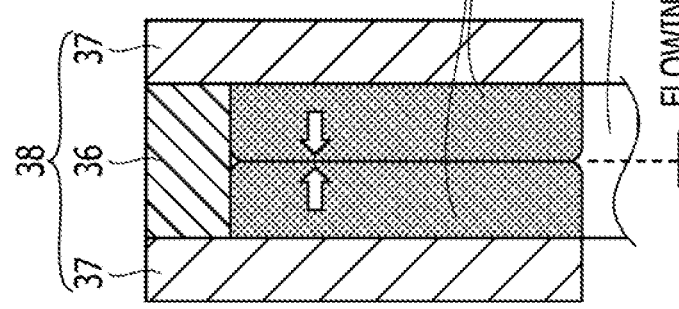
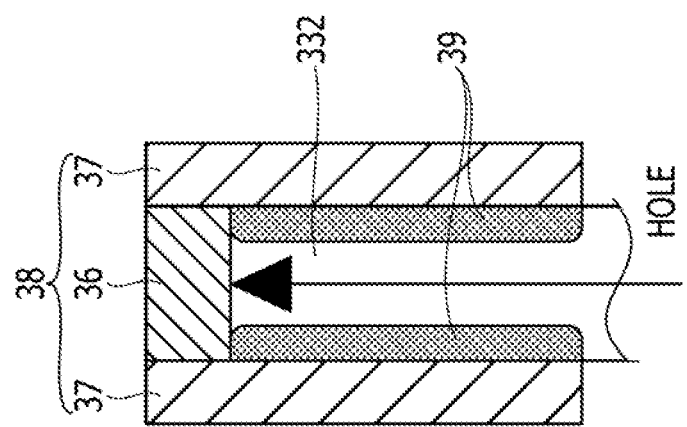

BG2 > BG1

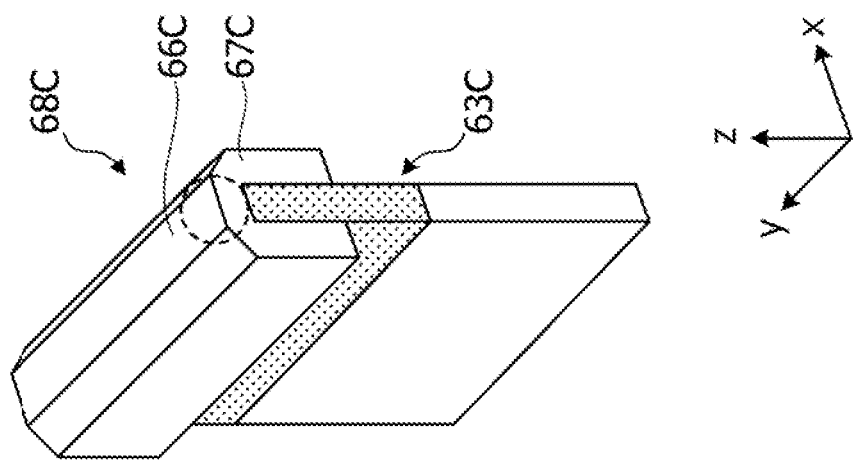
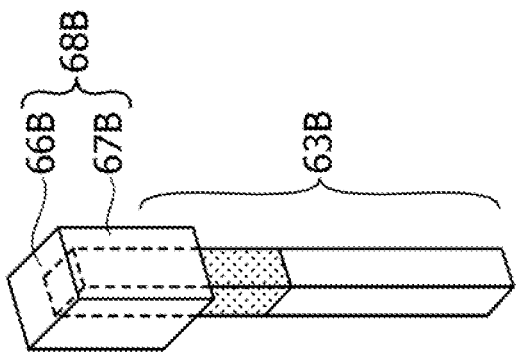
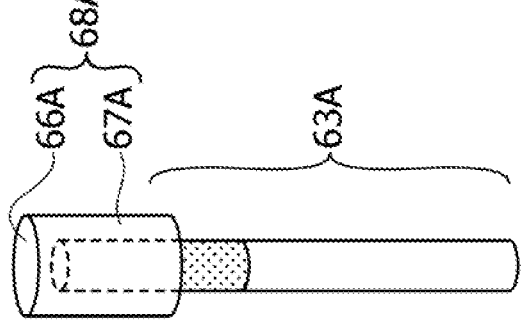

SEMICONDUCTOR DEVICE AND RADIO RECEIVER USING THE SAME

CROSS-REFERENCE TO RELATED APPLICATION

This application is based upon and claims the benefit of priority of the prior Japanese Patent Application No. 2019-120265, filed on Jun. 27, 2019, the entire contents of which are incorporated herein by reference.

FIELD

The present invention is related to a semiconductor device and a radio receiver using the same.

BACKGROUND

A Schottky diode is normally used for a wave detection element of a receiver for radio communication, or an element that converts ambient radio waves into energy. In order to detect a high frequency wave such as a microwave, a millimeter wave, or a terahertz wave with high sensitivity or to convert the high frequency wave into electric energy with high efficiency, considerable nonlinearity around 0 V in current to voltage (I-V) characteristics is desirable. In other words, there is the demand for steep rising of a current in a current flowing direction and a high breakdown voltage in a backward direction.

In the Schottky diode, compared with a general PN junction diode, a current starts to flow at a small forward bias, but a forward current does not flow before a constant rising voltage Von is exceeded. Therefore, the nonlinearity is reduced around a zero bias (0 V), and thus power conversion efficiency, a wave detection characteristic, and the like are insufficient.

A backward diode has a structure in which a forward peak is suppressed by controlling an impurity concentration of an Esaki diode. Rising of a current due to an inter-band tunnel current is steep at a backward voltage, and nonlinearity is relatively considerable around the zero bias. However, with respect to large input power, a current starts to flow in a forward direction due to voltage swing, and thus nonlinearity is reduced.

There is a configuration of improving a forward current characteristic and a backward breakdown voltage of a Schottky barrier diode. There is a configuration in which an electrode is provided to be in ohmic contact with an upper surface of a semiconductor nanowire.

Examples of the related art include Japanese Laid-open Patent Publication No. 5-283672 and Japanese National Publication of International Patent Application No. 2016-510943.

SUMMARY

According to an aspect of the embodiments, a semiconductor device includes: a first conductivity type semiconductor of a nanostructure; a first electrode that is in ohmic junction with an end part of the first conductivity type semiconductor; a second electrode that is coupled to the first electrode and is provided over a side surface of the first conductivity type semiconductor; and a depletion constituent that controls expansion of a depletion layer inside the nanostructure, wherein the depletion layer is expanded inside the first conductivity type semiconductor by the depletion constituent in a direction intersecting a movement direction of a carrier.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A, 3, and 3C illustrate a fundamental operation diagram of the semiconductor device to which the first principle is applied;

FIG. 5 is a schematic diagram of a semiconductor device to which the second principle is applied;

FIGS. 6A, 68, and 6C illustrate a fundamental operation diagram of the semiconductor device to which the second principle is applied;

FIG. 7 is a diagram for describing a third principle for a semiconductor device of an embodiment;

FIGS. 9A, 9B, and 9C illustrate a fundamental operation diagram of the semiconductor device to which the third principle is applied;

FIG. 148 is a manufacturing process diagram of the semiconductor device of the second embodiment;

FIGS. 20A, 20B, and 20C illustrate a diagram illustrating examples of a nanostructure;

DESCRIPTION OF EMBODIMENT(S)

From the viewpoint of extraction of power from weak ambient radio waves and detection of a high frequency signal, it is desirable that current-voltage characteristics of a semiconductor device used for power conversion or detection have high nonlinearity around the zero bias.

According to an aspect of embodiments, provided is a solution to improve nonlinearity around a zero bias in a semiconductor device.

For example, a nonlinear characteristic around a zero bias of a semiconductor device may be improved.

In order to process an incident high frequency wave with high efficiency, in the embodiments, nonlinearity in the I-V characteristics around a zero bias is improved by a semiconductor device using a nanostructure such as a nanowire or a nano-fin. During a backward operation of a semiconductor device, rising of a backward current is steep, and a forward breakdown voltage is high.

In order to improve rising a current and a backward breakdown voltage, expansion of a depletion layer inside a nanostructure is controlled in a direction orthogonal to a direction in which carriers flow. There may be several configurations for realizing the control.

<Principle 1>

Figure 1:
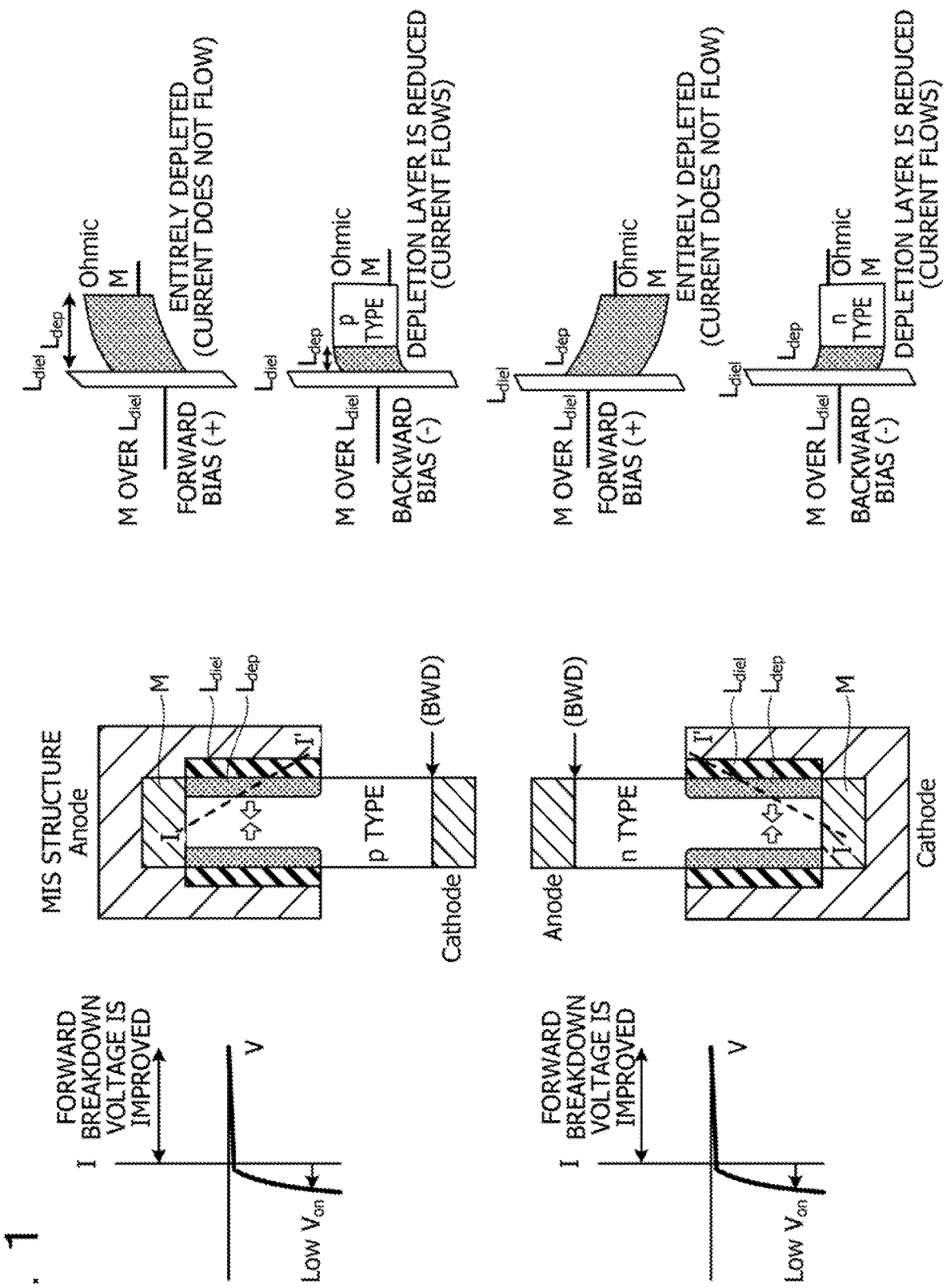
FIG. 1 is a diagram for describing a first principle for a semiconductor device of an embodiment.

FIG. 1 is a diagram for describing a first principle for a semiconductor device of an embodiment. In the first principle, expansion of a depletion layer Ldep is controlled in a direction intersecting a direction in which carriers flow by using a metal-insulator-semiconductor (MIS) junction between a nanostructure of a first conductivity type semiconductor and an electrode. The MIS junction is formed by inserting an insulating film Ldiel between a side surface of the first conductivity type semiconductor and the electrode. A band structure over a line I-I' of the MIS structure is also illustrated.

When the first conductivity type is a p type, the insulating film Ldiel is inserted between a side surface of a p-type semiconductor and an anode electrode. A tip of the p-type semiconductor is in ohmic contact with a metal M. When a forward bias (positive voltage) is applied, the depletion layer Ldep is expanded toward the central portion from an interface with the p-type semiconductor, and thus a hole may not pass to a valance band level of the ohmic junction. When a backward bias (negative voltage) is applied, a width of the depletion layer Ldep is reduced, and thus the hole flows into the anode electrode from the ohmic junction side (cathode side).

When the first conductivity type is an n type, the insulating film Ldiel is inserted between a side surface of an n-type semiconductor and a cathode electrode. A tip of the n-type semiconductor is in ohmic contact with the metal M. When a forward bias (positive voltage) is applied, the depletion layer Ldep is expanded toward the central portion of the n-type semiconductor from the interface therewith, and thus an electron may not pass to a conduction band level of the ohmic junction. When a backward bias (negative voltage) is applied, a width (thickness) of the depletion layer Ldep is reduced, and thus the electron flows into the cathode electrode from the ohmic junction side (anode side).

Consequently, the forward breakdown voltage is improved. In the backward direction, a current steeply flows at a small Von voltage, and nonlinearity around a zero bias is high.

When a pn junction is formed between the p-type semiconductor and the cathode electrode or between the n-type semiconductor and the anode electrode, a backward diode (indicated by "BWD" in FIG. 1) is obtained. In this case, an operation principle is also the same.

Figure 2:
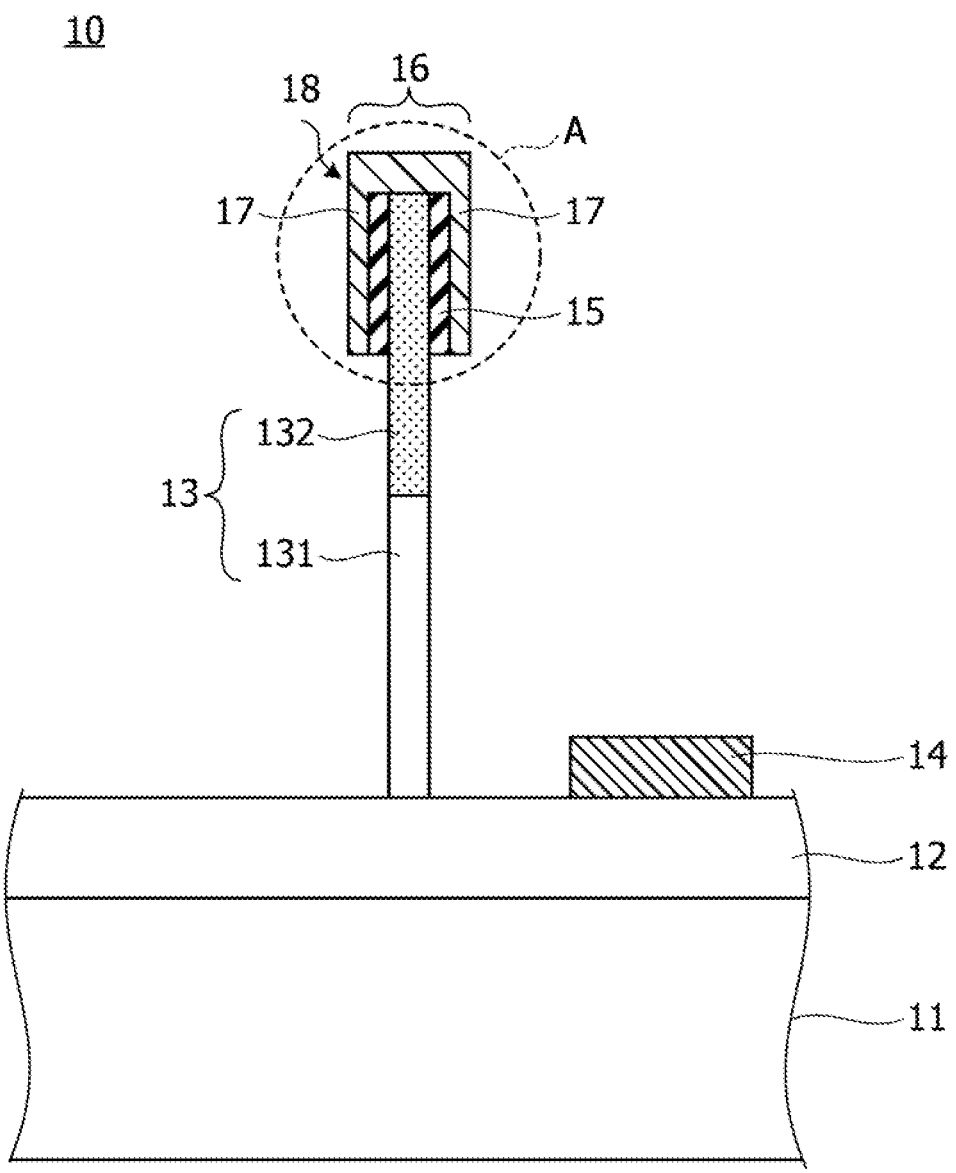
FIG. 2 is a schematic diagram of a semiconductor device to which the first principle is applied.

FIG. 2 is a schematic diagram of a semiconductor device 10 according to the principle 1. The semiconductor device 10 is formed of, for example, a nanowire 13. In this example, an n-type semiconductor layer 12 is disposed on a substrate 11 side, and the nanowire 13 in which an n-type semiconductor 131 is joined to a p-type semiconductor 132 is formed over the n-type semiconductor layer 12. The p-type semiconductor 132 is provided with an anode electrode 18 including a first electrode 16 and a second electrode 17, and a cathode electrode 14 is provided over the n-type semiconductor layer 12.

The first electrode 16 of the anode electrode 18 is in ohmic junction with a tip of the p-type semiconductor 132. An insulating film 15 is inserted between the second electrode 17 of the anode electrode 18 and a side surface of the p-type semiconductor 132, and thus a MIS structure is formed.

FIG. 3 (i.e., FIGS. 3A, 3B, and 3C) illustrates a fundamental operation diagram of the semiconductor device 10. FIG. 3A illustrates a state in which a backward bias (negative voltage) is applied to the device, and FIG. 3B illustrates a state in which a forward bias (positive voltage) is applied to the device. FIG. 3C illustrates I-V characteristics of the semiconductor device 10. The description will focus on a region of a circle A in FIG. 2.

The first electrode 16 of the anode electrode 18 is electrically coupled to an end surface of the p-type semiconductor 132, to form an ohmic junction ($C_{ohmic}$). When a backward bias is applied, a width of a depletion layer 19 present in the interface between the p-type semiconductor 132 and the insulating film 15 is reduced, and thus a hole easily flows toward the first electrode 16.

When a forward bias is applied, the depletion layer 19 is expanded toward the center of the p-type semiconductor 132, and thus flowing of the hole is blocked. This phenomenon occurs because a width (or a diameter) of the p-type semiconductor 132 of the nanostructure is sufficiently smaller than expansion of the depletion layer 19. The width of the depletion layer 19 also depends on a doped impurity concentration in the semiconductor or a material, and thus the width of the depletion layer 19 is made to exceed the width (or the diameter) of the p-type semiconductor 132 when the forward bias is applied by controlling such parameters.

With this configuration, as illustrated in FIG. 3C, a backward diode is realized in which a forward breakdown voltage is high, and nonlinearity around a zero bias is high.

<Principle 2>

Figure 4:
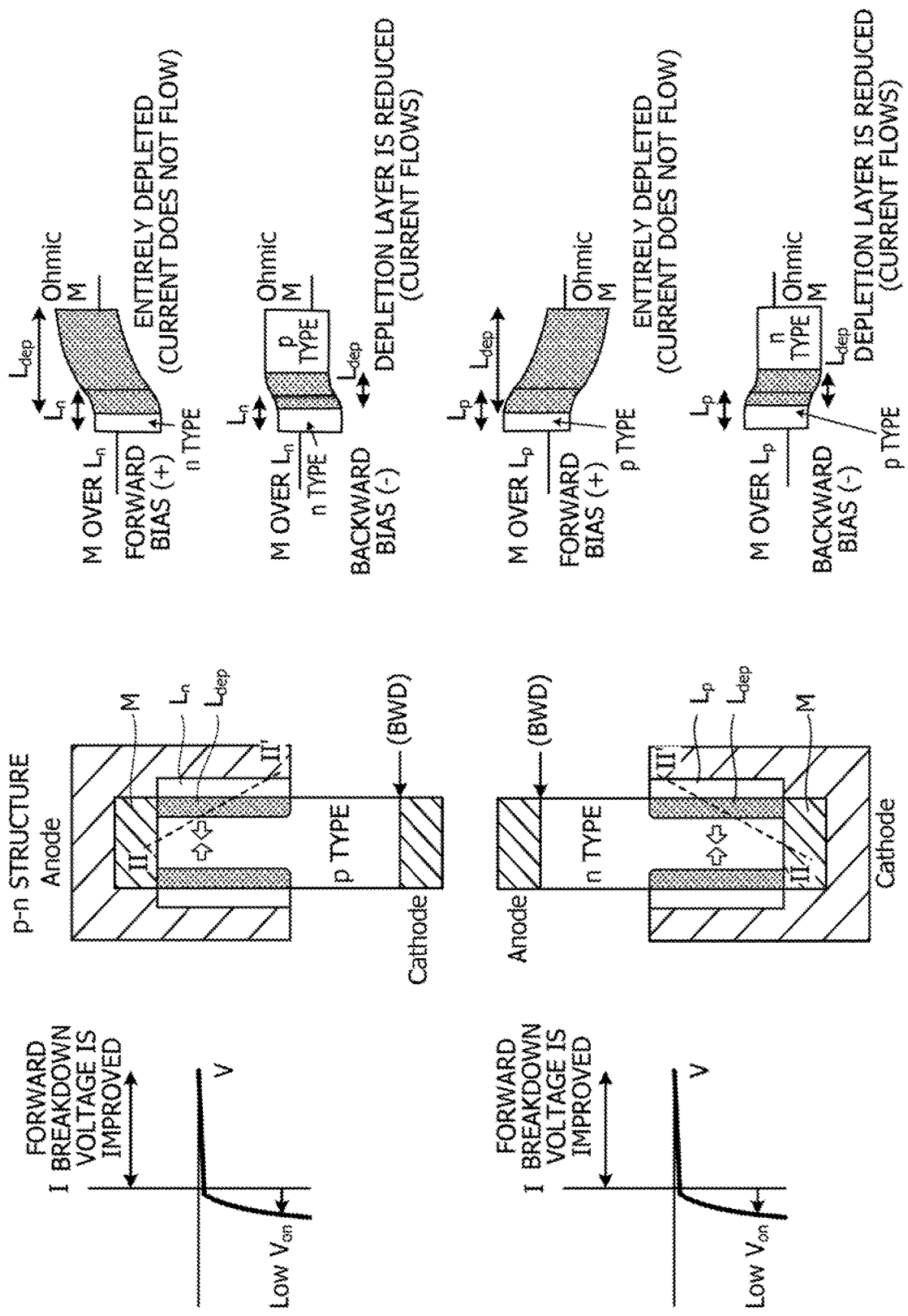
FIG. 4 is a diagram for describing a second principle for a semiconductor device of an embodiment.

FIG. 4 is a diagram for describing a second principle for a semiconductor device of an embodiment. In the second principle, expansion of a depletion layer Ldep is controlled in a direction intersecting a direction in which carriers flow by disposing a thin pn junction between a nanostructure of a first conductivity type semiconductor and an electrode. A band structure over a line II-II' of a p-n structure is also illustrated.

When the first conductivity type is a p type, an n-type semiconductor thin film Ln is inserted between a side surface of a p-type semiconductor and an anode electrode. A tip of the p-type semiconductor is in ohmic contact with a metal M. When a forward bias (positive voltage) is applied, the depletion layer Ldep is expanded toward the central portion of the p-type semiconductor, and thus a hole may not pass to a valance band level of the ohmic junction. When a backward bias (negative voltage) is applied, a width of the depletion layer Ldep is reduced, and thus the hole flows into the anode electrode from the ohmic junction side (cathode side).

When the first conductivity type is an n type, a p-type semiconductor thin film Lp is inserted between a side surface of an n-type semiconductor and a cathode electrode. A tip of the n-type semiconductor is in ohmic contact with the metal M. When a forward bias (positive voltage) is applied, the depletion layer Ldep is expanded toward the central portion of the n-type semiconductor, and thus an electron may not pass to a conduction band level of the ohmic junction side. When a backward bias (negative voltage) is applied, a width of the depletion layer Ldep is reduced, and thus the electron flows into the anode electrode from the ohmic junction side (cathode side).

Consequently, the forward breakdown voltage is improved. In the backward direction, a current steeply flows at a small Von voltage, and nonlinearity around a zero bias is high.

When a pn junction is formed between the p-type semiconductor and the cathode electrode or between the n-type semiconductor and the anode electrode, a backward diode (indicated by "BWD" in FIG. 1) is obtained. In this case, an operation principle is also the same.

FIG. 5 is a schematic diagram of a semiconductor device 20 according to the principle 2. The semiconductor device 20 is formed of, for example, a nanowire 23. In this example, an n-type semiconductor layer 22 is disposed on a substrate 21 side, and the nanowire 23 having a pn junction of an n-type semiconductor 231 and a p-type semiconductor 232 is formed over the n-type semiconductor layer 22.

The p-type semiconductor 232 is provided with an anode electrode 28 including a first electrode 26 and a second electrode 27, and a cathode electrode 24 is provided over the n-type semiconductor layer 22. An n-type semiconductor thin film 233 is inserted into an interface between a side surface of the p-type semiconductor 232 and the second electrode 27.

FIG. 6 (i.e., FIGS. 6A, 6B, and 6C) illustrates a fundamental operation diagram of the semiconductor device 20. FIG. 6A illustrates a state in which a backward bias (negative voltage) is applied to the device, and FIG. 6B illustrates a state in which a forward bias (positive voltage) is applied to the device. FIG. 6C illustrates I-V characteristics of the semiconductor device 20. The description will focus on a region of a circle B in FIG. 5.

The first electrode 26 of the anode electrode 28 is electrically coupled to an end part of the p-type semiconductor 232, to form an ohmic junction (Cohmic). When a backward bias is applied, a width of a depletion layer 29 present in the interface between the p-type semiconductor 232 and the n-type semiconductor thin film 233 is reduced, and thus a hole easily flows toward the first electrode 26.

When a forward bias is applied, a width of the depletion layer 29 extending toward the inside of the p-type semiconductor 232 from the interface between the p-type semiconductor 232 and the n-type semiconductor thin film 233 increases, and thus flowing of the hole is blocked. This phenomenon occurs because a width (or a diameter) of the p-type semiconductor 232 of the nanostructure is sufficiently smaller than expansion of the depletion layer 29. The thickness of the depletion layer 29 also depends on a doped impurity concentration in the semiconductor or a material, and thus the width of the depletion layer 29 is made to exceed the width (or the diameter) of the p-type semiconductor 232 when the forward bias is applied by controlling such parameters.

With this configuration, as illustrated in FIG. 6C, a backward diode is realized in which a forward breakdown voltage is high, and nonlinearity around a zero bias is high.

<Principle 3>

FIG. 7 is a diagram for describing a third principle for a semiconductor device of an embodiment. In the third principle, expansion of a depletion layer Ldep is controlled in a direction intersecting a direction in which carriers flow by providing a Schottky junction in a nanostructure of a first conductivity type semiconductor. A band structure over a line n-r of a Schottky structure is also illustrated.

When the first conductivity type is a p type, an anode electrode is provided at a part of a side surface of a p-type semiconductor, to form a Schottky junction. A tip of the p-type semiconductor is in ohmic contact with a metal M. When a forward bias (positive voltage) is applied, the depletion layer Ldep is expanded toward the central portion of the p-type semiconductor, and thus a hole cannot pass to a valance band level of the ohmic junction. When a backward bias (negative voltage) is applied, a width of the depletion layer Ldep is reduced, and thus the hole flows into the anode electrode from the ohmic junction side (cathode side).

When the first conductivity type is an n type, a side surface of an n-type semiconductor and a cathode electrode are in Schottky junction with each other. A tip of the n-type semiconductor is in ohmic contact with the metal M. When a forward bias (positive voltage) is applied, the depletion layer Ldep is expanded toward the central portion of the n-type semiconductor, and thus an electron may not pass to a conduction band level of the ohmic junction. When a backward bias (negative voltage) is applied, a width (thickness) of the depletion layer Ldep is reduced, and thus the electron flows into the cathode electrode from the ohmic junction side (anode side).

Consequently, the forward breakdown voltage is improved. In the backward direction, a current steeply flows at a small Von voltage, and nonlinearity around a zero bias is high.

When a pn junction is formed between the p-type semiconductor and the cathode electrode or between the n-type semiconductor and the anode electrode, a backward diode (indicated by "BWD" in FIG. 1) is obtained. In this case, an operation principle is also the same.

Figure 8:
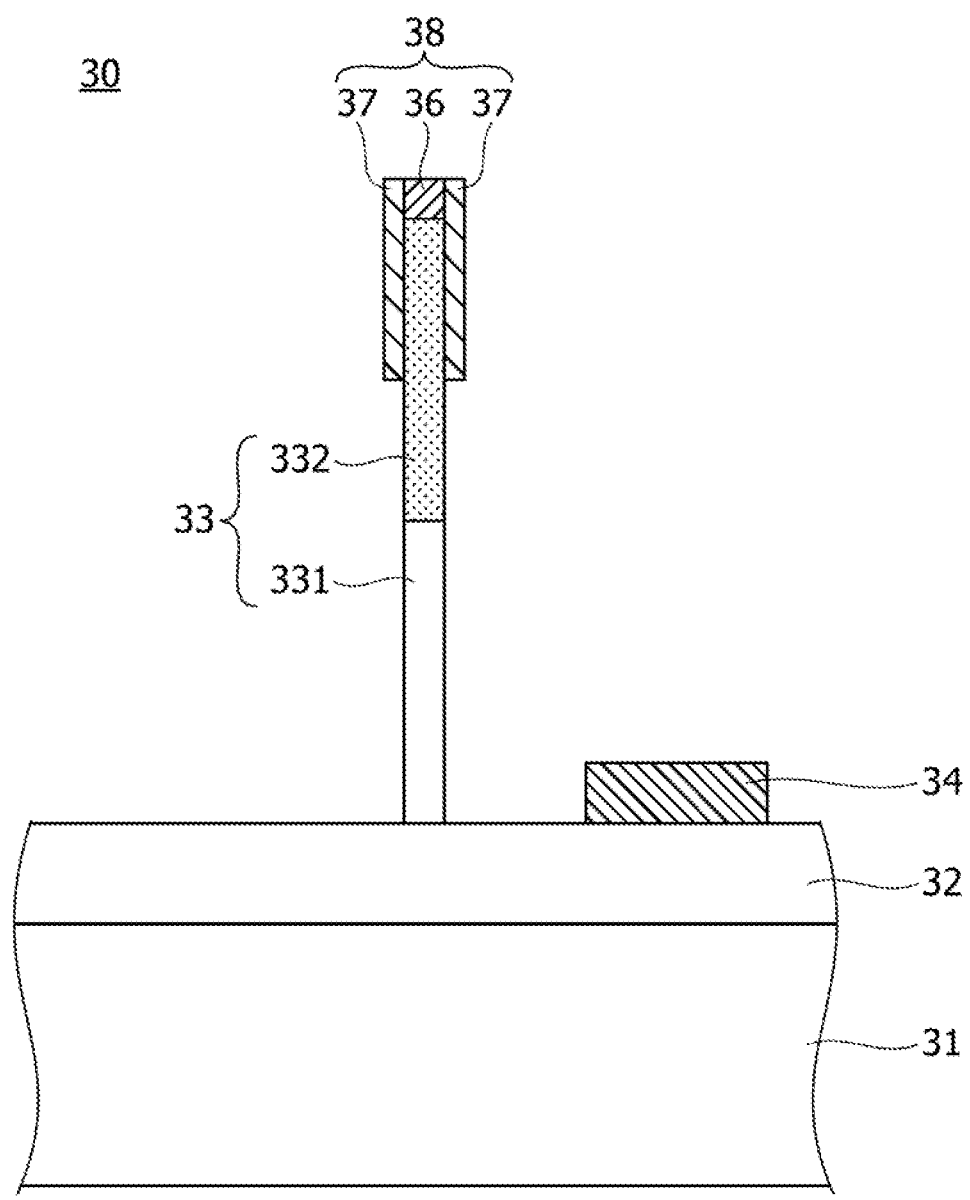
FIG. 8 is a schematic diagram of a semiconductor device to which the third principle is applied.

FIG. 8 is a schematic diagram of a semiconductor device 30 according to the principle 3. The semiconductor device 30 is formed of a nanostructure such as a nanowire 33. In this example, an n-type semiconductor layer 32 is disposed on a substrate 31 side, and the nanowire 33 having a pn junction of an n-type semiconductor 331 and a p-type semiconductor 332 is formed over the n-type semiconductor layer 32.

The p-type semiconductor 332 is coupled to an anode electrode 38 including a first electrode 36 and a second electrode 37, and a cathode electrode 34 is coupled to the n-type semiconductor layer 32.

FIG. 9 (i.e., FIGS. 9A, 9B, and 9C) illustrates a fundamental operation diagram of the semiconductor device 30. FIG. 9A illustrates a state in which a backward bias (negative voltage) is applied to the device, and FIG. 9B illustrates a state in which a forward bias (positive voltage) is applied to the device. FIG. 9C illustrates I-V characteristics of the semiconductor device 30.

The first electrode 36 of the anode electrode 38 is electrically coupled to an end part of the p-type semiconductor 332, to form an ohmic junction (Cohmic). The second electrode 37 of the anode electrode 38 is formed over a side surface of the p-type semiconductor 332, to form a Schottky junction.

When a backward bias is applied, a width of a depletion layer 39 present in the interface between the p-type semiconductor 332 and the second electrode 37 is reduced, and thus a hole easily flows toward the first electrode 36.

When a forward bias is applied, a width of the depletion layer 39 extending toward the inside of the p-type semiconductor 332 from the interface with the second electrode 37 increases, and thus flowing of the hole is blocked. This phenomenon occurs because a width (or a diameter) of the p-type semiconductor 332 of the nanostructure is sufficiently smaller than expansion of the depletion layer 39. The width of the depletion layer 39 also depends on a doped impurity concentration in the semiconductor or a material, and thus the width of the depletion layer 39 is made to exceed the width (or the diameter) of the p-type semiconductor 332 when the forward bias is applied by controlling such parameters.

With this configuration, as illustrated in FIG. 9C, a backward diode is realized in which a forward breakdown voltage is high, and nonlinearity around a zero bias is high.

First Embodiment

Figure 10:
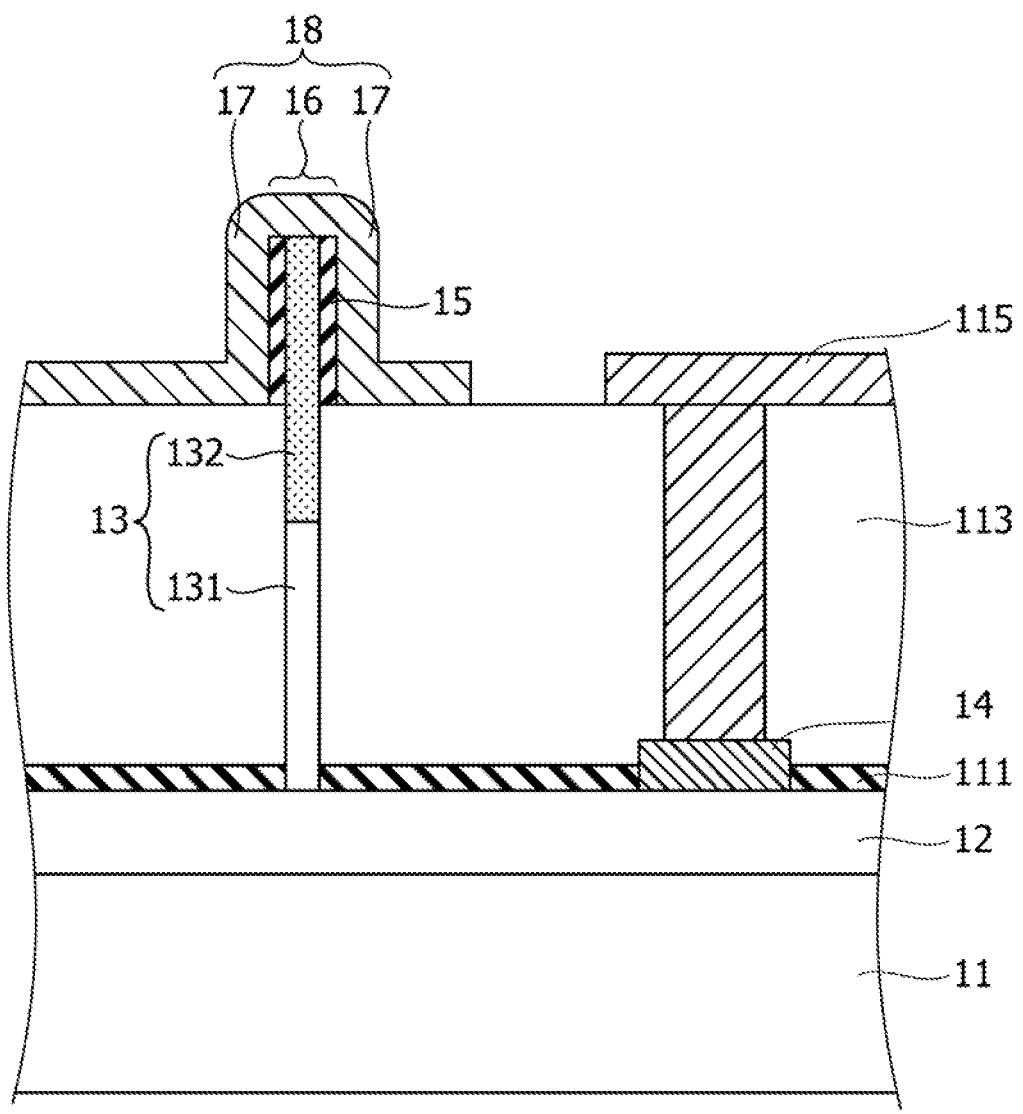
FIG. 10 is a schematic diagram of a semiconductor device of a first embodiment.

FIG. 10 illustrates a configuration example of the semiconductor device 10 to which the first principle is applied. In the first embodiment, a MIS junction is formed over the side surface of the first conductivity type semiconductor of the nanostructure, and thus the anode is depleted. In the example illustrated in FIG. 10, a backward diode of a nanowire is provided with a first conductivity type as a p type and a second conductivity type as an n type.

The n$^+$-type semiconductor layer 12 doped with an n-type impurity at a high concentration, and an insulating film 111 are stacked in this order over the substrate 11. The insulating film 111 is partially removed, and thus the cathode electrode 14 and the n-type semiconductor 131 of the nanostructure are coupled to the n$^+$-type semiconductor layer 12. The p-type semiconductor 132 of the nanostructure is joined to the n-type semiconductor 131 in a long axis direction thereof, and thus the nanowire 13 including a pn junction is formed.

A part of the p-type semiconductor 132 of the nanowire 13 protrudes from an interlayer insulating film 113, and is coupled to the anode electrode 18. The first electrode 16 of the anode electrode 18 is in ohmic junction with a tip of the p-type semiconductor 132. The insulating film 15 is inserted between the second electrode 17 of the anode electrode 18 and the side surface of the p-type semiconductor 132, and thus a MIS junction is formed. A material of the insulating film 15 forming the MIS junction may or not be the same as a material of the interlayer insulating film 113.

An extraction electrode 115 electrically coupled to the cathode electrode 14 is formed in the interlayer insulating film 113. A current, an electrical signal, or a voltage is applied to the cathode electrode 14 via the extraction electrode 115.

When a forward bias is applied during an operation, as described with reference to FIG. 3, the depletion layer is expanded toward the center of the p-type semiconductor 132, and thus flowing of a hole is suppressed. Consequently, the forward breakdown voltage is improved. When a backward bias is applied, the depletion layer is reduced in a diameter direction of the nanowire, and thus the hole flows into the first electrode 16.

As an operation of the backward diode, when a backward voltage is applied to the device, a conduction band level of the n-type semiconductor 131 is brought into a state of being lower than a valance band level of the p-type semiconductor 132. An electron in the valance band of the p-type semiconductor 132 directly tunnels through a barrier of a bending part of an energy band between the p-type semiconductor 132 and the n-type semiconductor 131, and moves to the conduction band of the n-type semiconductor 131. A current steeply rises at the backward voltage due to the tunneling between the bands.

An impurity concentration of the p-type semiconductor 132 of the nanowire 13 is set to $1\times10^{18}$ cm$^{-3}$ or more in order to make the tunneling between the bands possible. Even at the high impurity concentration, the depletion layer may be expanded in the direction intersecting flowing of carriers due to the MIS junction formed over the sidewall of the nanowire 13. This is greatly different from that of a general Schottky barrier diode. In the general Schottky barrier diode, an impurity concentration is set to $1\times10^{17}$ cm$^{-3}$ or less in order to cause the depletion layer to expand.

Figure 11:
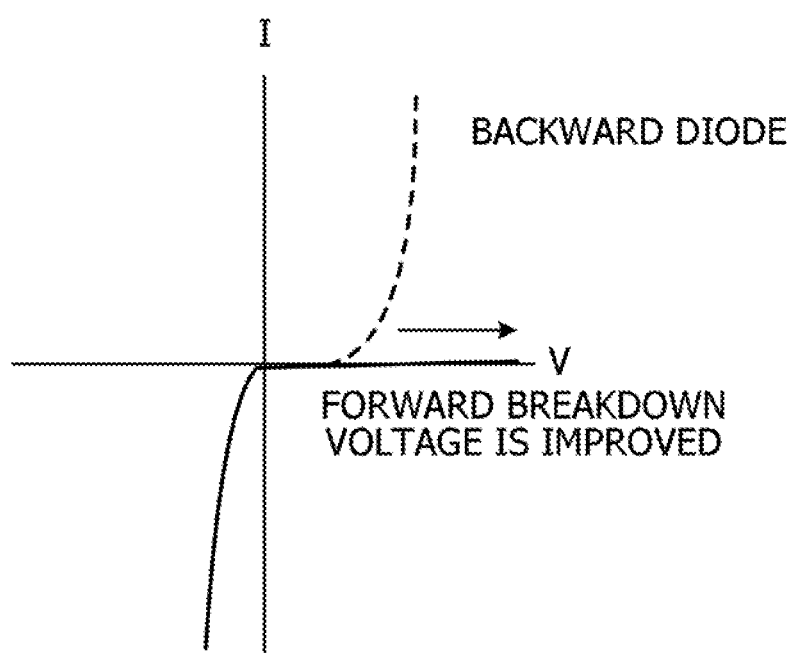
FIG. 11 is an I-V characteristic diagram of the semiconductor device of the first embodiment.

In the configuration illustrated in FIG. 10, the ohmic junction is disposed at the end part of the nanostructure in which the impurity concentration is $1\times10^{18}$ cm$^{-3}$ or more, and the MIS structure for controlling the depletion layer is provided over the side surface thereof. Consequently, as illustrated in FIG. 11, it is possible to obtain backward diode characteristics in which nonlinearity around a zero bias is high.

FIGS. 12A to 12K are manufacturing process diagrams of the semiconductor device 10 of the first embodiment. Materials used in processes described below are only examples, and are not intended to limit the present invention.

Figure 12A:
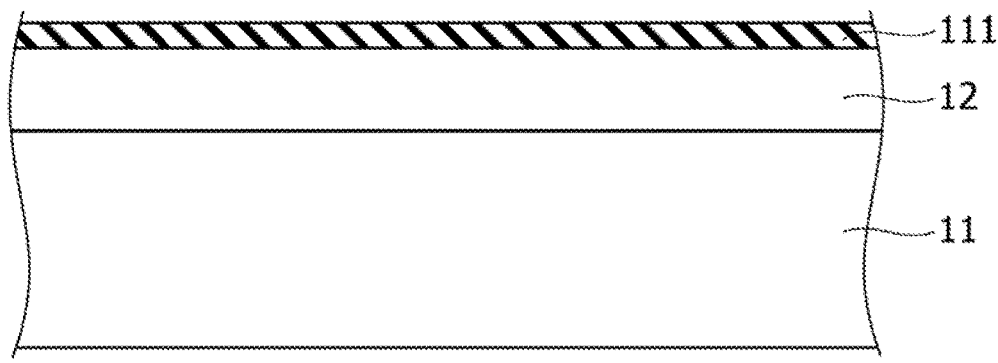
FIG. 12A is a manufacturing process diagram of the semiconductor device of the first embodiment.

In FIG. 12A, a semiconductor layer 12 of n$^+$-GaAs doped with an n-type impurity at a high concentration is grown to have a thickness of 200 nm over the substrate 11 of semi-insulating GaAs(111)B. The n-type impurity concentration is, for example, $1\times10^{19}$ cm$^{-3}$. The insulating film 111 such as SiN or SiO$_2$ is deposited to have a thickness of about 50 nm over the semiconductor layer 12 of n$^+$-GaAs.

Figure 12B:
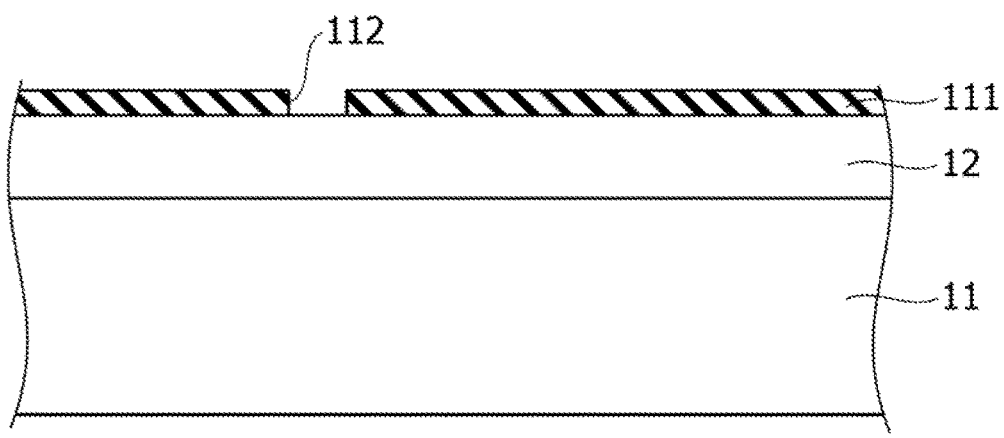
FIG. 12B is a manufacturing process diagram of the semiconductor device of the first embodiment.

In FIG. 12B, a resist mask having a predetermined opening pattern is formed by using electron beam (EB) lithography, and an opening 112 is formed in the insulating film 111 through fluorine-based dry etching. In this case, for example, Au may be deposited and lifted off such that an Au catalyst is formed in the opening 112.

Figure 12C:
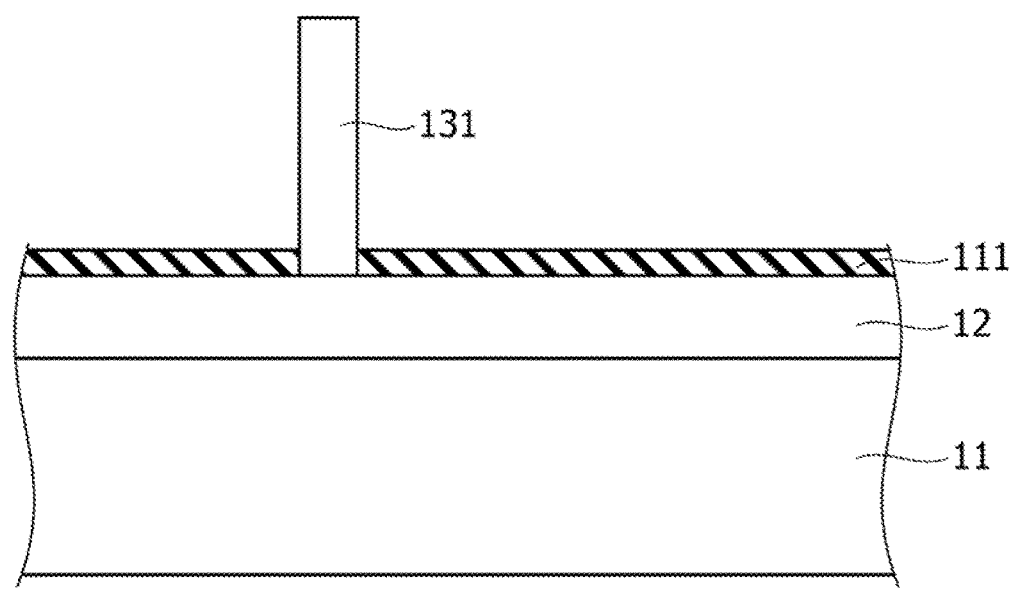
FIG. 12C is a manufacturing process diagram of the semiconductor device of the first embodiment.

In FIG. 12C, an n-InAs nanowire is grown as the n-type semiconductor 131 inside the opening 112 according to an MOCVD method.

Figure 12D:
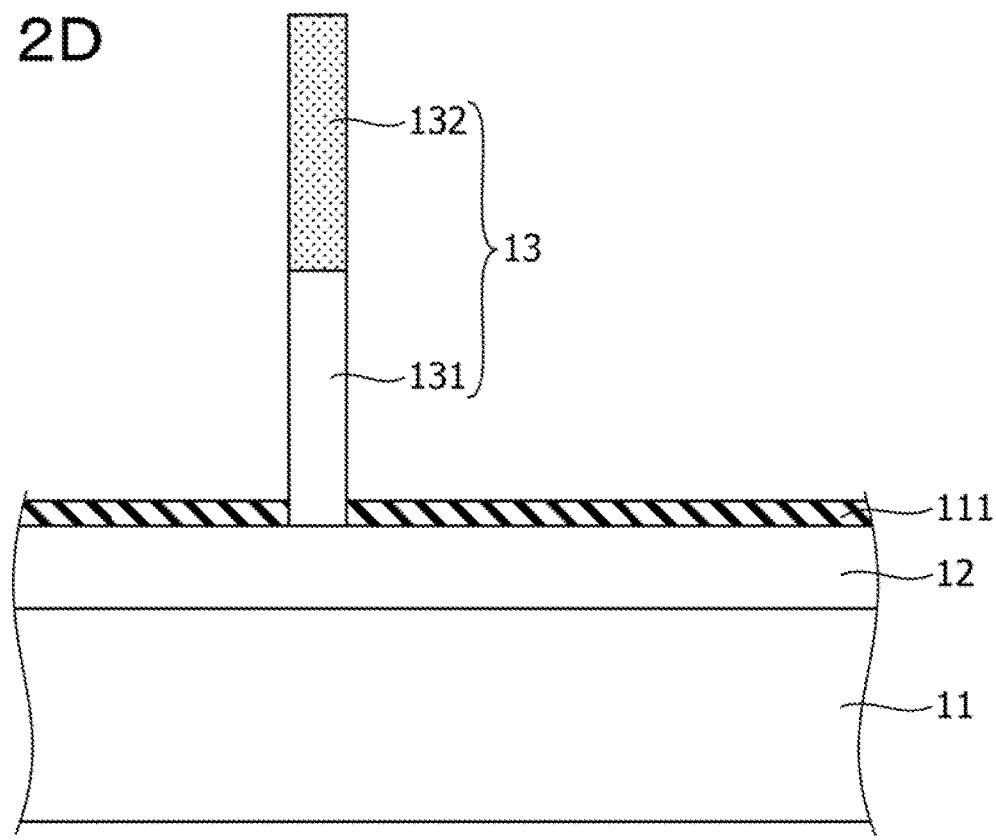
FIG. 12D is a manufacturing process diagram of the semiconductor device of the first embodiment.

In FIG. 12D, a p-GaAsSb nanowire is grown as the p-type semiconductor 132 to follow the n-InAs nanowire, and thus the nanowire 13 including the pn junction is formed. The nanowire 13 of n-InAs/p-GaAsSb operates as a backward diode.

Figure 12E:
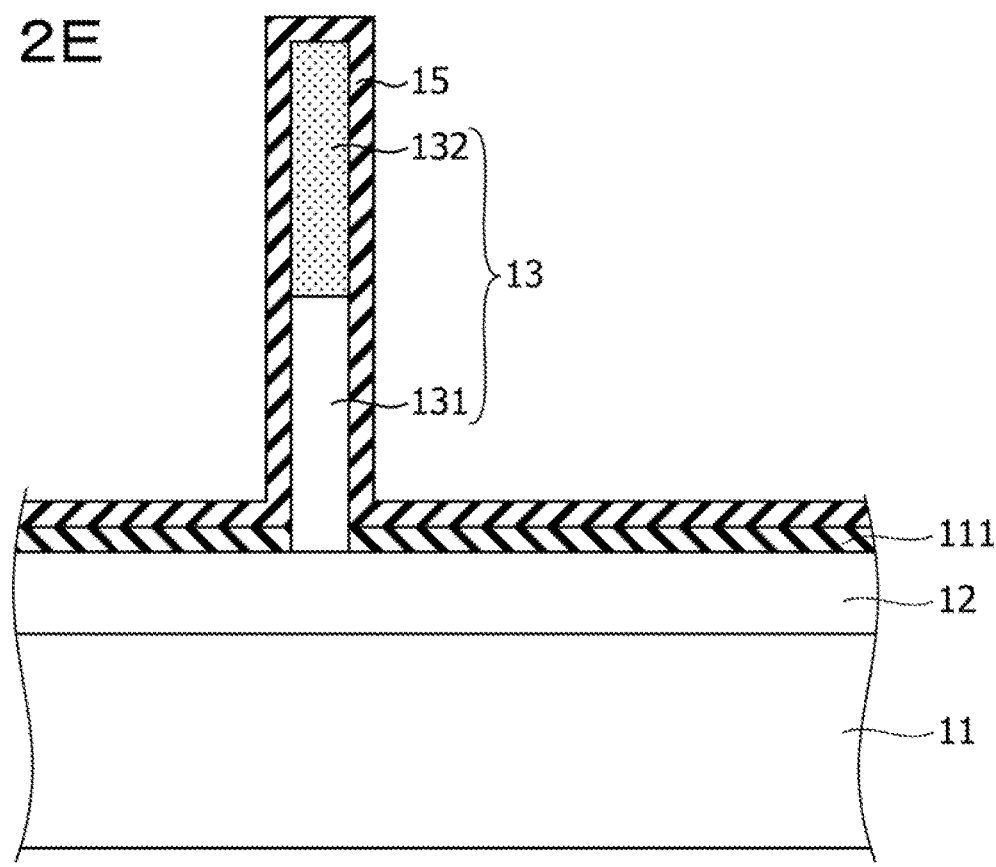
FIG. 12E is a manufacturing process diagram of the semiconductor device of the first embodiment.

In FIG. 12E, an AlO thin film having a thickness of about 10 nm is entirely formed as the insulating film 15 according to, for example, an atomic layer deposition (ALD) method.

Figure 12F:
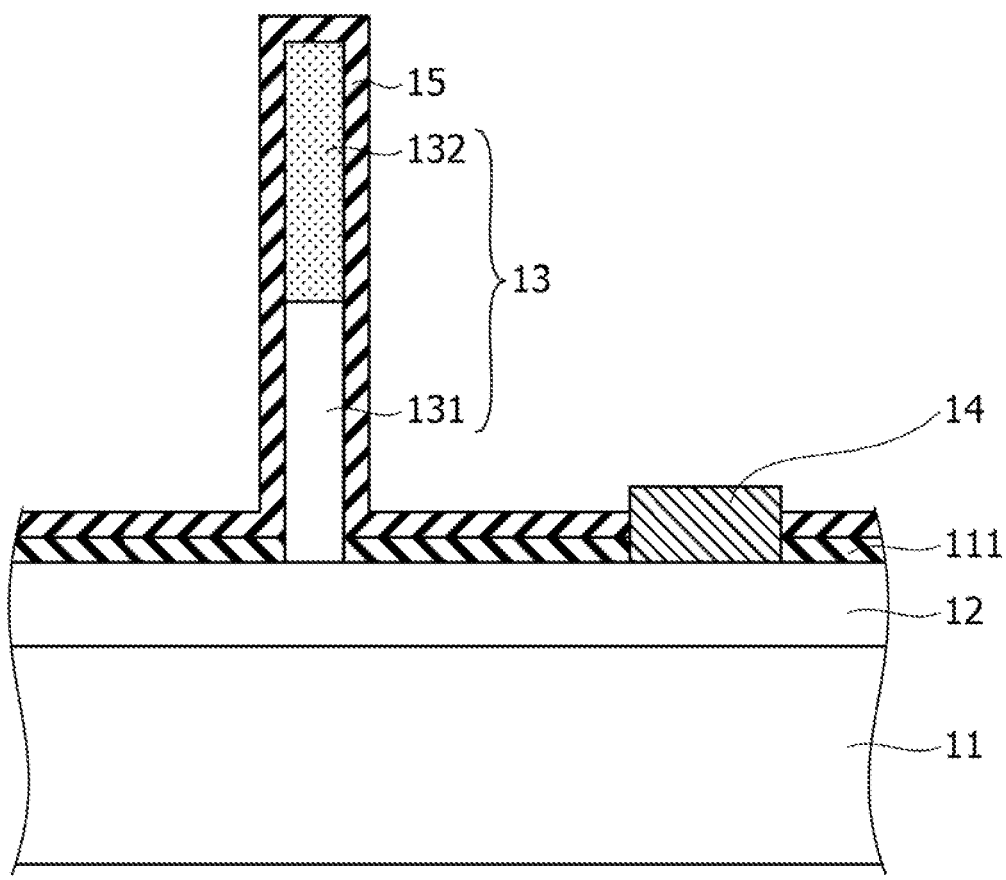
FIG. 12F is a manufacturing process diagram of the semiconductor device of the first embodiment.

In FIG. 12F, an electrode region is defined according to a photolithography method, and an opening is formed in the insulating film 15 and the insulating film 111 through dry etching. AuGe is deposited and lifted off, and thus the cathode electrode 14 coupled to the semiconductor layer 12 of n$^+$-GaAs is formed.

Figure 12G:
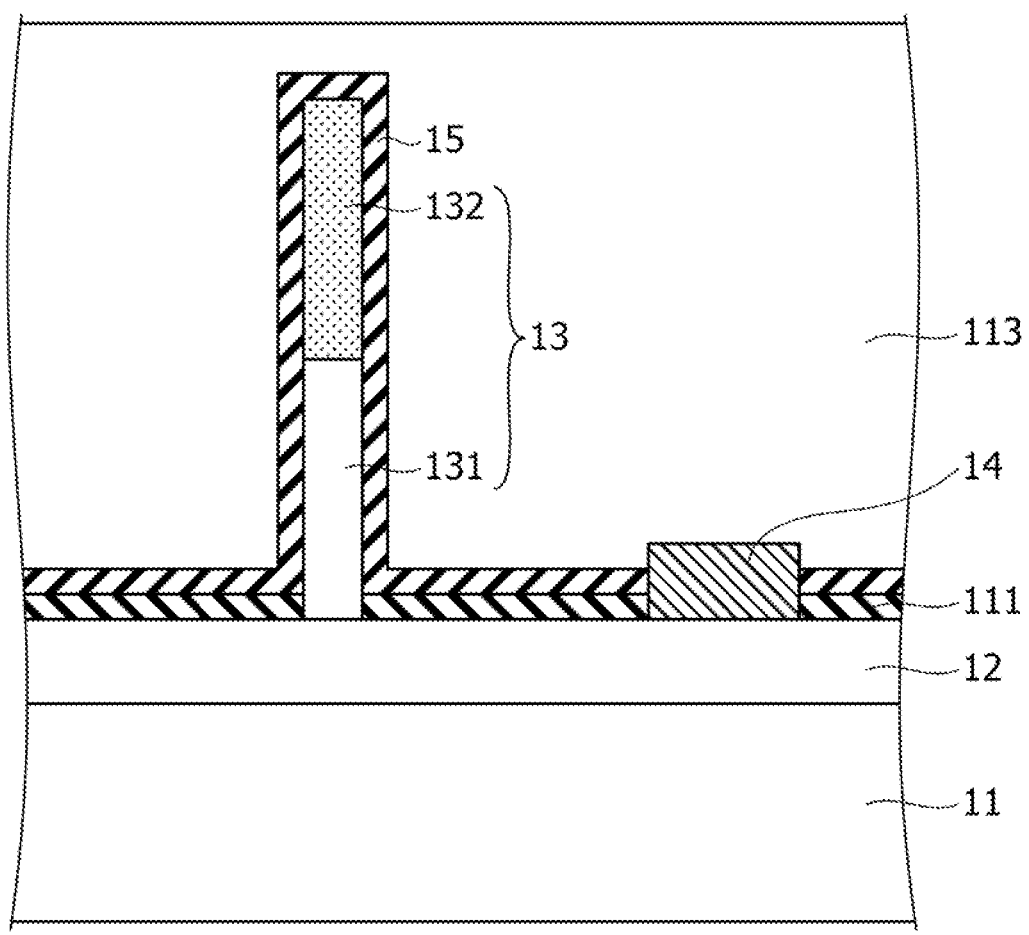
FIG. 12G is a manufacturing process diagram of the semiconductor device of the first embodiment.

In FIG. 12G, for example, a benzocycobutene (BCB) resin is applied and cured, and thus the interlayer insulating film 113 is formed. The nanowire 13 is completely buried at this moment.

Figure 12H:
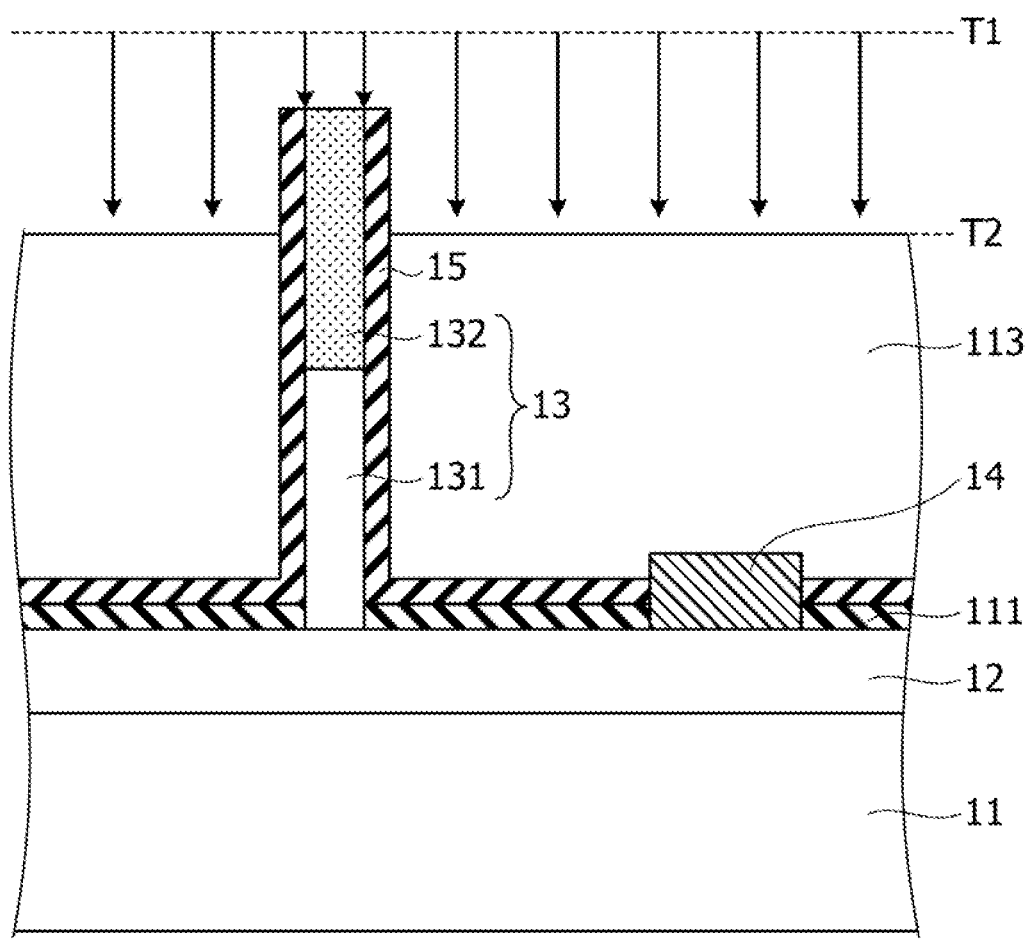
FIG. 12H is a manufacturing process diagram of the semiconductor device of the first embodiment.

In FIG. 12H, the interlayer insulating film 113 is removed over a predetermined thickness (for example, from T1 to T2) through dry etching such that a part of the p-GaAsSb nanowire as the p-type semiconductor 132 is exposed. The insulating film 15 of AlO covering a tip of the p-GaAsSb nanowire is removed through the dry etching. The insulating film 15 over the side surface of the nanowire 13 remains.

Figure 12I:
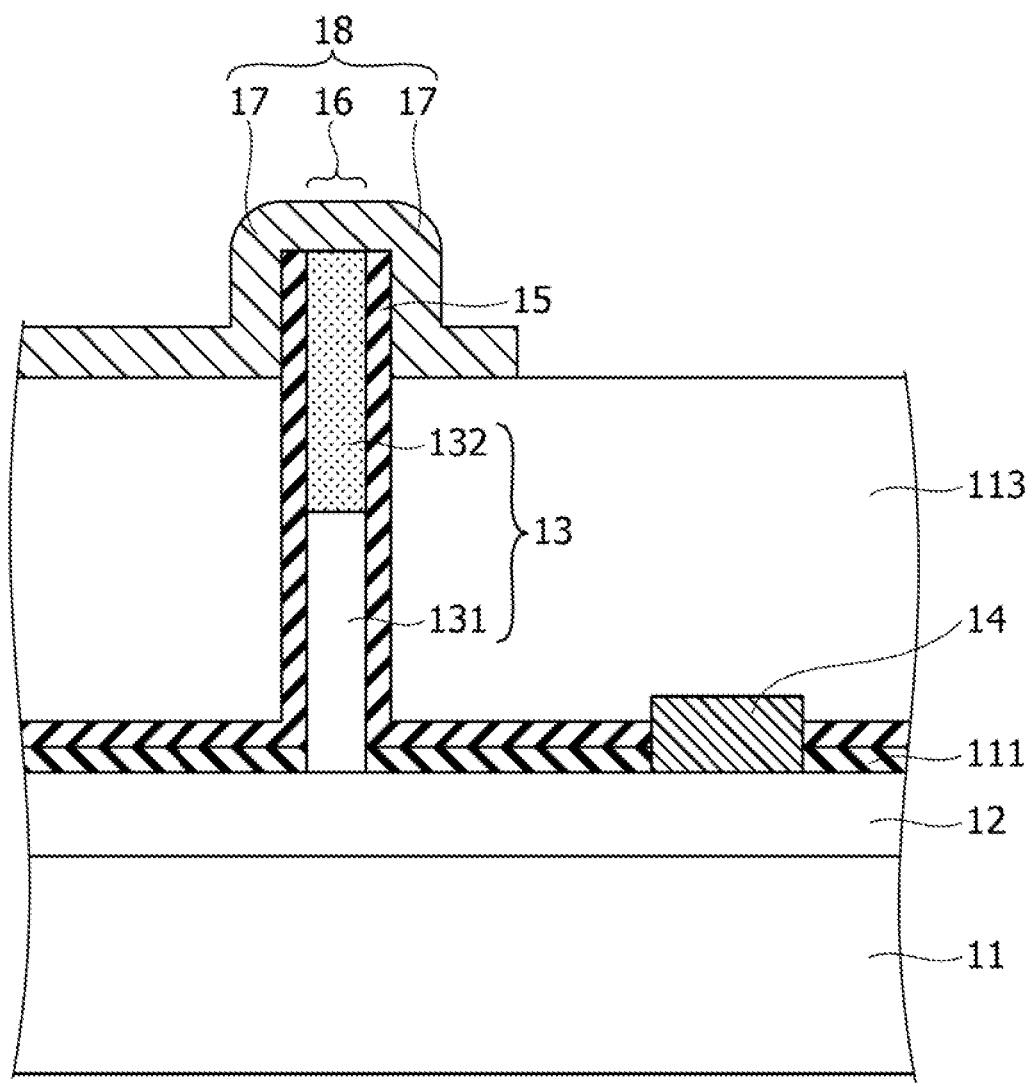
FIG. 12I is a manufacturing process diagram of the semiconductor device of the first embodiment.

In FIG. 12I, an electrode region is defined according to photolithography, and Pt is deposited and lifted off such that the anode electrode 18 is formed. In the anode electrode 18, a portion in ohmic junction with the tip of the p-type semiconductor 132 becomes the first electrode 16. In the anode electrode 18, a portion forming the MIS structure over the side surface of the nanowire 13 via the insulating film 15 becomes the second electrode 17. The depletion layer is formed at the interface with the p-type semiconductor 132 due to the MIS structure, and the depletion layer may be completely expanded by applying a bias.

Figure 12J:
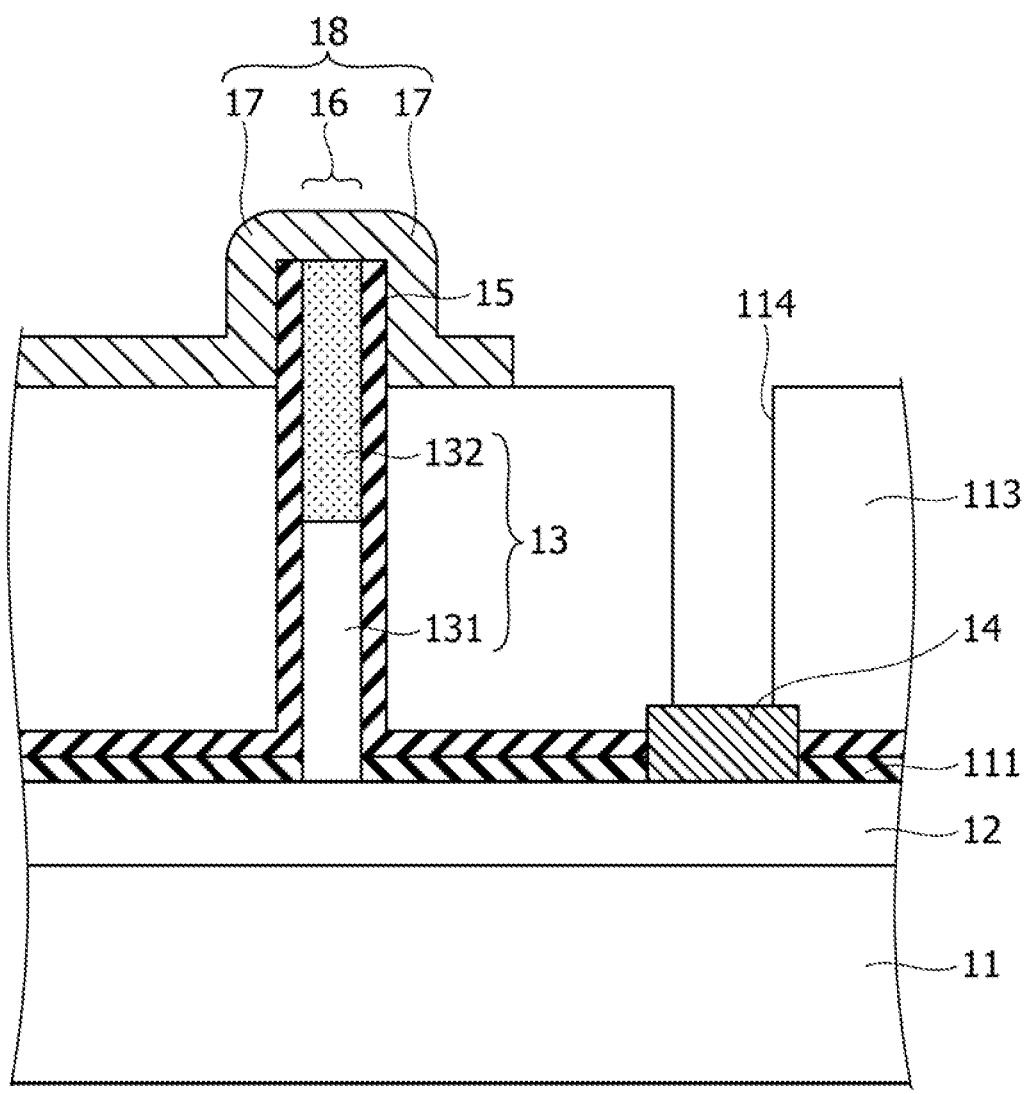
FIG. 12J is a manufacturing process diagram of the semiconductor device of the first embodiment.

In FIG. 12J, a contact hole region is defined over the interlayer insulating film 113 through photolithography, and an opening 114 to which the cathode electrode 14 is exposed is formed through dry etching.

Figure 12K:
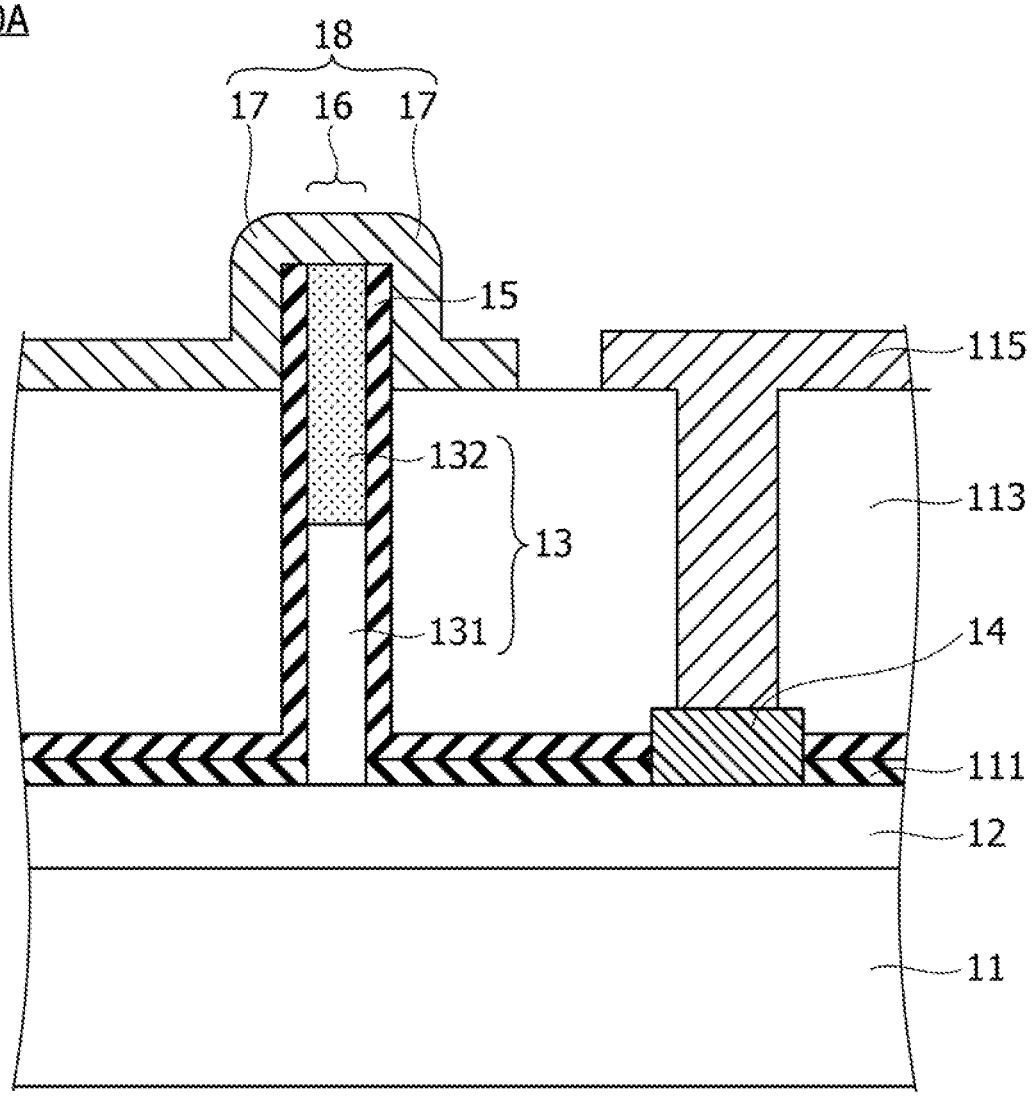
FIG. 12K is a manufacturing process diagram of the semiconductor device of the first embodiment.

In FIG. 12K, an electrode region is defined through photolithography, and the extraction electrode 115 extracted from the cathode electrode 14 is formed through plating. Consequently, a backward diode 10A having a high forward breakdown voltage is formed.

Second Embodiment

Figure 13:
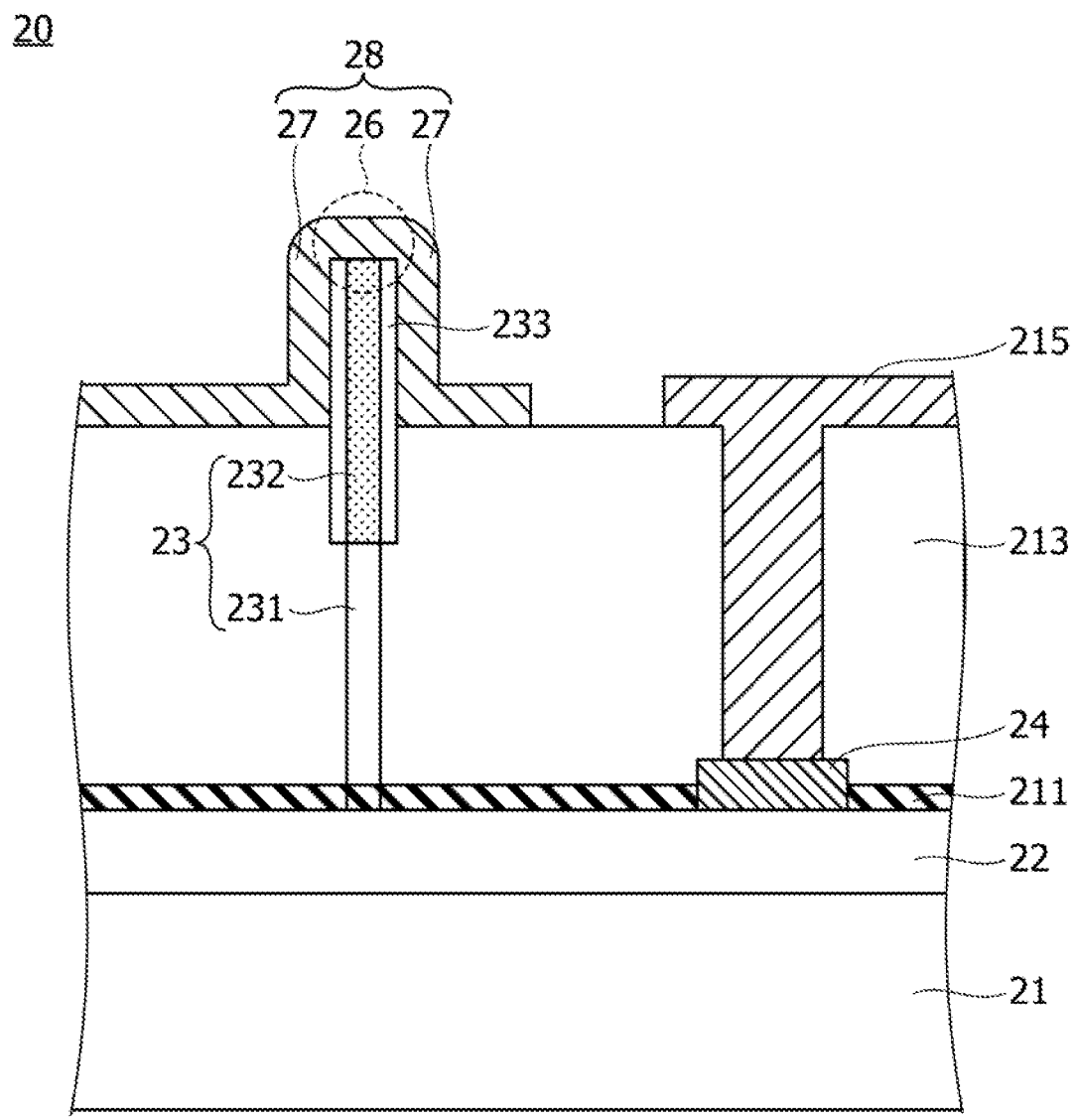
FIG. 13 is a schematic diagram of a semiconductor device of a second embodiment.

FIG. 13 illustrates a configuration example of the semiconductor device 20 to which the principle 2 is applied. In the second embodiment, a pn junction is formed over the side surface of the first conductivity type semiconductor of the nanostructure, and thus the anode is depleted. In the example illustrated in FIG. 13, a backward diode of a nanowire is formed with a first conductivity type as a p type and a second conductivity type as an n type.

The n$^+$-type semiconductor layer 22 doped with an n-type impurity at a high concentration, and an insulating film 211 are stacked in this order over the substrate 21. The insulating film 211 is partially removed, and thus the n-type semiconductor 231 and the cathode electrode 24 of the nanostructure are coupled to the n$^+$-type semiconductor layer 22. The p-type semiconductor 232 of the nanostructure is joined to the n-type semiconductor 231 in a long axis direction thereof, and thus the nanowire 23 including a pn junction is formed.

A part of the p-type semiconductor 232 of the nanowire 23 protrudes from an interlayer insulating film 213, and is coupled to the anode electrode 28. The first electrode 26 of the anode electrode 28 is in ohmic junction with the tip of the p-type semiconductor 232. An n-InAs thin film 233 is inserted between the second electrode 27 of the anode electrode 28 and the side surface of the p-type semiconductor 232, and thus a pn junction is formed over an outer surface of the p-type semiconductor 232. A material of the n-type semiconductor shell or thin film 233 disposed on the outer periphery of the p-type semiconductor 232 may or not be the same as a material of the n-type semiconductor 231.

An extraction electrode 215 electrically coupled to the cathode electrode 24 is formed in the interlayer insulating film 213. A current, an electrical signal, or a voltage is applied to the cathode electrode 24 via the extraction electrode 215.

When a forward bias is applied during an operation, as described with reference to FIG. 6, the depletion layer is expanded toward the center of the p-type semiconductor 232, and thus flowing of a hole is suppressed. Consequently, the forward breakdown voltage is improved. When a backward bias is applied, the depletion layer is reduced in a diameter direction of the nanowire, and thus the hole flows into the first electrode 26.

An operation of the backward diode is the same as described in the first embodiment. An impurity concentration of the p-type semiconductor 232 of the nanowire 23 is set to $1 \times 10^{18}$ cm$^{-3}$ or more. Even at the high impurity concentration, the depletion layer may be expanded in the direction intersecting flowing of carriers due to the pn junction type Schottky barrier formed over the sidewall of the nanowire 23.

With the configuration illustrated in FIG. 13, in the same manner as the configuration illustrated in FIG. 11, it is possible to obtain backward diode characteristics in which nonlinearity around a zero bias is high.

FIGS. 14A to 14K are manufacturing process diagrams of the semiconductor device 20 of the second embodiment. Materials used in processes described below are only examples, and are not intended to limit the present invention.

Figure 14A:
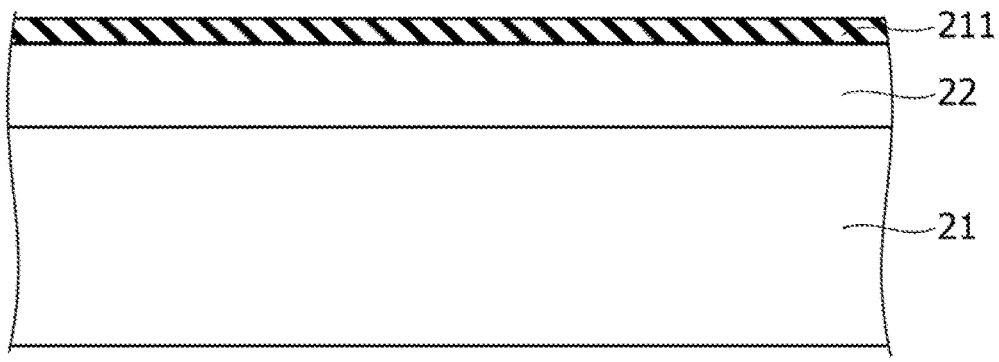
FIG. 14A is a manufacturing process diagram of the semiconductor device of the second embodiment.

In FIG. 14A, the semiconductor layer 22 of n$^+$-GaAs doped with an n-type impurity at a high concentration is grown to have a thickness of 200 nm over the substrate 21 of semi-insulating GaAs(111)B. The n-type impurity concentration is, for example, $1 \times 10^{19}$ cm$^3$. The insulating film 211 such as SiN or SiO$_2$ is deposited to have a thickness of about 50 nm over the semiconductor layer 22 of n$^+$-GaAs.

Figure 14B:
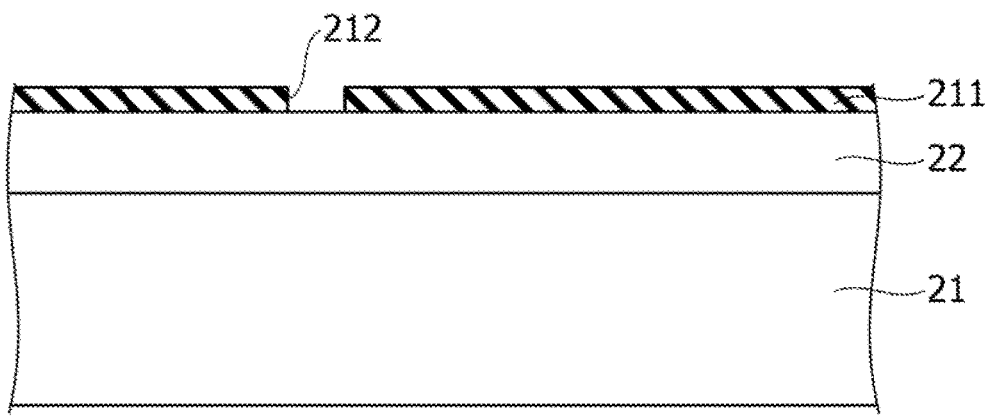
FIG. 14C is a manufacturing process diagram of the semiconductor device of the second embodiment.
FIG. 14D is a manufacturing process diagram of the semiconductor device of the second embodiment.
FIG. 14E is a manufacturing process diagram of the semiconductor device of the second embodiment.
FIG. 14F is a manufacturing process diagram of the semiconductor device of the second embodiment.
FIG. 14G is a manufacturing process diagram of the semiconductor device of the second embodiment.
FIG. 14H is a manufacturing process diagram of the semiconductor device of the second embodiment.
FIG. 14I is a manufacturing process diagram of the semiconductor device of the second embodiment.
FIG. 14J is a manufacturing process diagram of the semiconductor device of the second embodiment.
FIG. 14K is a manufacturing process diagram of the semiconductor device of the second embodiment.

In FIG. 14B, a resist mask having a predetermined opening pattern is formed by using electron beam (EB) lithography, and an opening 212 is formed in the insulating film 211 through fluorine-based dry etching. In this case, for example, Au may be deposited and lifted off such that an Au catalyst is formed in the opening 212.

Figure 14C:
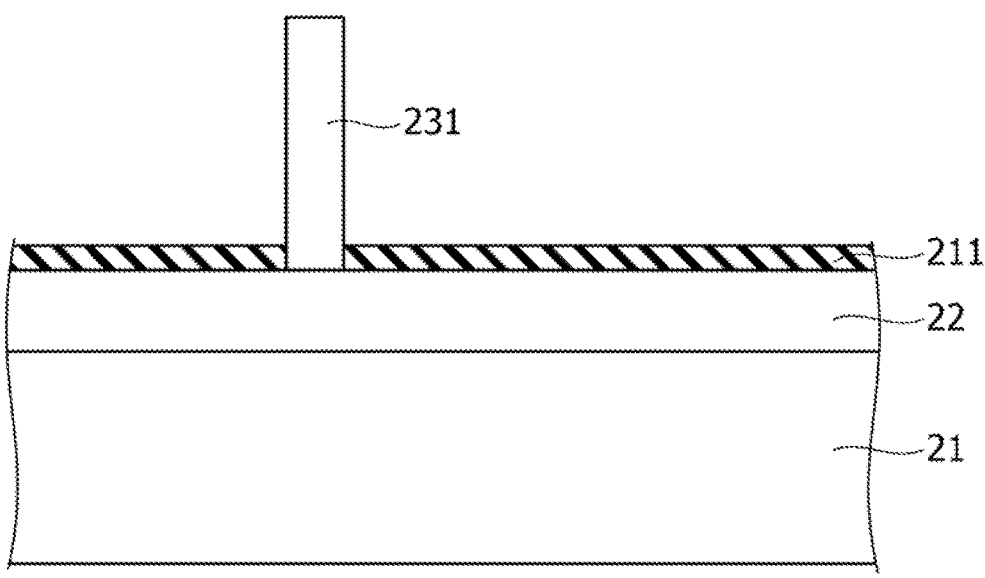

In FIG. 14C, an n-InAs nanowire is grown as the n-type semiconductor 231 inside the opening 212 according to an MOCVD method.

Figure 14D:
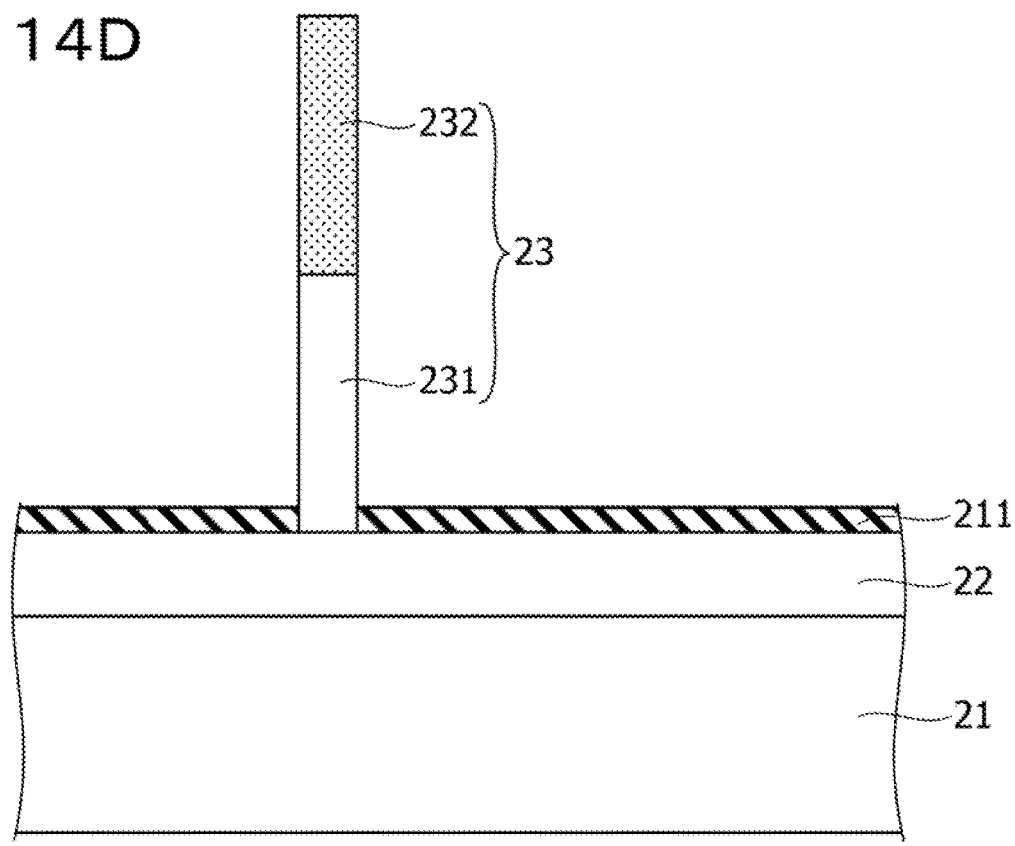

In FIG. 14D, a p-GaAsSb nanowire is grown as the p-type semiconductor 232 to follow the n-InAs nanowire, and thus the nanowire 23 including the pn junction is formed. The nanowire 23 of n-InAs/p-GaAsSb operates as a backward diode.

Figure 14E:
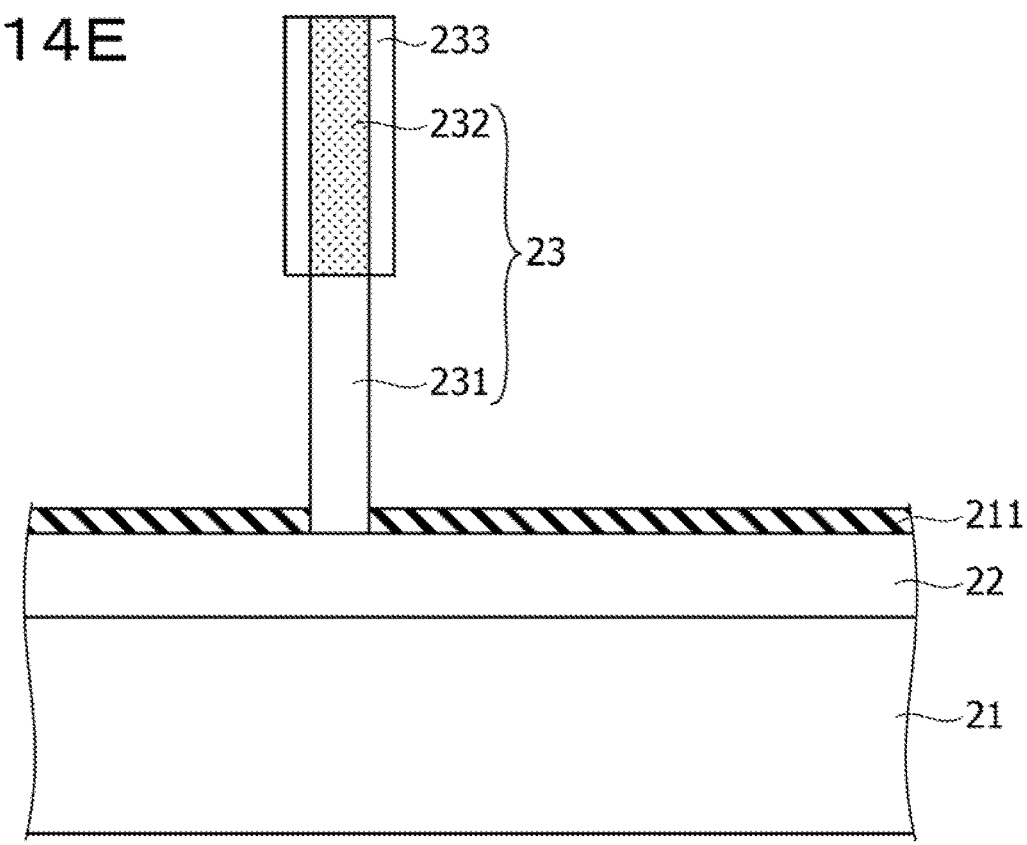

In FIG. 14E, a growth mode is changed, and an n-InAs nano-shell or thin film 233 is grown to surround the p-GaAsSb nanowire. A film thickness and a doped impurity concentration of the n-InAs thin film 233 are controlled such that an interface between the p-GaAsSb nanowire and the n-InAs shell is depleted.

Figure 14F:
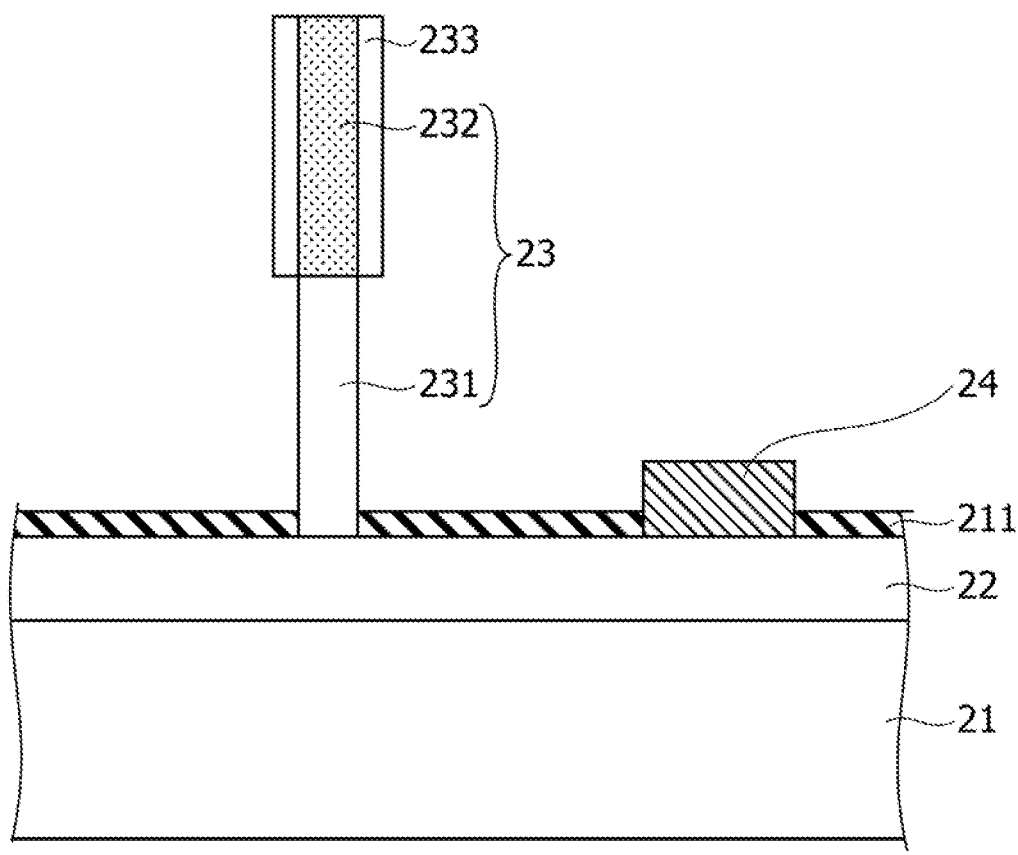

In FIG. 14F, an electrode region is defined according to a photolithography method, and an opening is formed in the insulating film 211 through dry etching. AuGe is deposited and lifted off, and thus the cathode electrode 24 coupled to the semiconductor layer 22 of n$^+$-GaAs is formed.

Figure 14G:
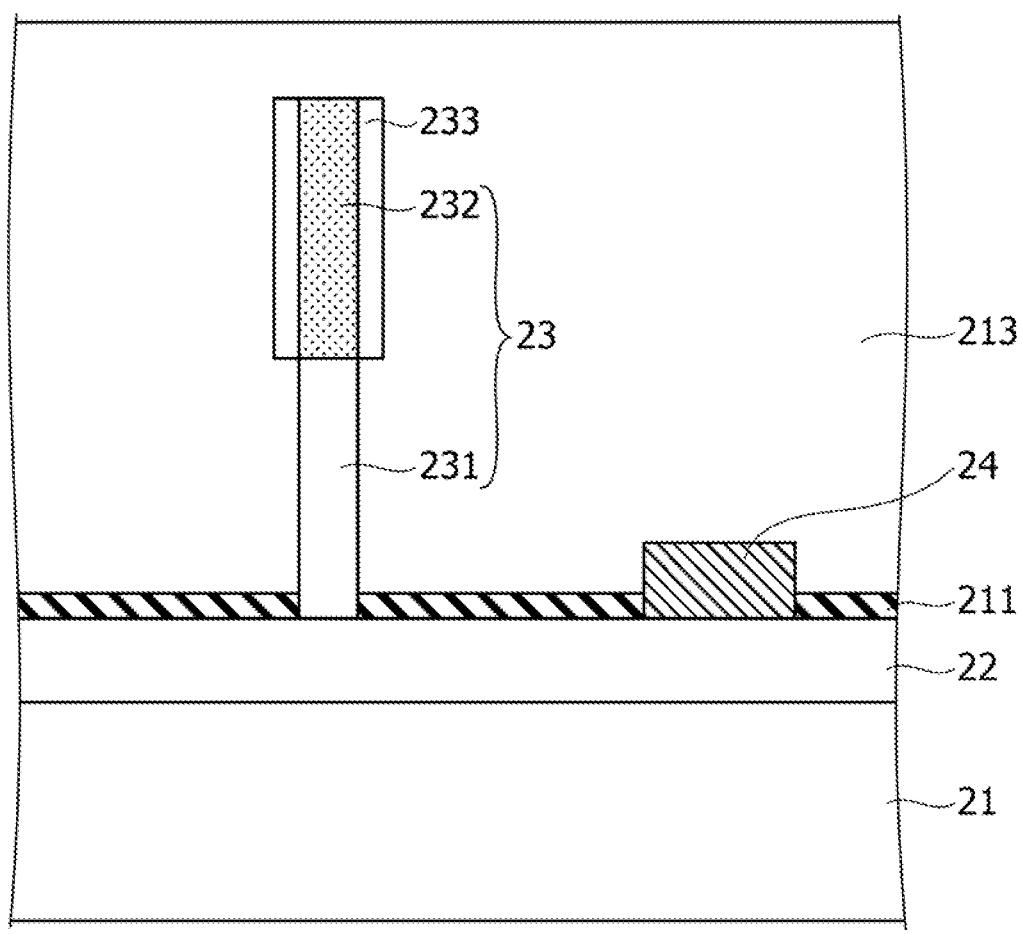

In FIG. 14G, for example, a benzocycobutene (BCB) resin is applied and cured, and thus the interlayer insulating film 213 is formed. The nanowire 23 is completely buried at this moment.

Figure 14H:
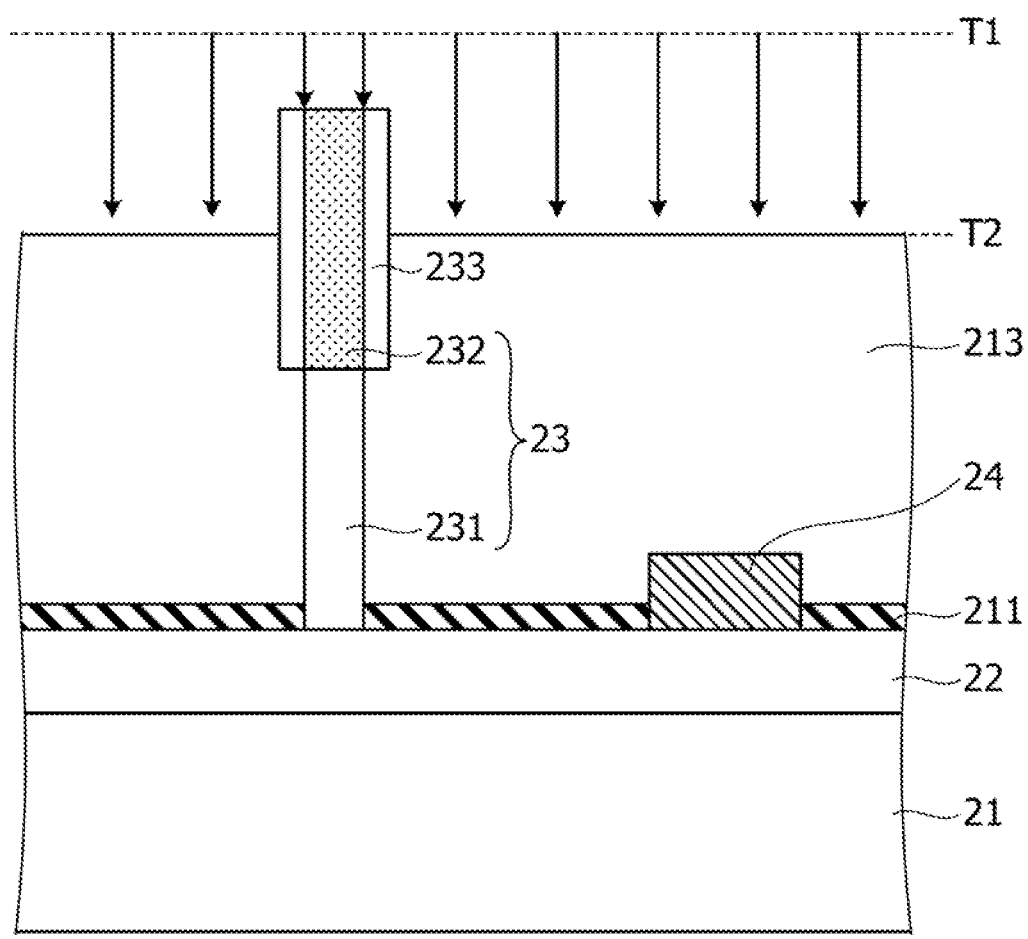

In FIG. 14H, the interlayer insulating film 213 is removed over a predetermined thickness (for example, from T1 to T2) through dry etching such that a part of the p-GaAsSb nanowire as the p-type semiconductor 232 and the n-InAs thin film 233 surrounding the p-GaAsSb nanowire are exposed.

Figure 14I:
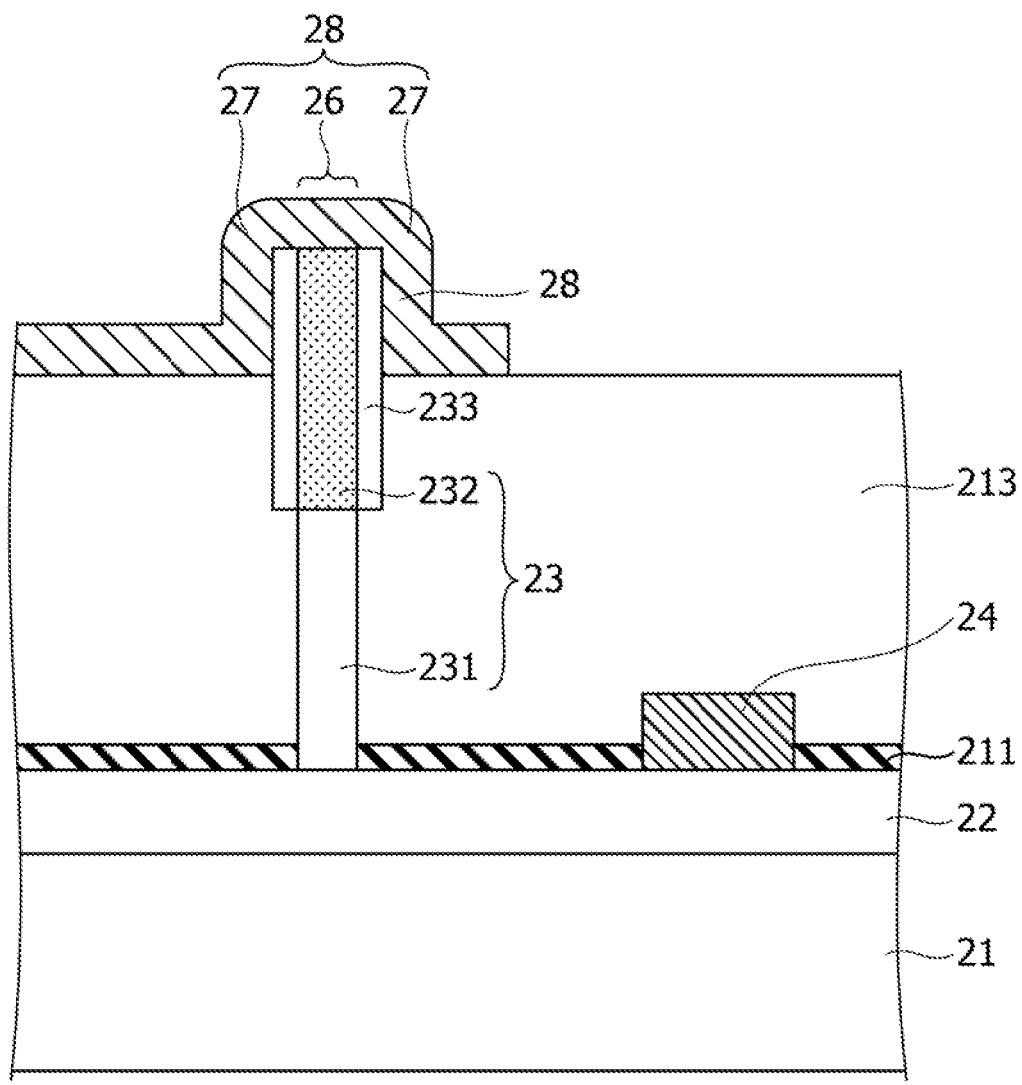

In FIG. 14I, an electrode region is defined according to photolithography, and Pt is deposited and lifted off such that the anode electrode 28 is formed. In the anode electrode 28, a portion in ohmic junction with the tip of the p-type semiconductor 232 becomes the first electrode 26. In the anode electrode 28, a portion in contact with the pn junction over the side surface of the nanowire 23 becomes the second electrode 27. The depletion layer is formed by the pn junction at the interface with the second electrode 27, and the depletion layer may be completely expanded by applying a bias.

Figure 14J:
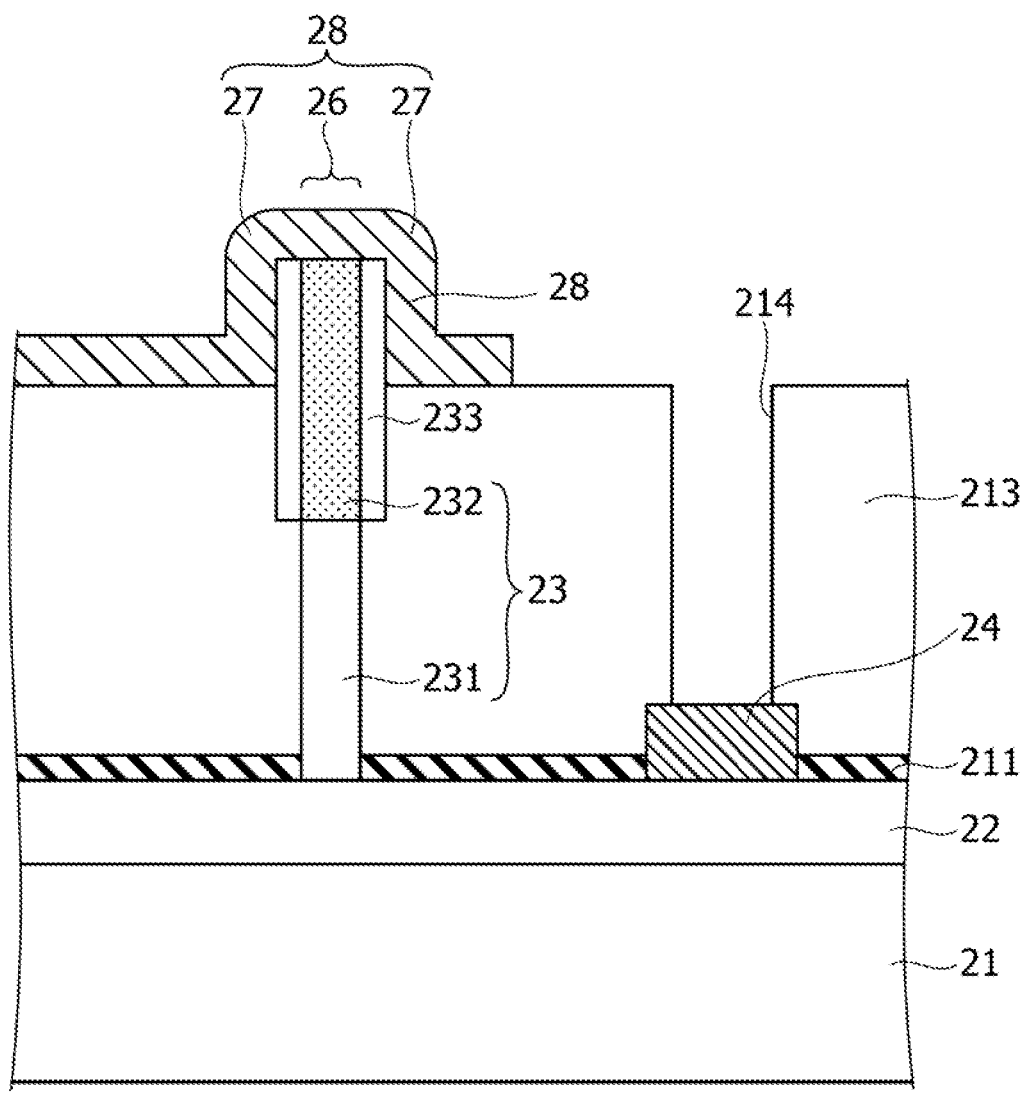

In FIG. 14J, a contact hole region is defined over the interlayer insulating film 213 through photolithography, and an opening 214 to which the cathode electrode 24 is exposed is formed through dry etching.

Figure 14K:
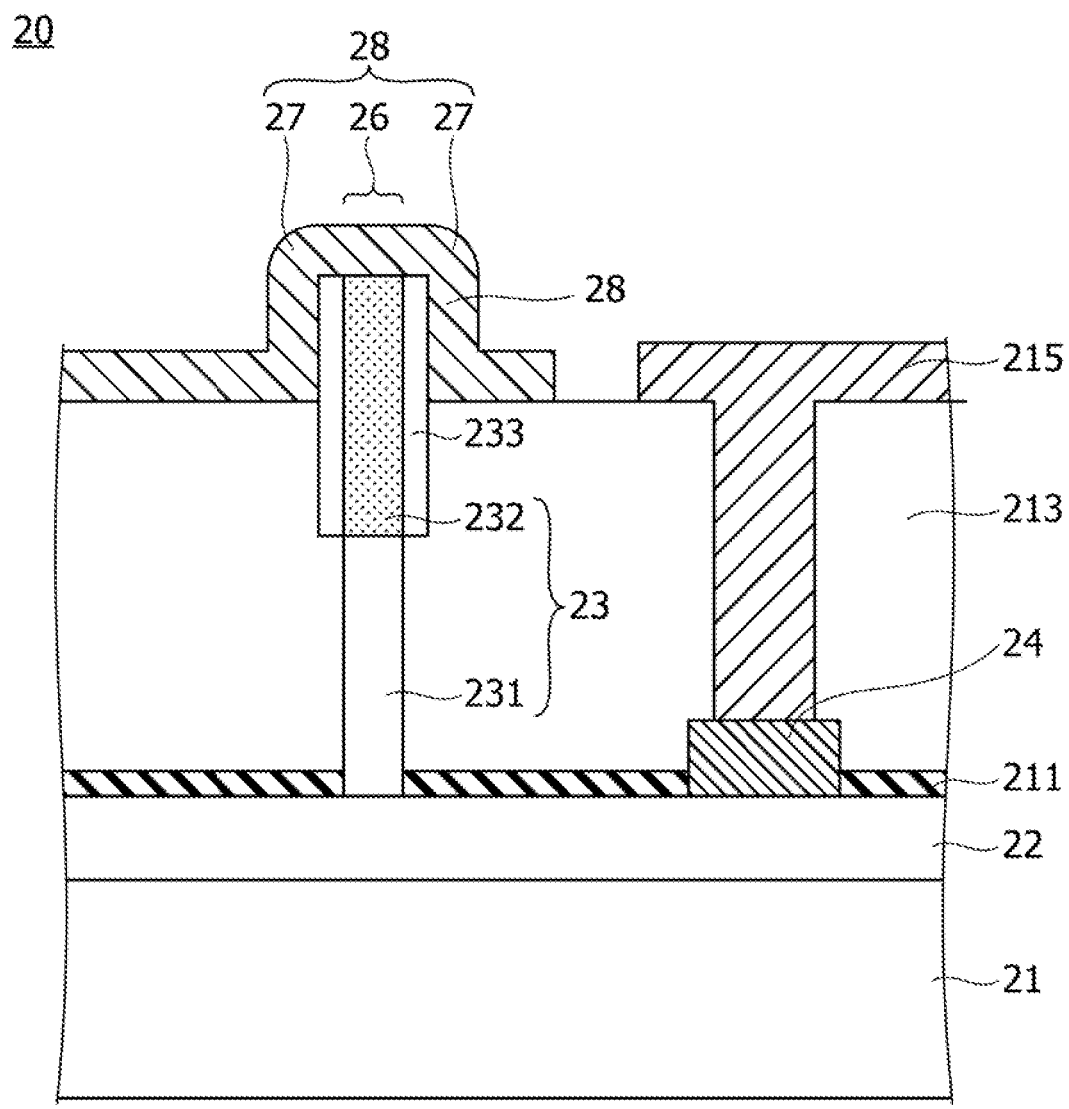

In FIG. 14K, an electrode region is defined through photolithography, and the extraction electrode 215 extracted from the cathode electrode 24 is formed through plating. Consequently, the semiconductor device 20 having a high forward breakdown voltage is formed.

Figure 15:
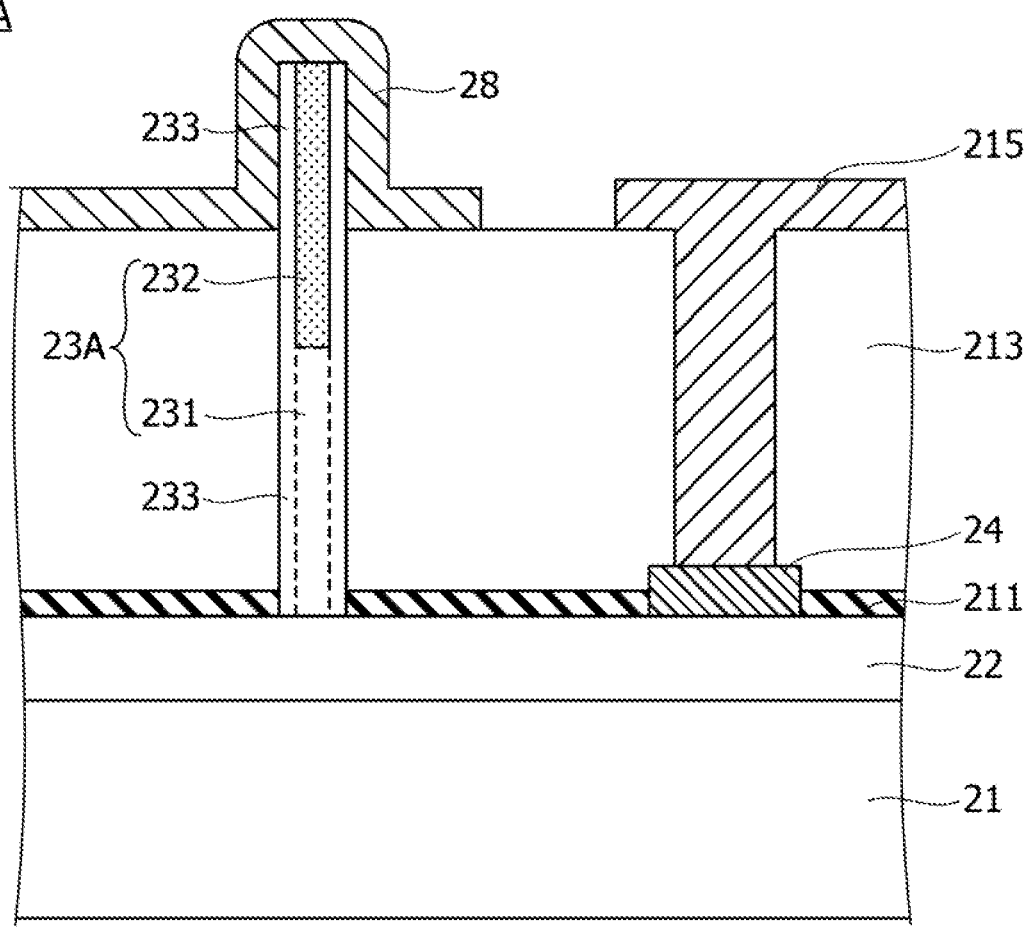
FIG. 15 is a diagram illustrating a modification example of the semiconductor device of the second embodiment.

FIG. 15 is a schematic diagram of a modification example of the second embodiment. In the configuration illustrated in FIG. 13, the thin film 233 of the n-InAs shell is disposed only on the outer periphery of the p-GaAsSb nanowire that is the p-type semiconductor 232. As in a semiconductor device 20A in FIG. 15, the n-InAs thin film 233 may also be provided on the outer periphery of the n-type semiconductor 231 of a nanowire 23A.

In this case, the n-type semiconductor 231 serves as an n-InAs nanowire core, and the thin film 233 serves as an n-InAs shell surrounding the whole of the nanowire 23A. A junction portion between the n-type semiconductor 231 and the p-type semiconductor 232 inside the n-InAs thin film 233 is a backward diode. With this configuration, it is also possible to obtain I-V characteristics in which a forward breakdown voltage is high, and rising of a backward current is steep.

Third Embodiment

Figure 16:
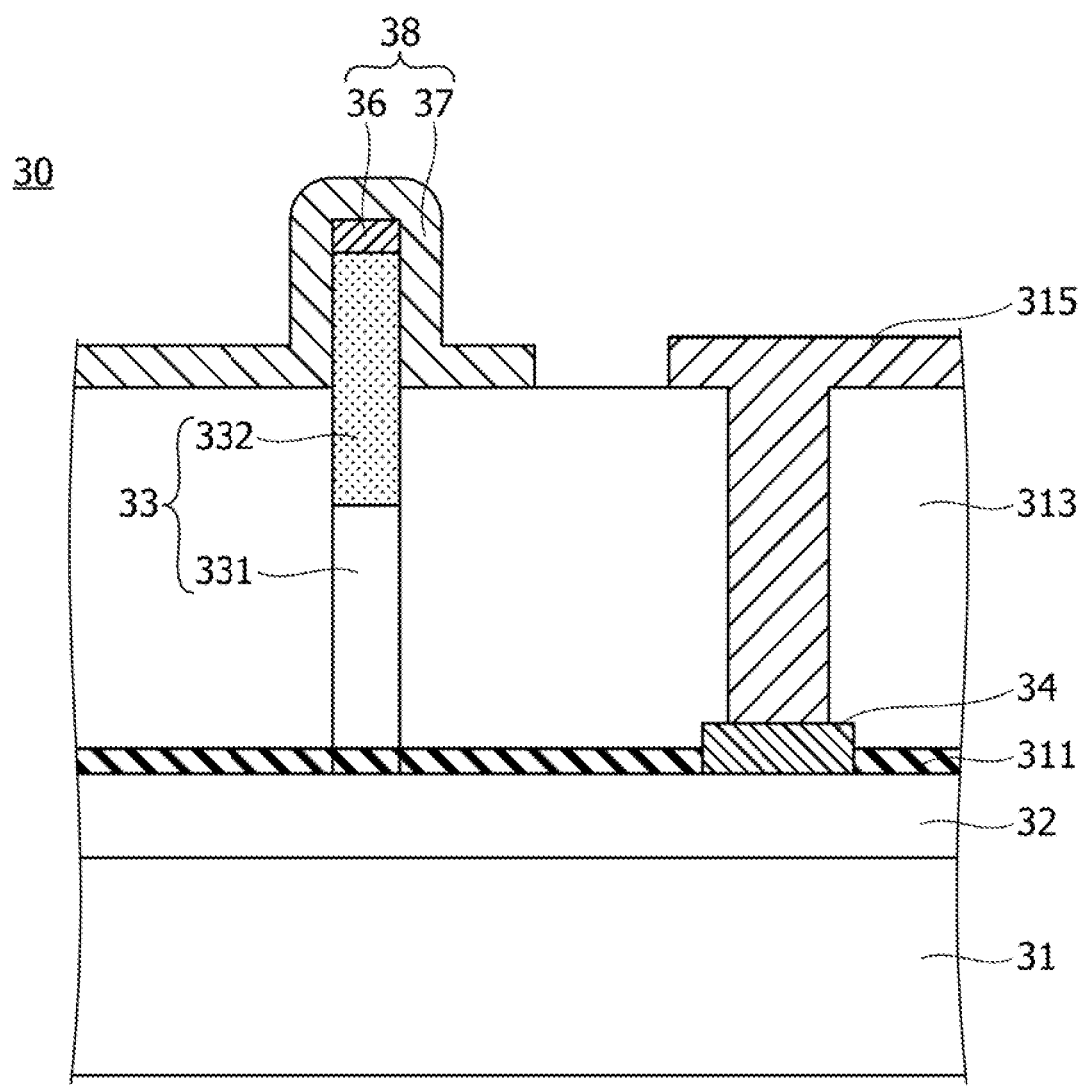
FIG. 16 is a schematic diagram of a semiconductor device of a third embodiment.

FIG. 16 illustrates a configuration example of the semiconductor device 30 to which the principle 3 is applied. In the third embodiment, a Schottky junction is formed over the side surface of the first conductivity type semiconductor of the nanostructure, and thus the anode is depleted. In the example illustrated in FIG. 16, a backward diode of a nanowire is formed with a first conductivity type as a p type and a second conductivity type as an n type.

The n$^+$-type semiconductor layer 32 doped with an n-type impurity at a high concentration, and an insulating film 311 are stacked in this order over the substrate 31. The insulating film 311 is partially removed, and thus the n-type semiconductor 331 and the cathode electrode 34 of the nanostructure are coupled to the n$^+$-type semiconductor layer 32. The p-type semiconductor 332 of the nanostructure is joined to the n-type semiconductor 331 in a long axis direction thereof, and thus the nanowire 33 including a pn junction is formed.

A part of the p-type semiconductor 332 of the nanowire 33 protrudes from an interlayer insulating film 313, and is coupled to the anode electrode 38. The anode electrode 38 includes a first electrode 36 and a second electrode 37. The first electrode 36 is electrically coupled to the second electrode 37. The first electrode 36 is in ohmic junction with the tip of the p-type semiconductor 332. The second electrode 37 forms a Schottky junction over a side surface of the p-type semiconductor 332.

An extraction electrode 315 electrically coupled to the cathode electrode 34 is formed in the interlayer insulating film 313. A current, an electrical signal, or a voltage is applied to the cathode electrode 34 via the extraction electrode 315.

When a forward bias is applied during an operation, as described with reference to FIG. 9, the depletion layer is expanded toward the center of the p-type semiconductor 332, and thus flowing of a hole is suppressed. Consequently, the forward breakdown voltage is improved. When a backward bias is applied, the depletion layer is reduced in a diameter direction of the nanowire, and thus the hole flows into the first electrode 36.

An operation of the backward diode is the same as described in the first embodiment. An impurity concentration of the p-type semiconductor 332 of the nanowire 33 is set to $1 \times 10^{18}$ cm$^{-3}$ or more. Even at the high impurity concentration, the depletion layer may be expanded in the direction intersecting flowing of carriers due to the Schottky junction formed over the sidewall of the nanowire 33.

With the configuration illustrated in FIG. 16, in the same manner as the configuration illustrated in FIG. 11, it is possible to obtain backward diode characteristics in which nonlinearity around a zero bias is high.

FIGS. 17A to 17L are manufacturing process diagrams of the semiconductor device 30 of the third embodiment. Materials used in processes described below are only examples, and are not intended to limit the present invention.

Figure 17A:
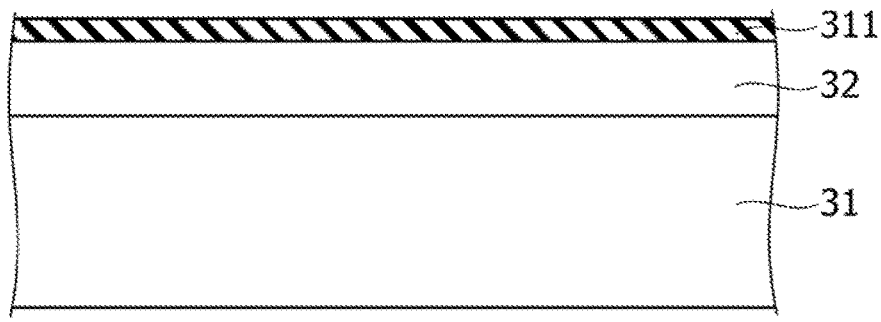
FIG. 17A is a manufacturing process diagram of the semiconductor device of the third embodiment.

In FIG. 17A, the semiconductor layer 32 of n$^+$-GaAs doped with an n-type impurity at a high concentration is grown to have a thickness of 200 nm over the substrate 31 of semi-insulating GaAs(111)B. The n-type impurity concentration is, for example, $1 \times 10^9$ cm$^3$. The insulating film 311 such as SiN or SiO$_2$ is deposited to have a thickness of about 50 nm over the semiconductor layer 32 of n$^+$-GaAs.

Figure 17B:
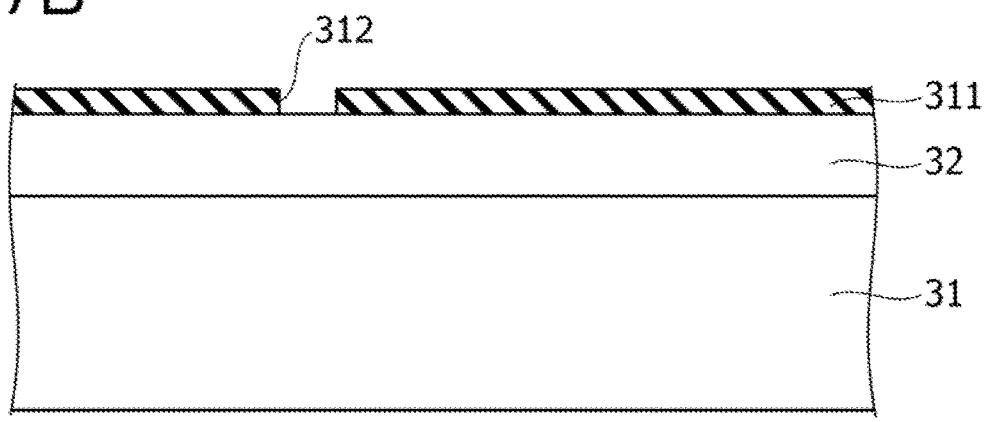
FIG. 17B is a manufacturing process diagram of the semiconductor device of the third embodiment.

In FIG. 17B, a resist mask having a predetermined opening pattern is formed by using electron beam (EB) lithography, and an opening 312 is formed in the insulating film 311 through fluorine-based dry etching. In this case, for example, Au may be deposited and lifted off such that an Au catalyst is formed in the opening 312.

Figure 17C:
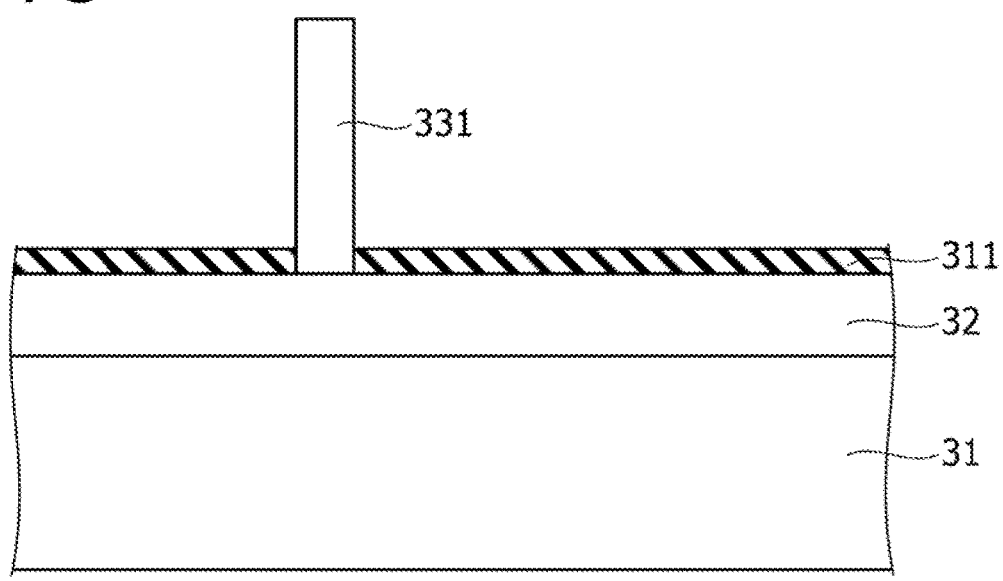
FIG. 17C is a manufacturing process diagram of the semiconductor device of the third embodiment.

In FIG. 17C, an n-InAs nanowire is grown as the n-type semiconductor 331 inside the opening 312 according to an MOCVD method.

Figure 17D:
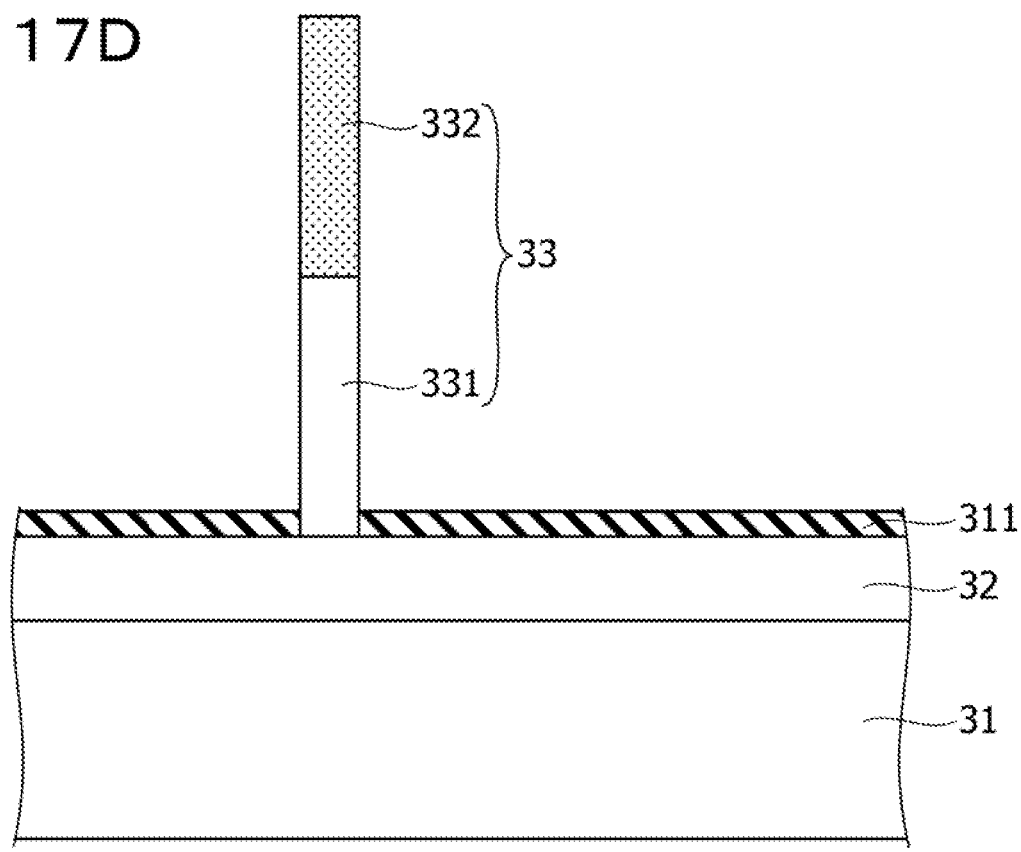
FIG. 17D is a manufacturing process diagram of the semiconductor device of the third embodiment.

In FIG. 17D, a p-GaAsSb nanowire is grown as the p-type semiconductor 332 to follow the n-InAs nanowire, and thus the nanowire 33 including the pn junction is formed. The nanowire 33 of n-InAs/p-GaAsSb operates as a backward diode.

Figure 17E:
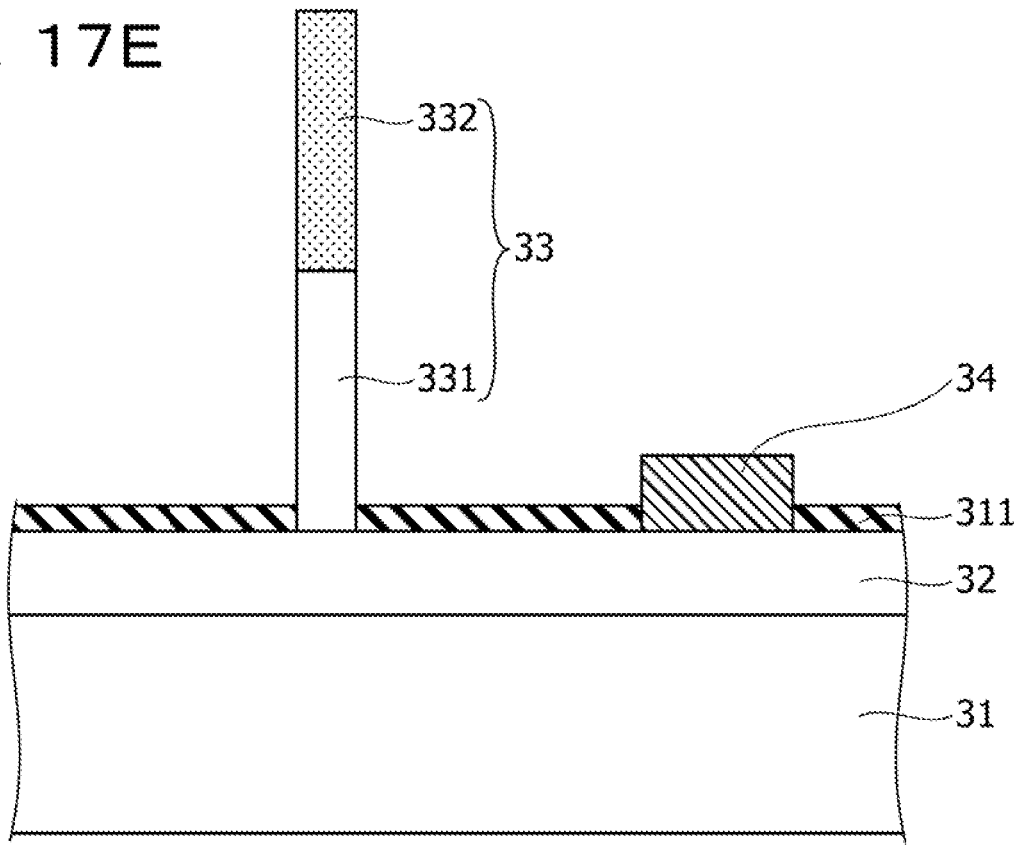
FIG. 17E is a manufacturing process diagram of the semiconductor device of the third embodiment.

In FIG. 17E, an electrode region is defined according to a photolithography method, and an opening is formed in the insulating film 311 through dry etching. AuGe is deposited and lifted off, and thus the cathode electrode 34 coupled to the semiconductor layer 32 of n$^+$-GaAs is formed.

Figure 17F:
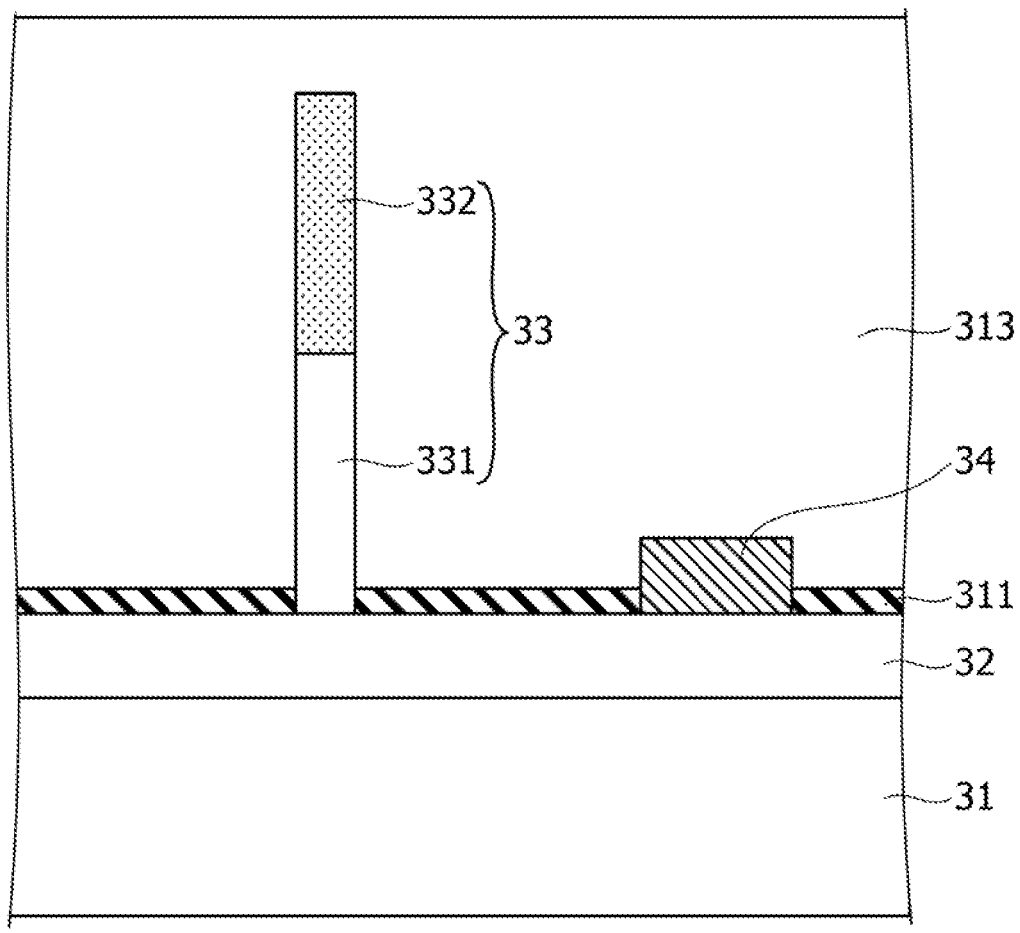
FIG. 17F is a manufacturing process diagram of the semiconductor device of the third embodiment.

In FIG. 17F, for example, a benzocyclobutene (BCB) resin is applied and cured, and thus the interlayer insulating film 313 is formed. The nanowire 33 is completely buried at this moment.

Figure 17G:
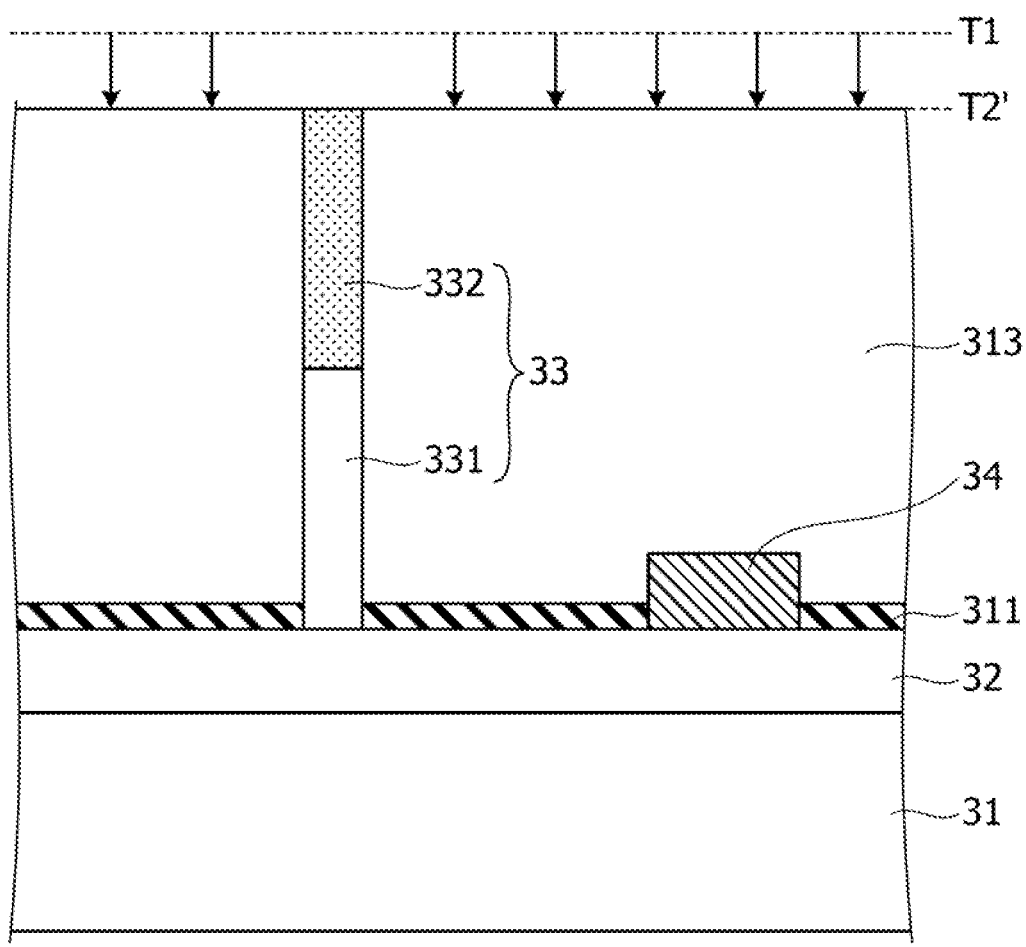
FIG. 17G is a manufacturing process diagram of the semiconductor device of the third embodiment.

In FIG. 17G, the interlayer insulating film 313 is removed over a predetermined thickness (for example, from T1 to T2') through dry etching such that a tip of the p-GaAsSb nanowire as the p-type semiconductor 332 is exposed.

Figure 17H:
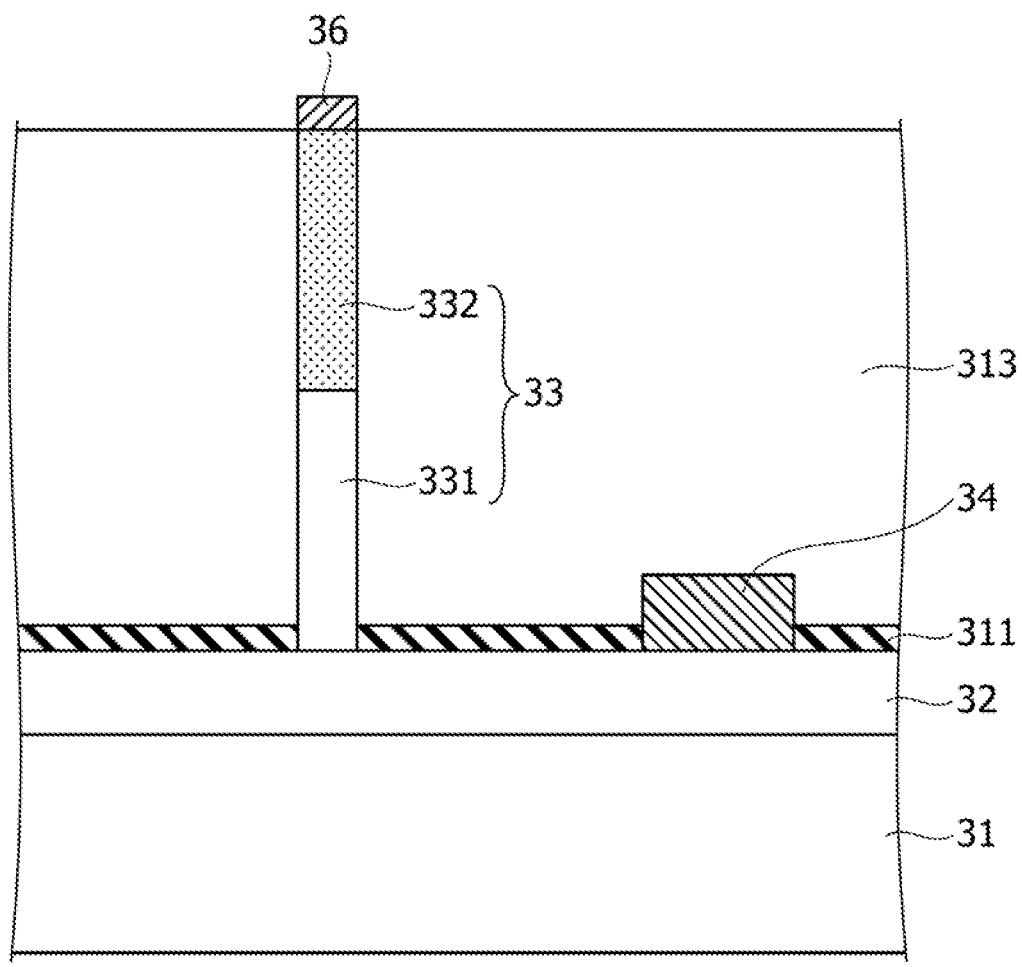
FIG. 17H is a manufacturing process diagram of the semiconductor device of the third embodiment.

In FIG. 17H, an electrode region is defined according to photolithography, and Pt is deposited and lifted off such that the first electrode 36 as an ohmic electrode is formed.

Figure 17I:
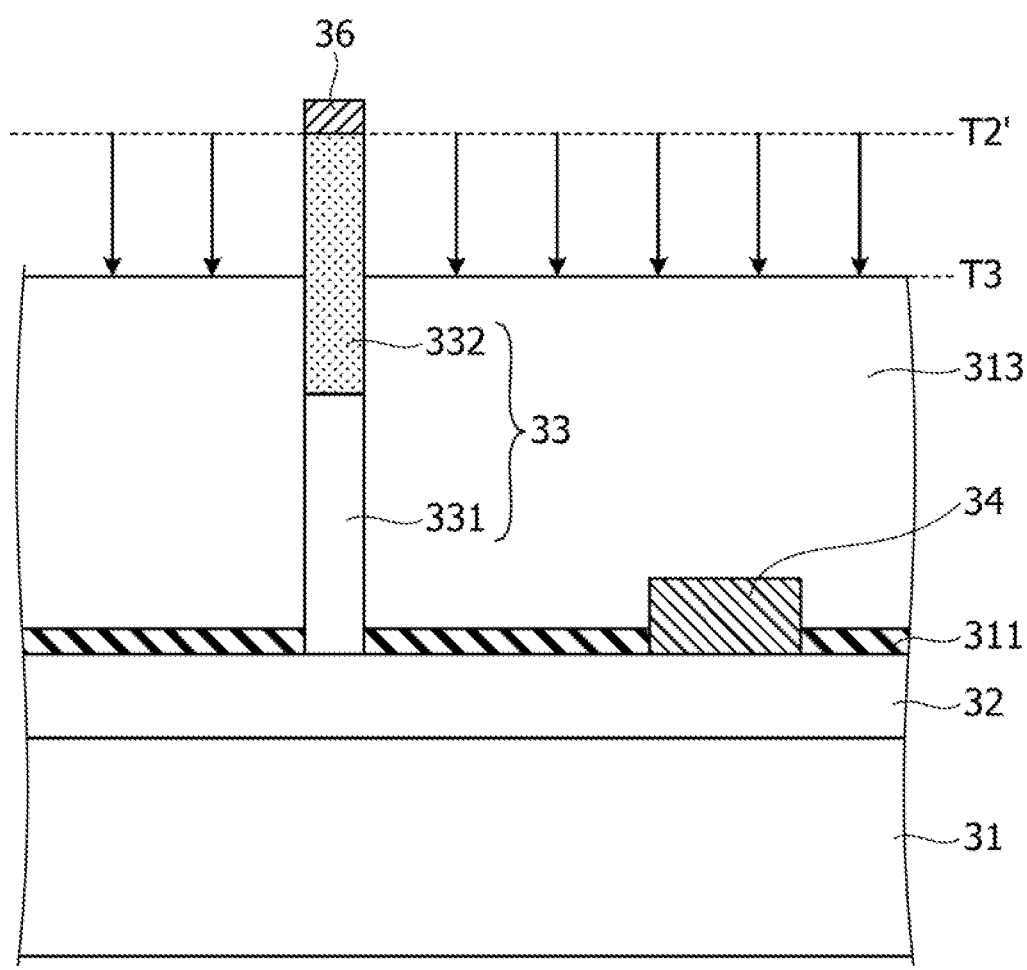
FIG. 17I is a manufacturing process diagram of the semiconductor device of the third embodiment.

In FIG. 17I, the interlayer insulating film 313 is further removed over a predetermined thickness (for example, from T2' to T3) through dry etching such that a part of the p-type semiconductor 332 is exposed.

Figure 17J:
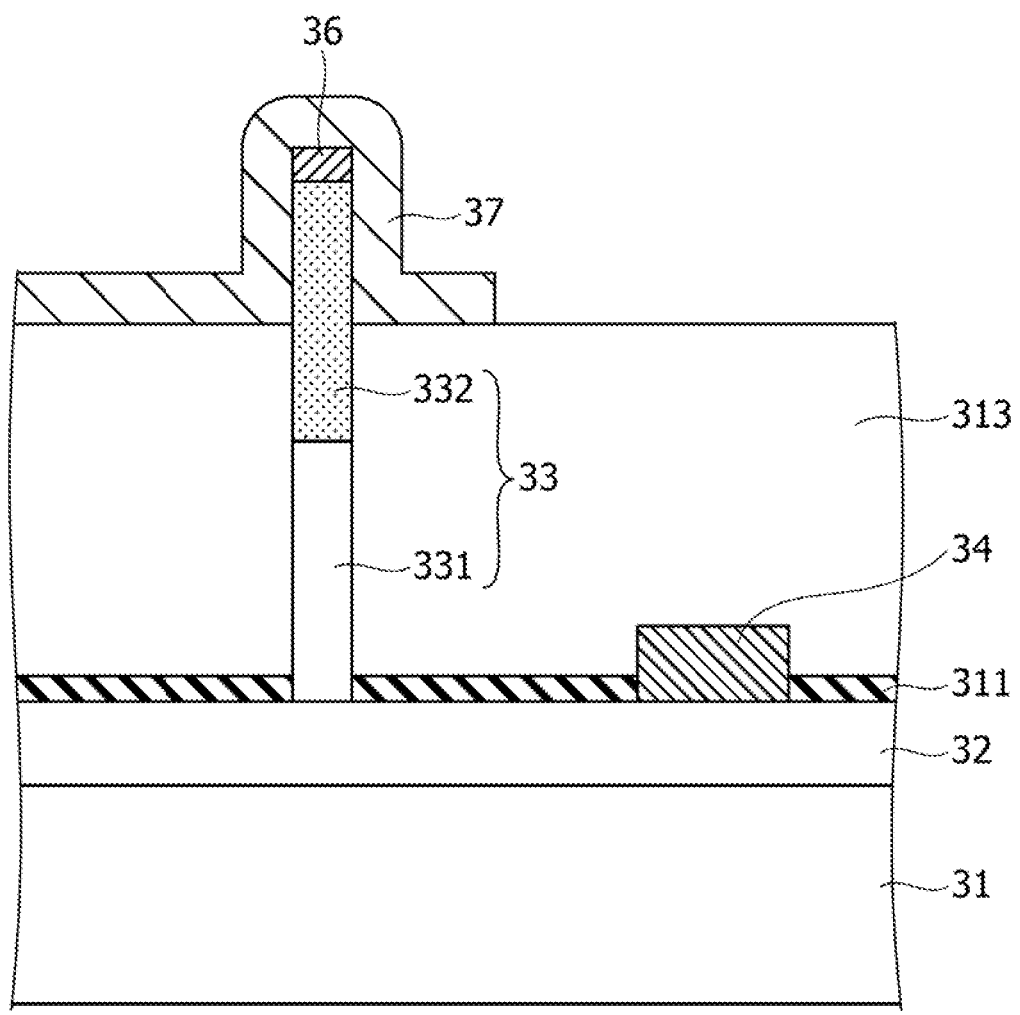
FIG. 17J is a manufacturing process diagram of the semiconductor device of the third embodiment.

In FIG. 17J, an electrode region is defined according to photolithography, and Ti is deposited and lifted off such that the second electrode 37 as a Schottky electrode is formed over a side surface of the p-type semiconductor 332. The second electrode 37 is electrically coupled to the first electrode. The depletion layer is formed by the Schottky junction between the p-type semiconductor 332 and the second electrode 37 at the interface with the p-type semiconductor 332, and the depletion layer may be completely expanded by applying a bias.

Figure 17K:
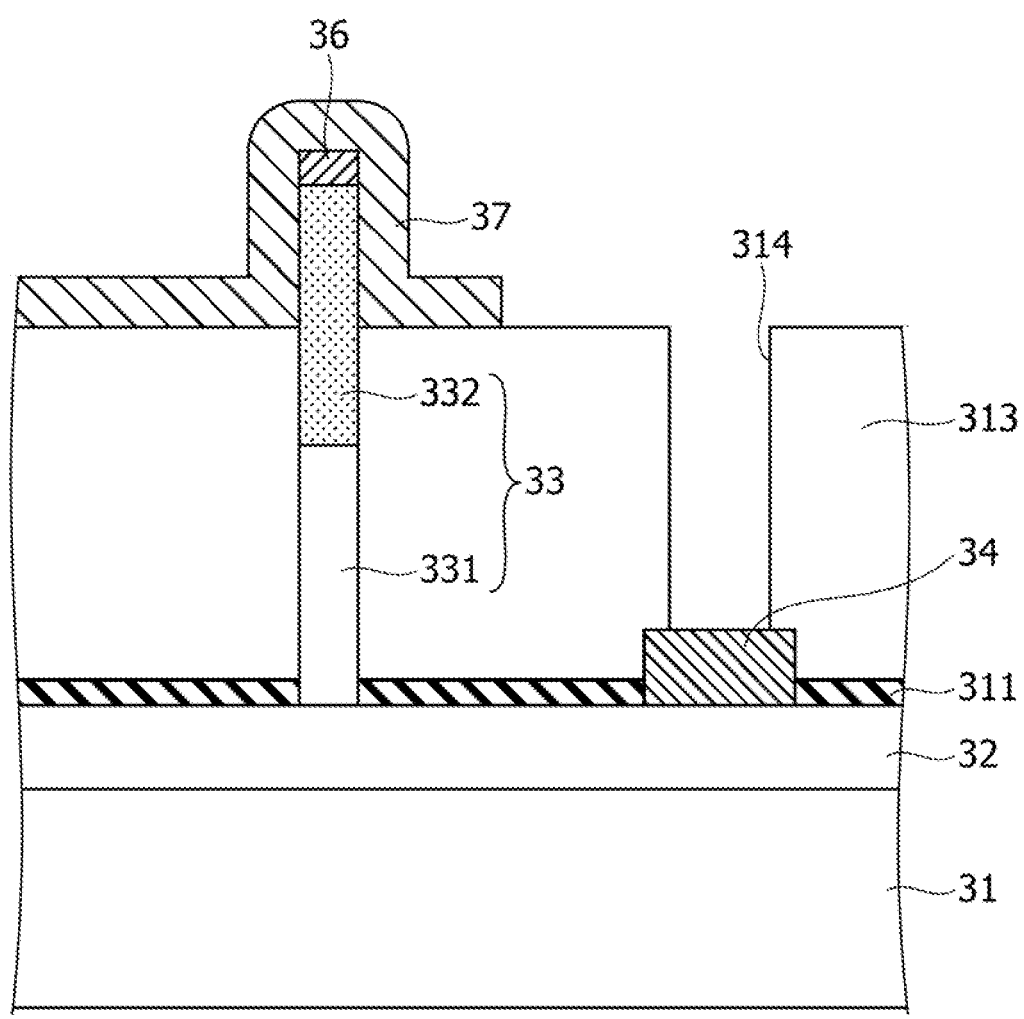
FIG. 17K is a manufacturing process diagram of the semiconductor device of the third embodiment.

In FIG. 17K, a contact hole region is defined over the interlayer insulating film 313 through photolithography, and an opening 314 to which the cathode electrode 34 is exposed is formed through dry etching.

Figure 17L:
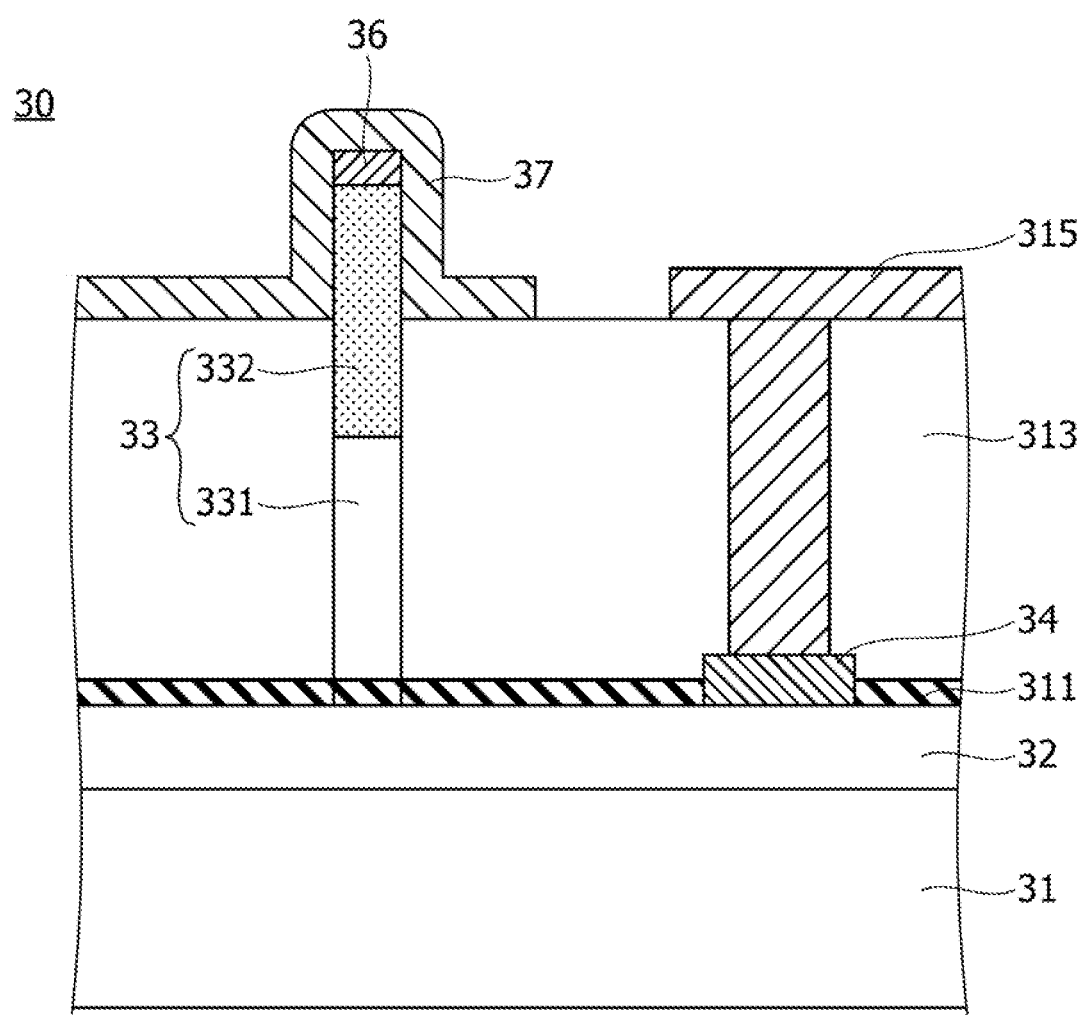
FIG. 17L is a manufacturing process diagram of the semiconductor device of the third embodiment.

In FIG. 17L, an electrode region is defined through photolithography, and the extraction electrode 315 extracted from the cathode electrode 34 is formed through plating. Consequently, the semiconductor device 30 having a high forward breakdown voltage is formed.

Figure 18:
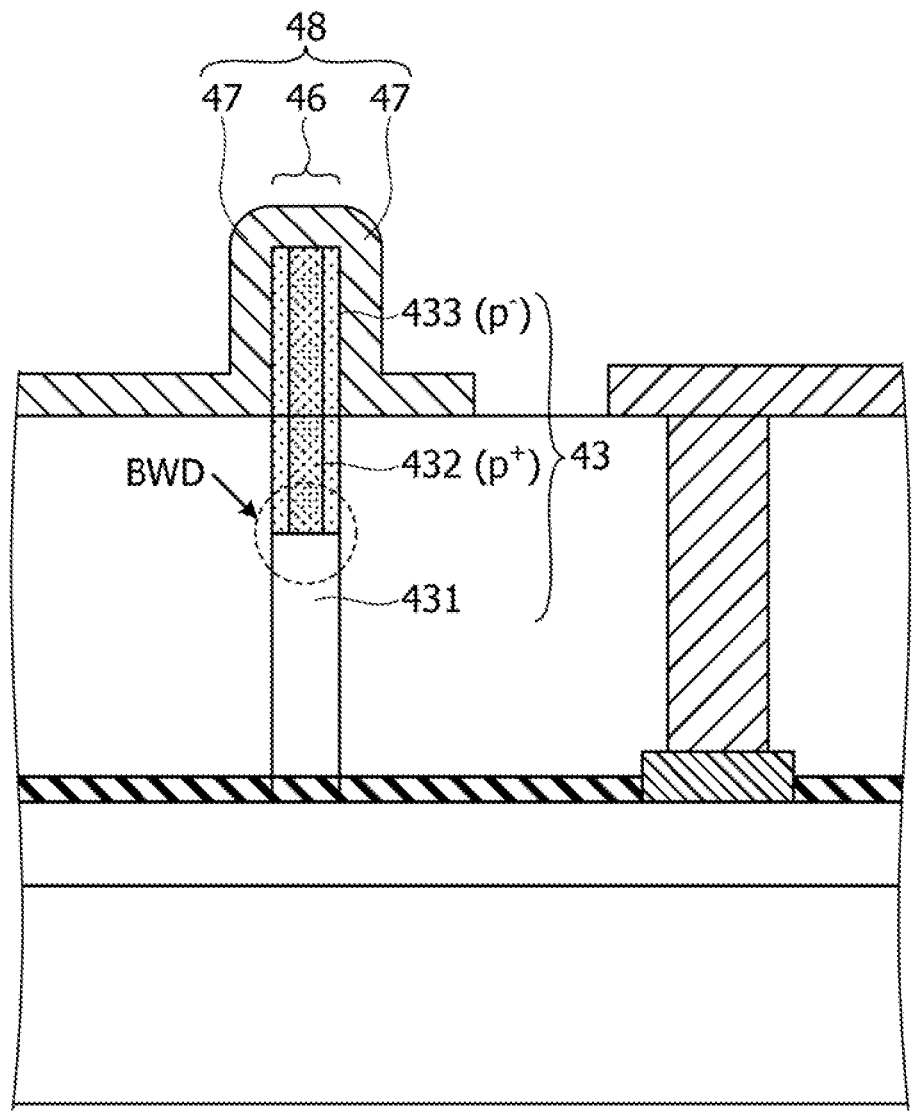
FIG. 18 is a diagram illustrating a modification example of the semiconductor device of the third embodiment.

FIG. 18 illustrates a semiconductor device 40 according to a modification example of the third embodiment. In a case where a width of a depletion layer is controlled by using a Schottky junction, a width of the depletion layer is expanded to the center of a nanowire 43 as much as possible, and thus a breakdown voltage of a Schottky device is improved. In order to realize this, an impurity concentration of the nanowire 43 is varied in a core and a shell surrounding the core.

For example, a core 432 of a p-type semiconductor made of p-GaAsSb has an acceptor concentration of $1 \times 10^{19}$ cm$^3$, and is in ohmic junction with a first electrode 56 of Pt. A shell 433 that is a semiconductor film of an outer circumferential portion of the p-type semiconductor has an acceptor concentration of $1 \times 10^{18}$ cm$^{-3}$, and is in Schottky junction with a second electrode 47 of Pt. The first electrode 46 and the second electrode 47 are successively formed to become an anode electrode 48.

In this structure, depletion easily occurs in the shell 433 having a low impurity concentration, and a Schottky breakdown voltage is improved. On the other hand, an impurity concentration of the core 432 of the p-type semiconductor is high, and thus an ohmic junction of Pt may be obtained at a tip of the nanowire 43.

A backward diode (BWD) is formed by a pn junction between an n-type semiconductor 431 and the core 432 of the p-type semiconductor in the nanowire 43, and, as illustrated in FIG. 11, nonlinearity around a zero bias is high as I-V characteristics thereof.

Figure 19:
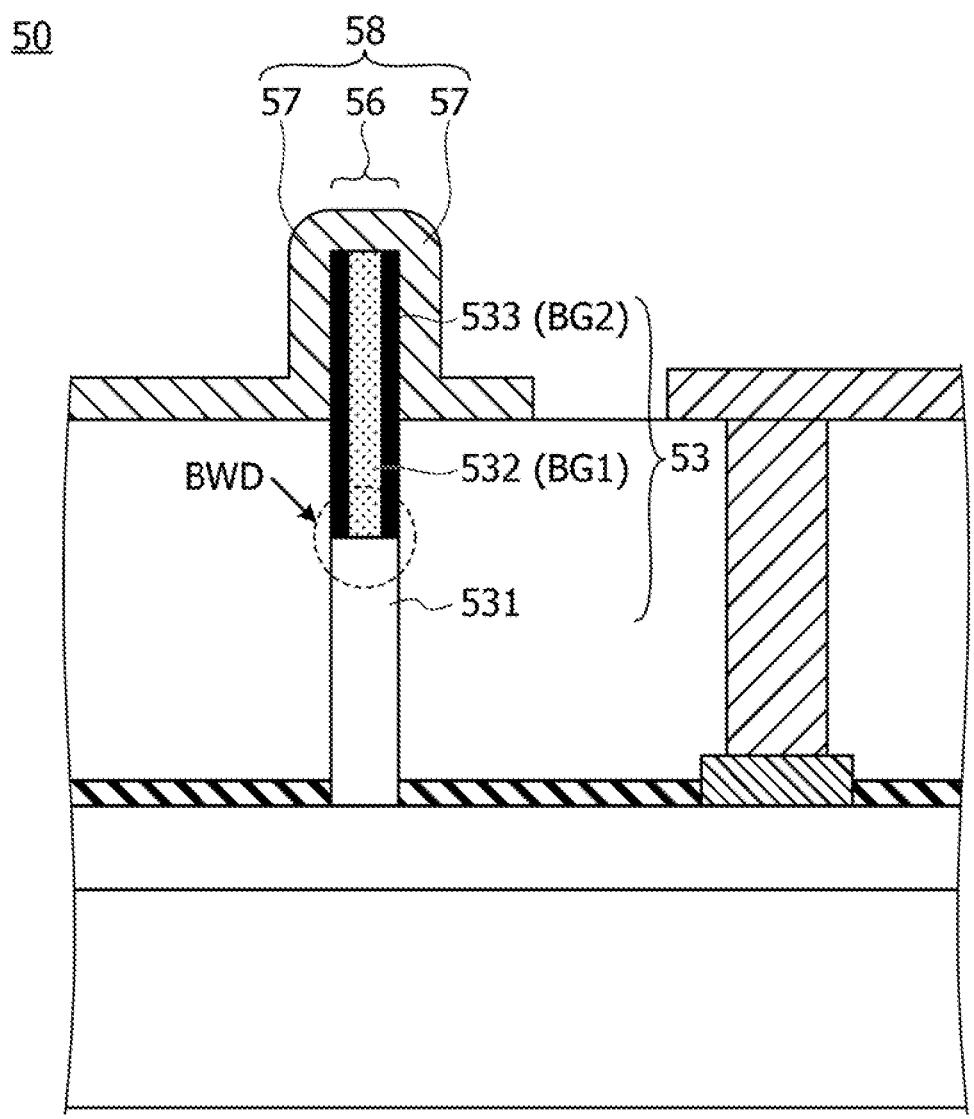
FIG. 19 is a diagram illustrating another modification example of the semiconductor device of the third embodiment.

FIG. 19 illustrates a semiconductor device 50 according to another modification example of the third embodiment. In the semiconductor device 50, a bandgap (BG) is varied between a core 532 and a shell 533 of a p-type semiconductor in order to improve a breakdown voltage of a Schottky device by expanding a width of a depletion layer to the center of a nanowire 53 as much as possible.

When a bandgap of the core 532 of the p-type semiconductor is indicated by BG1, and a bandgap of the shell 533 is indicated by BG2, a material is selected such that BG2>BG1. For example, the core 532 of the p-type semiconductor is made of p-GaAsSb, and the shell 533 is made of p-AlGaAsSb having a larger bandgap than that of p-GaAsSb.

A first electrode 56 that is an ohmic electrode is coupled to the core 532, and a second electrode 57 that is a Schottky electrode is provided at the shell 533. The first electrode 56 and the second electrode 57 are electrically coupled to each other to become an anode electrode 58. The bandgap of the shell 533 is large such that a height of a barrier is increased, and thus Schottky characteristics are improved. It becomes easier to control a depletion layer directed toward a central portion of the nanowire 53.

A backward diode (BWD) is formed by a pn junction between an n-type semiconductor 531 and the core 532 of the p-type semiconductor in the nanowire 53, and, as illustrated in FIG. 11, nonlinearity around a zero bias is high as I-V characteristics thereof.

Other Configuration Examples

FIG. 20 (i.e., FIGS. 20A, 20B, and 20C) illustrates examples of a nanostructure. A nanostructure used for the semiconductor device of the embodiment is not limited to a nanowire. FIG. 20A illustrates a columnar nano-rod 63A. An electrode 68A is provided at one conductivity type end part of the nano-rod 63A. The electrode 68A includes a first electrode 66A that is in ohmic junction with a tip surface of the nano-rod 63A and a second electrode 67A that is in MIS junction, pn junction, or Schottky junction with a side surface of the nano-rod 63A.

FIG. 20B illustrates a prism-shaped nano-rod 63B. The prism is not limited to a tetragonal prism, and includes polygonal prisms such as a hexagonal prism and an octagonal prism. An electrode 68B is provided at one conductivity type end part of the nano-rod 63B. The electrode 68B includes a first electrode 66B that is in ohmic junction with a tip surface of the nano-rod 63B and a second electrode 67B that is in MIS junction, pn junction, or Schottky junction with a side surface of the nano-rod 63B.

FIG. 20C illustrates a nano-fin 63C (may be referred to as "nano-pin"). In the nano-fin 63C, carriers flow in parallel to a height direction (z direction) of the nano-fin. When a forward bias is applied, a depletion layer is expanded in a thickness direction (x direction) of the nano-fin, and thus suppresses flowing of the carriers. An electrode 68C is provided at a tip of the nano-fin 63C. The electrode 68C includes a first electrode 66C that is in ohmic junction with an upper end surface of the nano-fin 63C and a second electrode 67C that is in MIS junction, pn junction, or Schottky junction with a side surface of the nano-fin 63C.

All of the nanostructures in FIGS. 20A, 20B, and 20C are fine structures that may suppress flowing of carriers by expanding a depletion layer.

Figure 21:
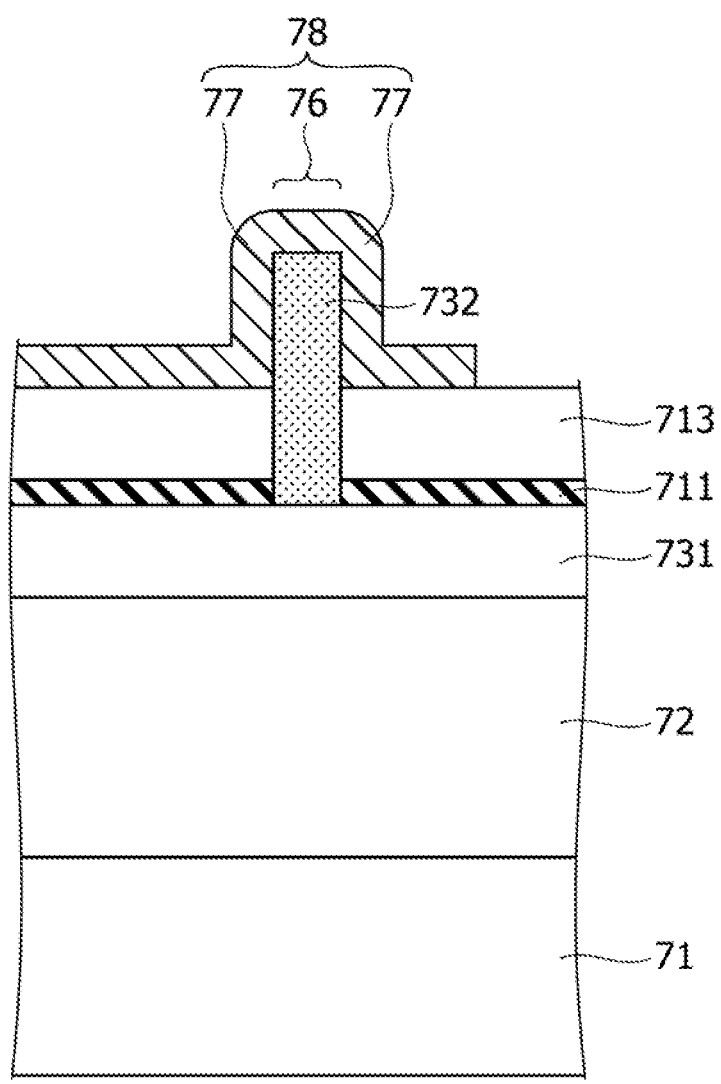
FIG. 21 is a diagram illustrating a modification example of a semiconductor device.

FIG. 21 is a schematic diagram of a semiconductor device 70. In the above-described configuration examples, a nanowire of an n-type conductor and a nanowire of a p-type conductor are joined to each other, but only an upper semiconductor in a stacking direction may be used as a nanostructure.

For example, a semiconductor layer 72 of n+-GaAs and a semiconductor layer 731 of n-InGaAs are grown in this order over a substrate 71 of semi-insulating GaAs(111)B. A nanostructure 732 of p-GaAsSb is coupled to the n-type semiconductor 731 of n-InGaAs via an opening of an insulating film 711, to form a pn junction. The nanostructure 732 is, for example, a nano-fin. In FIG. 21, the nano-fin extends in a depth direction of the drawing surface. An anode electrode 78 of Pt coupled to the p-type nanostructure 732 is provided over an interlayer insulating film 713. In the anode electrode 78, a portion coupled to an upper surface of the nano-fin is a first electrode 76.

When the first principle is used, an insulating film is inserted into an interface between a side surface of the nano-fin of the p-type semiconductor and the anode electrode 78 of Pt. When the second principle is used, an n-type semiconductor thin film is inserted into the interface between the side surface of the nano-fin of the p-type semiconductor and the anode electrode 78 of Pt, and thus a pn junction is formed. When the third principle is used, for example, the first electrode 76 is made of Pt, the second electrode 77 over the nano-fin side surface is made of Ti, and thus a Schottky junction is formed.

An impurity concentration in the interface between the side surface of the nano-fin of the p-type semiconductor and the anode electrode 78 may be lower than an impurity concentration of the nano-fin main body (refer to FIG. 18). Alternatively, a film having a larger energy bandgap than that of the nano-fin main body may be inserted into the interface between the side surface of the nano-fin of the p-type semiconductor and the anode electrode 78 (refer to FIG. 19).

The semiconductor device 70 also functions as a backward diode, but, since only the p-type semiconductor is formed of the nanostructure 732, and the n-type semiconductor 731 forms a layer, a mechanically stable configuration is obtained.

Figure 22:
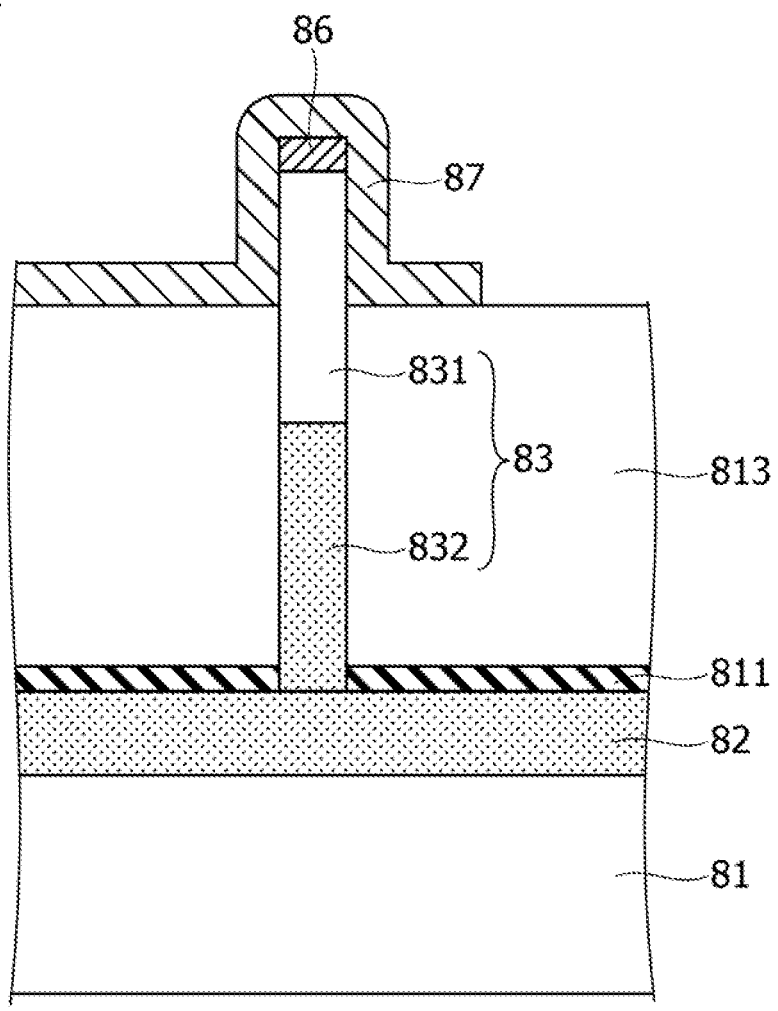
FIG. 22 is a diagram illustrating another modification example of the semiconductor device.

FIG. 22 is a schematic diagram of a semiconductor device 80. In the above-described examples, an upper part of a nanostructure is of a p type and a lower part thereof is of an n type in the stacking direction, but the p type and the n type may be reserve to each other. For example, a semiconductor layer 82 of p+-GaAs is disposed over a substrate 81 of semi-insulating GaAs(111)B, and a nanowire of a p-type semiconductor 832 such as p-GaAsSb is coupled to the semiconductor layer 82 via an opening of an insulating film 811. An upper end of the p-type semiconductor 832 is coupled to a nanowire of an n-type semiconductor 831 such as n-InAs such that a pn junction is formed. A nanowire 83 is formed by the p-type semiconductor 832 and the n-type semiconductor 831. A part of the nanowire 83 protrudes from an interlayer insulating film 813.

An upper end of the n-type semiconductor 831 of the nanowire 83 is in ohmic junction with a first electrode 86 of, for example, Ti. A side surface of the n-type semiconductor 831 of the nanowire 83 is in Schottky junction with a second electrode 87 of, for example, Pt.

When a forward bias is applied to the device, a depletion layer is expanded from a Schottky interface toward the center of the n-type semiconductor 831 such that flowing of an electron is blocked, and thus a forward breakdown voltage is improved. When a backward bias is applied, an expansion layer is reduced, and thus the electron flows. The n-type semiconductor 831 is doped with an impurity at a concentration of $1 \times 10^{18}$ cm$^{-3}$ or more, and thus an electron directly tunnels through a potential barrier of the interface with the p-type semiconductor 832. Consequently, a current steeply rises at a small backward bias. On the other hand, a depletion layer is expanded toward the center of the nanowire 83 at a forward bias due to the Schottky junction formed over the side surface of the n-type semiconductor 831, and thus a forward breakdown voltage is improved.

<Semiconductor Material and Electrode Material>

As materials of a nanostructure, for example, Si, SiGe, Ge, GaAs, InP, InGaAs, InAs, GaN, InGaN, InN, GaSb, GaAsSb, and AlGaSb may be used.

In order to provide an ohmic junction, and a Schottky junction for controlling a depletion layer, at a nanostructure, an electrode material is appropriately selected. Whether junction between a semiconductor and a metal is ohmic junction or Schottky junction is determined depending on a work function, electron affinity, an interface level, or the like.

When the first conductivity type semiconductor is p-GaAs, Pt, AuZn, or Au may be used as a metal subjected to ohmic junction, and Ag or Hf may be used as a metal subjected to Schottky junction.

When the first conductivity type semiconductor is n-GaAs, Ti, AuGe, or Cr may be used as a metal subjected to ohmic junction, and Al, Au, Pt, Ta, or W may be used as a metal subjected to Schottky junction.

When the first conductivity type semiconductor is p-Si, Au or Mo may be used as a metal subjected to ohmic junction, and Ti may be used as a metal subjected to Schottky junction.

When the first conductivity type semiconductor is n-Si, Ti or Mg may be used as a metal subjected to ohmic junction, and Al, Au, Pt, Ta, or W may be used as a metal subjected to Schottky junction.

When the first conductivity type semiconductor is p-GaAsSb, Ni, Pd, or Pt may be used as a metal subjected to ohmic junction, and Ti may be used as a metal subjected to Schottky junction.

When the first conductivity type semiconductor is n-GaAsSb, Ti may be used as a metal subjected to ohmic junction, and Pt may be used as a metal subjected to Schottky junction.

When the first conductivity type semiconductor is p-GaN, Ni, Pd, or Pt may be used as a metal subjected to ohmic junction, and Ti or Al may be used as a metal subjected to Schottky junction.

When the first conductivity type semiconductor is n-GaN, Ti, Al, or Cr may be used as a metal subjected to ohmic junction, and Ni, Pd, or Pt may be used as a metal subjected to Schottky junction.

When the first conductivity type semiconductor is a compound containing at least Ga and Sb, a compound containing at least In and As may be used as the second conductivity type semiconductor. For example, when the first conductivity type semiconductor is GaSb, GaAsSb, or AlGaSb, InAs or InGaAs may be used as the second conductivity type semiconductor.

<Characteristic Computation>

Figure 23:
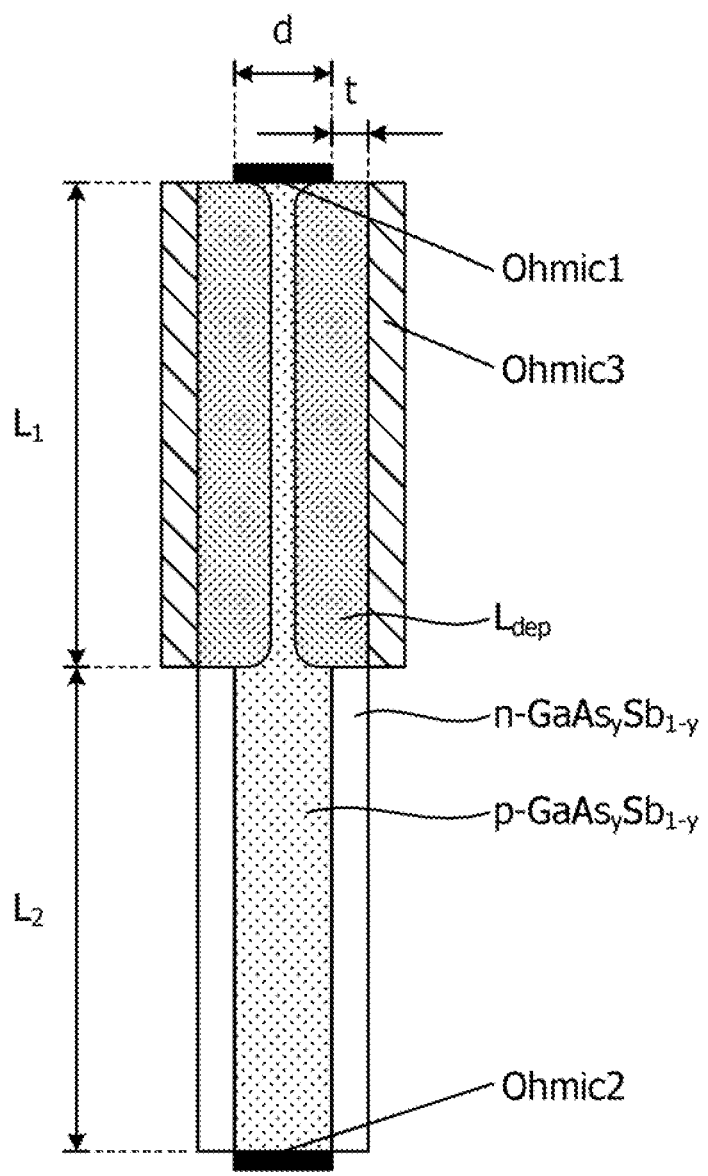
FIG. 23 is a schematic diagram of a characteristic computation model.

FIG. 23 is a schematic diagram of a characteristic computation model for the semiconductor device of the embodiment. A configuration according to the second principle (second embodiment) is employed, and I-V characteristics at an anode when a thin film of an n-type semiconductor is inserted into an interface between a columnar p-type nanowire core and a metal are computed.

A diameter d of the p-type nanowire core is 50 to 100 nm, a thickness t of an n-type nanowire shell disposed between the nanowire core and the metal is 25 to 30 nm, a length L1 of an electrode, in a long axis direction, disposed over a side surface of the nanowire is 0.5 µm, and a length L2 from a bottom surface of the nanowire to an electrode lower end is 0.5 µm. The nanowire core is made of p-GaAs$_y$Sb$_{1-y}$, the nanowire shell is made of n-GaAs$_y$Sb$_{1-y}$, and the metal is Pt. An upper end and a lower end of the nanowire core are in ohmic junction with the metals (Ohmic 1 and Ohmic 2). The computation is performed by treating a potential of Ohmic 3 to be the same as a potential of Ohmic 1. Ohmic 3 may be coupled to Ohmic 1. This model does not include a backward diode.

Figure 24:
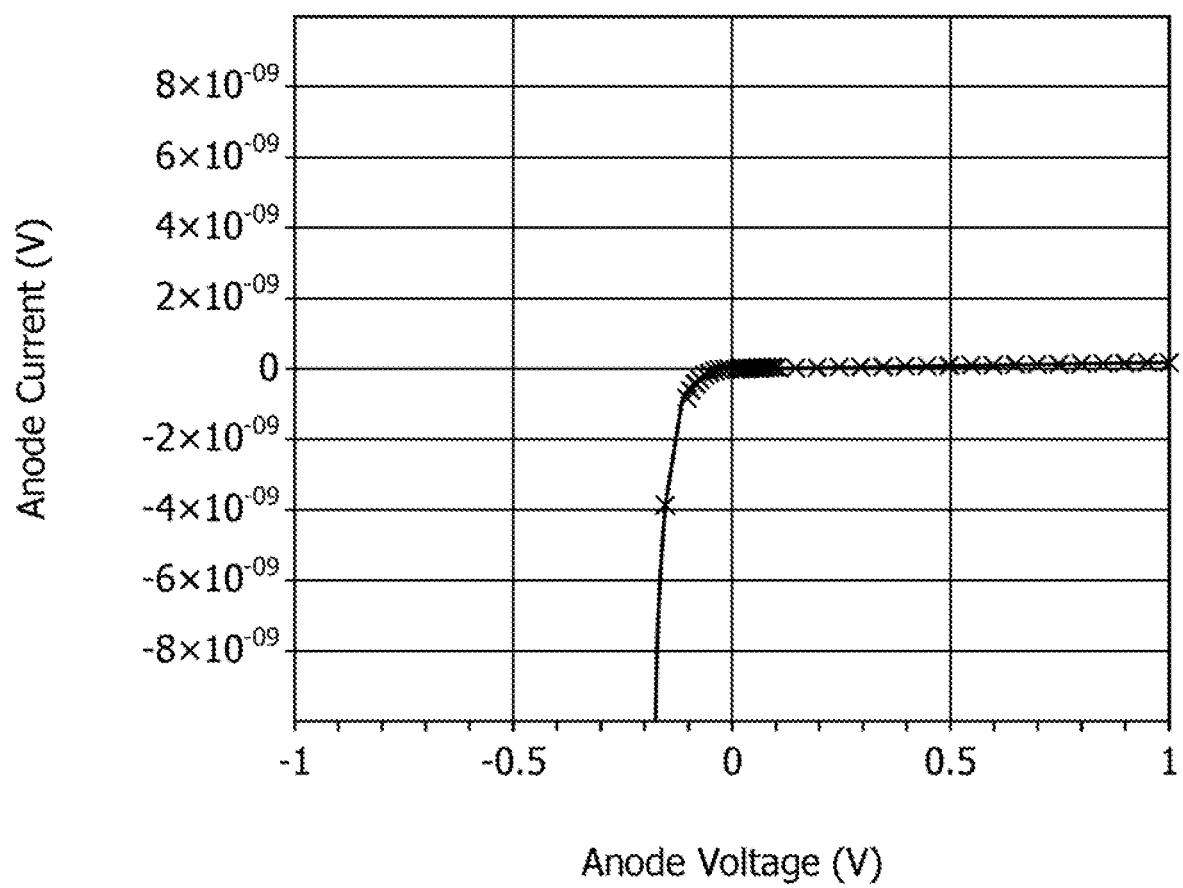
FIG. 24 is a diagram illustrating I-V characteristics based on the model illustrated in FIG. 23.

FIG. 24 illustrates a computation result. A breakdown voltage in a forward (positive) direction is maintained, and a current amount steeply increases at a voltage lower than 0.1 V in a backward (negative) direction. This is because the depletion layer Ldep is expanded to the center of the nanowire due to a forward bias, and thus flowing of carriers is blocked.

Application Examples

Figure 25:
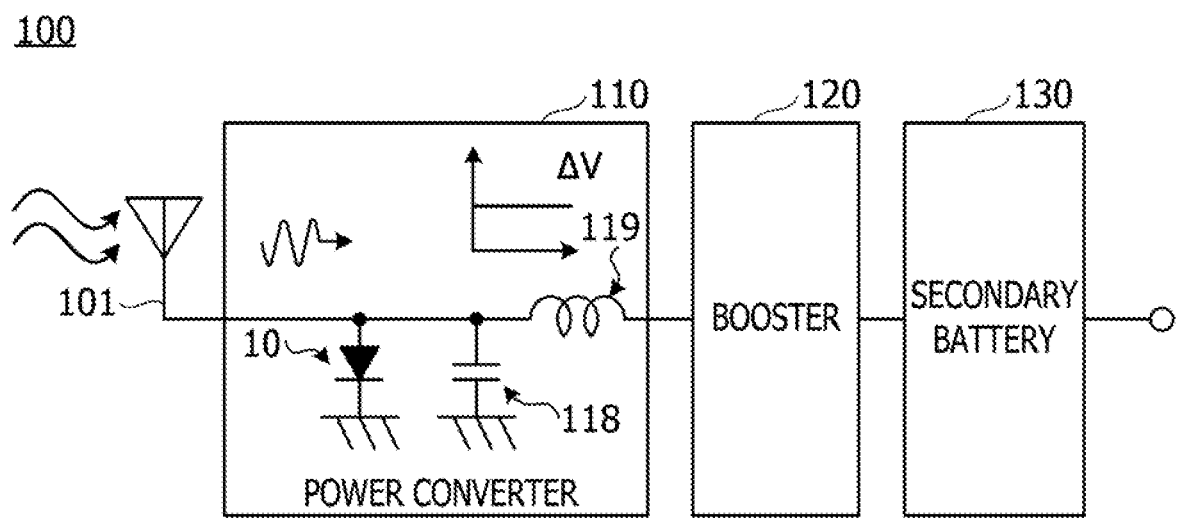
FIG. 25 is a schematic diagram of a radio receiver to which the semiconductor device of the embodiment is applied.

FIG. 25 is a schematic diagram of a radio receiver 100 to which the semiconductor device 10 (or any of the semiconductor devices 20, 30, 40, 50, 60, 70, or 80; hereinafter, simply referred to as a "semiconductor device") of the embodiment is applied. The radio receiver 100 is used for energy harvesting for converting an ambient radio wave into power.

The radio receiver 100 includes an antenna 101 and a power converter 110. An output terminal of the power converter 110 may be coupled to a booster 120 and a secondary battery 130. An ambient radio wave received by the antenna 101 is applied to the cathode of the semiconductor device 10 as a high frequency current. The semiconductor device 10 forms a backward diode, and rectifies the input high frequency current into a current flowing in one direction.

A capacitor 118 is disposed in parallel to the semiconductor device 10, and electric charge is accumulated therein. A smoothing output filter is formed by the capacitor 118 and an inductor 119. An AC component included in electric charge released from the capacitor 118 is removed by the inductor 119, and thus a DC voltage is output.

Since the semiconductor device 10 of the embodiment has a high forward breakdown voltage and operates with high sensitivity in the backward direction, the breakdown voltage is maintained even when power of a radio wave incident to the antenna 101 is relatively large. On the other hand, even when a radio wave having small power is incident, the radio wave may be detected with high sensitivity due to an inter-band tunnel current, and thus the efficiency of energy harvesting is high.

Figure 26:
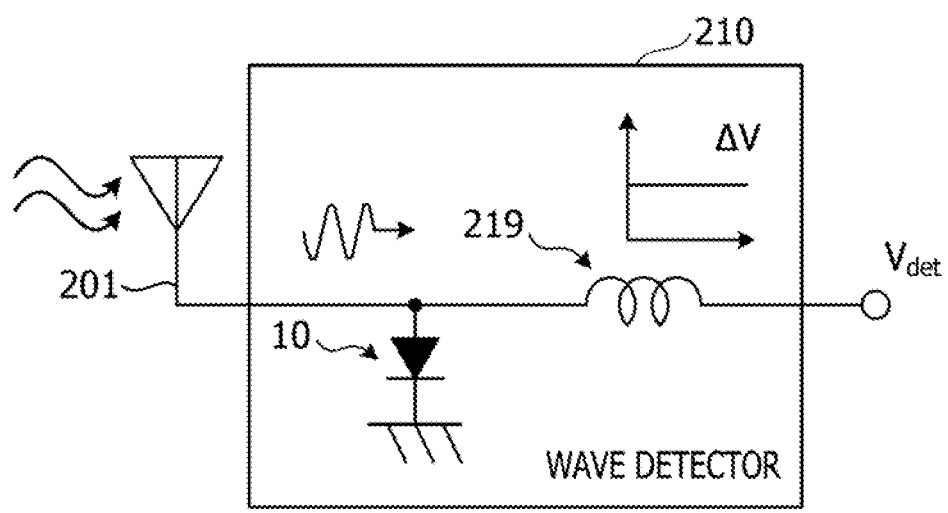
FIG. 26 is a schematic diagram of a radio receiver to which the semiconductor device of the embodiment is applied.

FIG. 26 is a schematic diagram of a radio receiver 200 to which the semiconductor device 10 of the embodiment is applied. The radio receiver 200 is used to detect a wave on a reception side of radio communication.

The radio receiver 200 includes an antenna 201 and a wave detector 210. The wave detector 210 has the semiconductor device 10 and an inductor 219. A high frequency radio signal received by the antenna 201 is applied to the cathode of the semiconductor device 10. The semiconductor device 10 forms a backward diode, rectifies an input high frequency current, and outputs the rectified current. The inductor 219 removes an AC component included in the rectified current, and thus outputs a DC voltage.

Since the semiconductor device 10 of the embodiment has a high forward breakdown voltage and operates with high sensitivity in the backward direction, the breakdown voltage is maintained even when power of a radio signal received by the antenna 201 is relatively large. On the other hand, even when a weak radio signal is received, the radio signal may be detected with high sensitivity due to an inter-band tunnel current, and thus the reliability of a reception operation is improved.

From the viewpoint of a nanostructure of a minute semiconductor such as a nanowire or a nano-fin, a breakdown voltage is improved by controlling expansion of a depletion layer. In order for a depletion layer to be completely expanded to the center of a nanostructure, a diameter of a nanowire or a thickness of a nano-fin is 50 µm to 500 µm, and is preferably 50 µm to 200 µm.

The semiconductor device 10 of the embodiment operates with high sensitivity by employing an inter-band tunnel current in an operation principle. The nanostructure is used, and thus parasitic capacitance is reduced such that the sensitivity is further improved. Breakdown voltage performance is maintained, and thus it is possible to convert a weak ambient radio wave into power or to detect a received signal with small power.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
    a first conductivity type semiconductor of a nanostructure;
    a first electrode that is in ohmic junction with an end part of the first conductivity type semiconductor;
    a second electrode that is coupled to the first electrode and is provided over a side surface of the first conductivity type semiconductor; and
    a depletion structure configured to control expansion of a depletion layer inside the nanostructure,
    the depletion layer inside the nanostructure of the first conductivity type semiconductor is a layer to be expanded, in response to a forward bias, in a direction intersecting a movement direction of a carrier.

2. The semiconductor device according to claim 1, wherein an impurity concentration of a region where the depletion layer is expanded in the first conductivity type semiconductor is $1\times10^{18}$ cm$^{-3}$ or more.

3. The semiconductor device according to claim 1, wherein the depletion structure makes the depletion layer to be expanded in the direction intersecting the movement direction of the carrier when the forward bias is applied to the first conductivity type semiconductor.

4. The semiconductor device according to claim 1, wherein the depletion structure makes, a width of the depletion layer to be reduced in response to a backward bias, to allow the carrier to flow in the nanostructure.

5. The semiconductor device according to claim 1, further comprising:
    an insulating film that is disposed at an interface between the first conductivity type semiconductor and the second electrode,
    wherein the depletion structure is a MIS structure formed by the second electrode, the insulating film, and the first conductivity type semiconductor.

6. The semiconductor device according to claim 1, further comprising:
    a second conductivity type semiconductor film that is disposed at an interface between the first conductivity type semiconductor and the second electrode,
    wherein the depletion structure is a pn junction structure formed by the first conductivity type semiconductor and the second conductivity type semiconductor film, at the interface with the second electrode.

7. The semiconductor device according to claim 1, further comprising:
    a semiconductor film that is disposed at an interface between the first conductivity type semiconductor and the second electrode, and has an impurity concentration lower than an impurity concentration of the first conductivity type semiconductor, or has an energy bandgap wider than an energy bandgap of the first conductivity type semiconductor,
    wherein the depletion structure is a Schottky junction structure formed by the second electrode and the semiconductor film.

8. The semiconductor device according to claim 1, wherein the depletion structure is a Schottky junction structure formed by the second electrode and the first conductivity type semiconductor, over the side surface of the first conductivity type semiconductor.

9. A radio receiver comprising:
    a semiconductor device; and
    an antenna that is coupled to the semiconductor device,
    the semiconductor device includes
    a first conductivity type semiconductor of a nanostructure,
    a first electrode that is in ohmic junction with an end part of the first conductivity type semiconductor,
    a second electrode that is coupled to the first electrode and is provided over a side surface of the first conductivity type semiconductor, and
    a depletion that controls structure configured to control expansion of a depletion layer inside the nanostructure,
    the depletion layer inside the nanostructure of the first conductivity type semiconductor is a layer to be expanded, in response to a forward bias, in a direction intersecting a movement direction of a carrier.

10. The radio receiver according to claim 9, wherein the semiconductor device is a wave detector or a power converter.

* * * * *